(12) United States Patent
Park et al.

(10) Patent No.: US 12,237,265 B2
(45) Date of Patent: Feb. 25, 2025

(54) METHODS OF MANUFACTURING SEMICONDUCTOR DEVICES

(71) Applicant: Samsung Electronics Co., Ltd., Suwon-si (KR)

(72) Inventors: Sangoh Park, Hwaseong-si (KR); Dongjun Lee, Anyang-si (KR); Keunnam Kim, Yongin-si (KR); Seunghune Yang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/321,917

(22) Filed: May 23, 2023

(65) Prior Publication Data

US 2023/0290727 A1 Sep. 14, 2023

Related U.S. Application Data

(63) Continuation of application No. 17/198,591, filed on Mar. 11, 2021, now Pat. No. 11,688,687.

(30) Foreign Application Priority Data

Jul. 29, 2020 (KR) .................. 10-2020-0094363

(51) Int. Cl.
*H01L 21/768* (2006.01)
*H01L 21/02* (2006.01)
(Continued)

(52) U.S. Cl.
CPC ...... *H01L 23/528* (2013.01); *H01L 21/02172* (2013.01); *H01L 21/02175* (2013.01);
(Continued)

(58) Field of Classification Search
CPC ........ H10B 10/18; H10B 12/09; H10B 12/50; H10B 12/312; H10B 12/315;
(Continued)

(56) References Cited

U.S. PATENT DOCUMENTS 6,576,509 B1 * 6/2003 Toyokawa ........ H01L 21/76877
257/E21.507
9,064,731 B2 6/2015 Park
(Continued)

FOREIGN PATENT DOCUMENTS

KR 100753047 B1 8/2007
KR 20080001409 A 1/2008
(Continued)

*Primary Examiner* — Nicholas J Tobergte
*Assistant Examiner* — William Henry Anderson
(74) *Attorney, Agent, or Firm* — Myers Bigel, P.A.

(57) ABSTRACT

A semiconductor device may include a substrate including a cell region and a core/peripheral region. A plurality of bit line structures may be in the cell region of the substrate. A gate structure may be in the core/peripheral regions of the substrate. A lower contact plug and an upper contact plug may be between the bit line structures. The lower contact plug and the upper contact plug may be stacked in a vertical direction. A landing pad pattern may contact an upper sidewall of the upper contact plug. The landing pad pattern may be between an upper portion of the upper contact plug and an upper portion of one of the bit line structures. An upper surface of the landing pad pattern may be higher than an upper surface of each of the bit line structures. A peripheral contact plug may be formed in the core/peripheral regions of the substrate. A wiring may be electrically connected to an upper surface of the peripheral contact plug.

20 Claims, 45 Drawing Sheets

(51) Int. Cl.
*H01L 23/528* (2006.01)
*H01L 29/786* (2006.01)
*H10B 12/00* (2023.01)

(52) U.S. Cl.
CPC .. *H01L 21/02181* (2013.01); *H01L 21/76805* (2013.01); *H01L 29/7869* (2013.01); *H01L 29/78693* (2013.01); *H10B 12/03* (2023.02); *H10B 12/0335* (2023.02); *H10B 12/315* (2023.02); *H10B 12/34* (2023.02); *H10B 12/48* (2023.02); *H10B 12/482* (2023.02); *H10B 12/485* (2023.02); *H10B 12/50* (2023.02); *H01L 21/76807* (2013.01); *H10B 12/053* (2023.02)

(58) Field of Classification Search
CPC ............... H10B 12/482; H10B 12/485; H01L 2221/1015; H01L 2221/1036; H01L 21/76807; H01L 21/76808; H01L 21/76813
See application file for complete search history.

(56) References Cited

U.S. PATENT DOCUMENTS

| | | | |
|---|---|---|---|
| 9,520,348 B2 | 12/2016 | Choi et al. | |
| 9,570,409 B2 | 2/2017 | Park et al. | |
| 10,134,606 B2 | 11/2018 | Woo et al. | |
| 10,468,415 B2 | 11/2019 | You et al. | |
| 10,665,592 B2 | 5/2020 | Song et al. | |
| 10,892,318 B2 | 1/2021 | Ding et al. | |
| 10,937,887 B2 | 3/2021 | An et al. | |
| 11,121,135 B1* | 9/2021 | Ikeda | H01L 23/53266 |
| 2004/0178433 A1 | 9/2004 | Yun et al. | |
| 2007/0015362 A1 | 1/2007 | Yun et al. | |
| 2007/0155150 A1 | 7/2007 | Kim | |
| 2009/0289326 A1 | 11/2009 | Park et al. | |
| 2014/0327063 A1 | 11/2014 | Park | |
| 2015/0214291 A1 | 7/2015 | Park et al. | |
| 2017/0005097 A1 | 1/2017 | Kim et al. | |
| 2017/0125283 A1* | 5/2017 | Lee | H10B 12/34 |
| 2017/0345824 A1* | 11/2017 | Ma | H01L 21/76805 |
| 2018/0158827 A1 | 6/2018 | You et al. | |
| 2018/0166450 A1 | 6/2018 | Kim et al. | |

FOREIGN PATENT DOCUMENTS

| | | |
|---|---|---|
| KR | 20080002549 A | 1/2008 |
| KR | 20080088922 A | 10/2008 |
| KR | 20090074332 A | 7/2009 |
| KR | 100955263 B1 | 5/2010 |
| KR | 100964271 B1 | 6/2010 |
| KR | 100991379 B1 | 11/2010 |
| KR | 101019698 B1 | 3/2011 |
| KR | 101031459 B1 | 4/2011 |
| KR | 101173478 B1 | 8/2012 |
| KR | 20120129084 A | 11/2012 |
| KR | 20130123687 A | 11/2013 |
| KR | 20150042623 A | 4/2015 |
| KR | 20190063092 A | 6/2019 |
| TW | 202011612 A | 3/2020 |
| TW | 202017136 A | 5/2020 |

* cited by examiner

METHODS OF MANUFACTURING SEMICONDUCTOR DEVICES

CROSS-REFERENCE TO RELATED APPLICATIONS

This application is a continuation of U.S. application Ser. No. 17/198,591, filed on Mar. 11, 2021, which claims the benefit of priority under 35 U.S.C. § 119 to Korean Patent Application No. 10-2020-0094363, filed on Jul. 29, 2020, in the Korean Intellectual Property Office (KIPO), and the entire of the above-identified applications are incorporated by reference herein.

BACKGROUND

1. Field

Aspects of the present disclosure relate to semiconductor devices and to methods of manufacturing the same. More particularly, aspects of the present disclosure relate to dynamic random-access memory (DRAM) devices and to methods of manufacturing the same.

2. Description of the Related Art

As DRAM devices are increasingly integrated, dimensions of patterns used in forming may be reduced, and an arrangement density of the patterns may be increased. Thus, the number of photolithography processes for forming the patterns constituting the DRAM may be increased. In addition, when the patterns are formed, defects of the patterns may be generated.

SUMMARY

Aspects of the present disclosure provide semiconductor devices, and methods for manufacturing the semiconductor devices.

According to some aspects of the present disclosure, a semiconductor device is provided. The semiconductor device may include a substrate including a cell region and a core/peripheral region. A plurality of bit line structures may be in the cell region of the substrate. A gate structure may be in the core/peripheral regions of the substrate. A lower contact plug and an upper contact plug may be between the bit line structures. The lower contact plug and the upper contact plug may be stacked in a vertical direction. A landing pad pattern may contact an upper sidewall of the upper contact plug. The landing pad pattern may be between an upper portion of the upper contact plug and an upper portion of one of the bit line structures. An upper surface of the landing pad pattern may be higher than an upper surface of each of the bit line structures. A peripheral contact plug may be in the core/peripheral regions of the substrate. A wiring may be electrically connected to an upper surface of the peripheral contact plug.

According to some example embodiments, a semiconductor device is provided. The semiconductor device may include a substrate including a cell region and a core/peripheral region. A first gate structure buried in the substrate. The first gate structure may be under an upper surface of the substrate. A plurality of bit line structures may be in the cell region of the substrate. A second gate structure may be in the core/peripheral regions of the substrate. A lower contact plug and an upper contact plug may be between the bit line structures. The lower contact plug and the upper contact plug may be stacked in a vertical direction. A capping insulation pattern may be on the bit line structure, the upper contact plug, and the second gate structure. A landing pad pattern may be in contact with an upper sidewall of the upper contact plug. The landing pad pattern may be at a recessed portion of an upper portion of the upper contact plug and an upper portion of one of the bit line structures. An upper surface of the landing pad pattern may be higher than an upper surface of each of the bit line structures. A wiring may be in a first opening of the capping insulation pattern in the core/peripheral regions. A contact plug may be in a second opening in communication with the first opening. The contact plug may be electrically connected to the wiring, and the contact plug may be under the wiring. A capacitor may be electrically connected to the landing pad pattern. The landing pad pattern, the contact plug, and the wiring include the same metal.

According to some example embodiments, a semiconductor device is provided. The semiconductor device may include a substrate including a cell region and a core/peripheral region. Conductive structures may be formed in the cell region of the substrate. A gate structure may be in the core/peripheral regions of the substrate. A cell contact plug may be between the conductive structures. A landing pad pattern may be electrically connected to the cell contact plug. An upper surface of the landing pad pattern may be higher than an upper surface of each of the conductive structures. An insulation layer may cover the core/peripheral regions of the substrate. A contact plug and a wiring may be in an opening included in the insulation layer. An upper surface of the wiring may be coplanar with an upper surface of the insulation layer.

According to some example embodiments, there is provided a method of manufacturing a semiconductor device. The method may include forming bit line structures in a cell region of a substrate. A gate structure may be formed in core/peripheral regions of the substrate. A lower contact plug and an upper contact plug may be formed between the bit line structures. The lower contact plug and the upper contact plug may be stacked in a vertical direction. A capping insulation layer may be formed on the bit line structure and the upper contact plug in the cell region and the gate structure in the core/peripheral regions. A first photoresist pattern for forming landing pad patterns in the cell region and contact plugs in the core/peripheral regions may be formed on the capping insulation layer by performing a first exposure process. Layers may be etched using the first photoresist pattern as an etch mask to form first openings in the cell region and second openings in the core/peripheral regions. A second photoresist pattern for forming wirings in the core/peripheral regions may be formed on the capping insulation layer by performing a second exposure process. Layers may be etched using the second photoresist pattern as an etch mask to form third openings being communicated with the second openings in the core/peripheral regions. The first openings, the second openings, and the third openings may be filled with a metal material to form the landing pad patterns in the first openings, the contact plugs in the second openings, and the wirings in the third openings.

In some example embodiments, the semiconductor device may be manufactured by processes potentially having a reduced number of operations. For example, in some embodiments the manufacture of the semiconductor device, patterns and/or contact plugs having bottom surfaces of different levels in a vertical direction from the substrate may be formed by a single photo process. In a case of a DRAM device, a pad pattern electrically connected to a capacitor in a cell region and a peripheral contact plug contacting a substrate or a wiring in core/peripheral regions may be formed by a single photo process using EUV light. A peripheral conductive line may be formed on the peripheral contact plug.

BRIEF DESCRIPTION OF THE DRAWINGS

Example embodiments of the present inventive concepts will be more clearly understood from the following detailed description taken in conjunction with the accompanying drawings.

FIGS. 1 to 5 are cross-sectional views and a plan view illustrating aspects of a semiconductor device in accordance with some example embodiments;

FIGS. 6 to 31 are cross-sectional views illustrating aspects of a method of manufacturing a semiconductor device in accordance with some example embodiments;

FIG. 32 is a cross-sectional view illustrating aspects of a semiconductor device in accordance with some example embodiments;

FIG. 33 is a cross-sectional view illustrating aspects of a method of manufacturing a semiconductor device in accordance with some example embodiments;

FIG. 34 is a cross-sectional view illustrating aspects of a semiconductor device in accordance with some example embodiments;

FIGS. 35 to 41 are cross-sectional views illustrating aspects of a method of manufacturing a semiconductor device in accordance with some example embodiments;

FIGS. 42 and 43 are cross-sectional views illustrating aspects of a semiconductor device in accordance with some example embodiments; and FIGS. 44 to 47 are cross-sectional views illustrating aspects of a method of manufacturing a semiconductor device in accordance with example embodiments.

DETAILED DESCRIPTION

FIGS. 1 to 5 are cross-sectional views and a plan view illustrating aspects of a semiconductor device in accordance with example embodiments.

Figure 1:
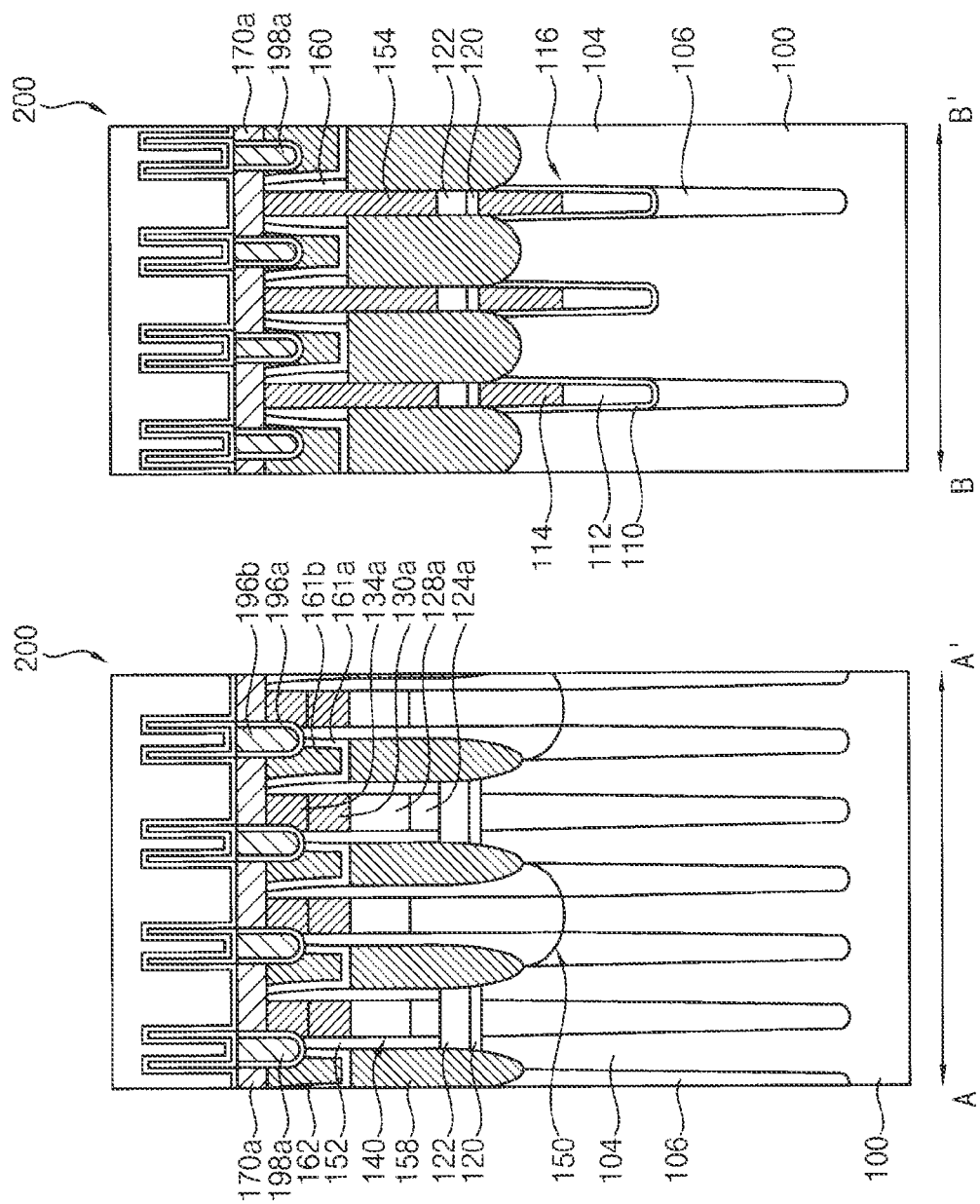
FIGS. 1 to 47 represent non-limiting, example embodiments as described herein.
Figure 2:
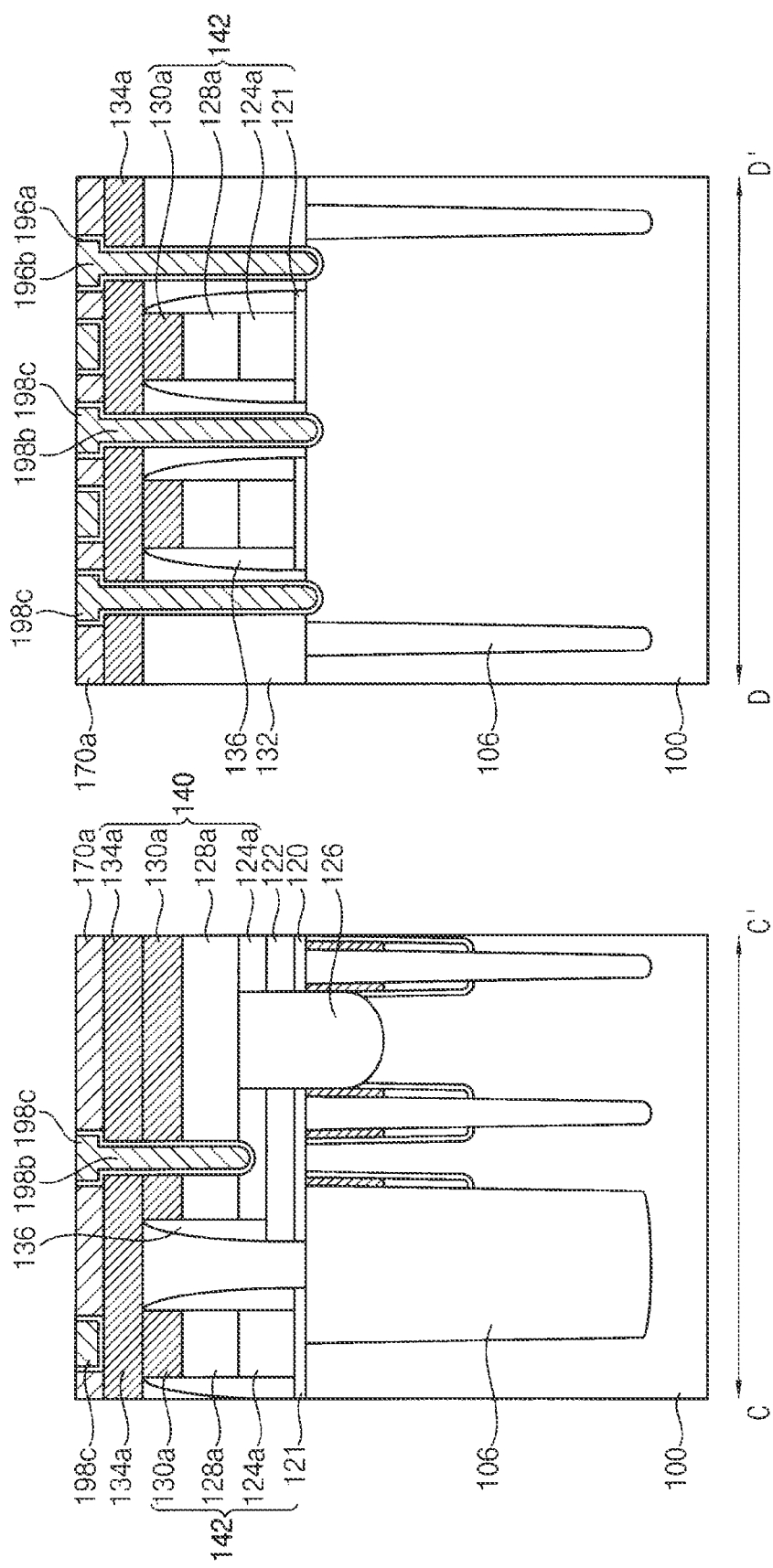
Figure 3:
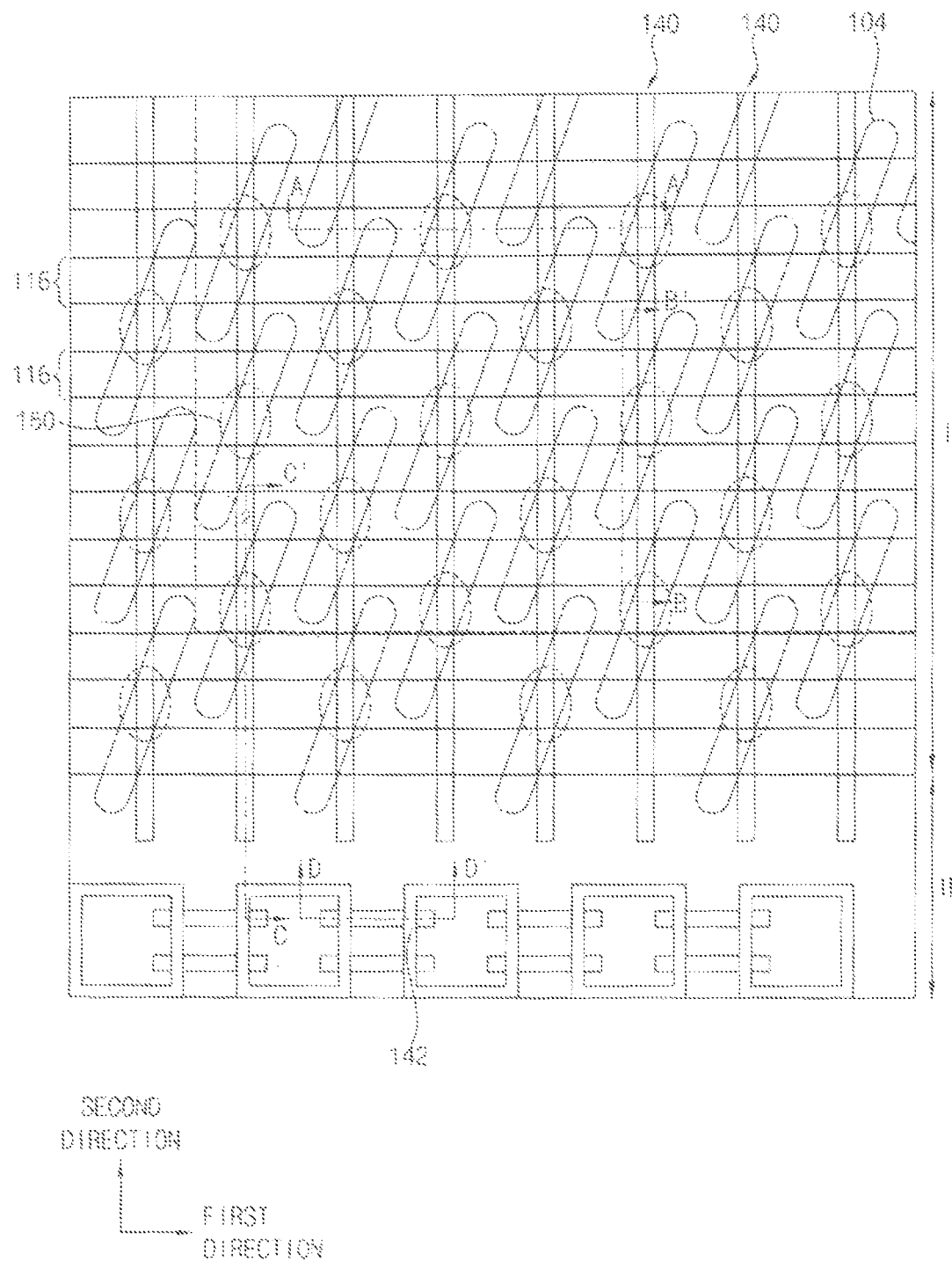

FIGS. 1, 2, 4 and 5 are cross-sectional views, and FIG. 3 is a plan view.

Figure 4:
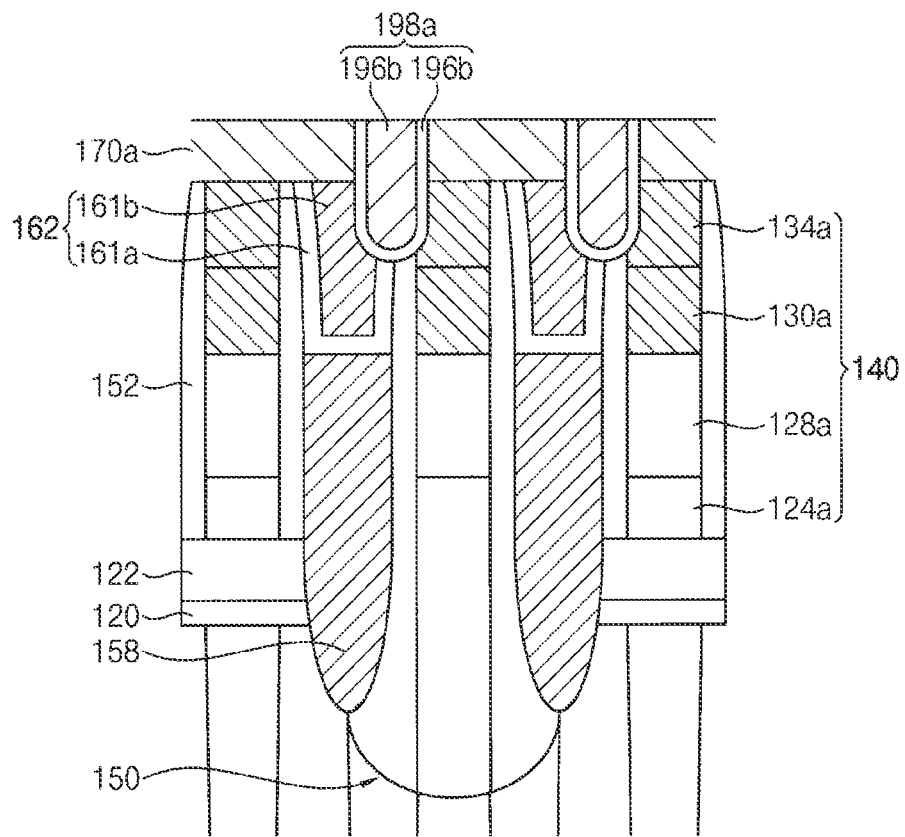
Figure 5:
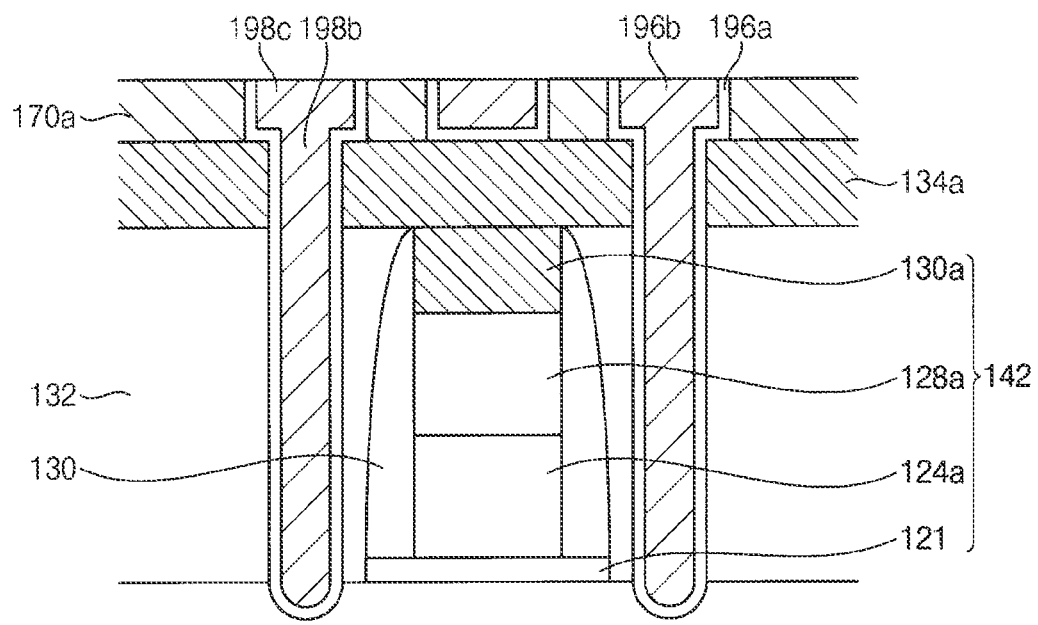

FIG. 1 includes cross-sectional views taken along lines A-A' and B-B' of FIG. 3, and FIG. 2 includes cross-sectional views taken along lines C-C' and D-D' of FIG. 3. FIGS. 1-5 shows structures in a cell region I and core/peripheral regions II. In FIG. 2, the cross-sectional view taken along line C-C' of FIG. 3 shows structures in the cell region I and the core/peripheral regions II, and the cross-sectional view taken along line D-D' of FIG. 3 shows structures in the core/peripheral regions II. FIG. 4 shows an enlarged cross-sectional view of a portion of a landing pad pattern, and FIG. 5 is an enlarged cross-sectional view of a portion of a transistor in the core/peripheral regions II.

Referring to FIGS. 1 to 5, a substrate 100 may include the cell region I and the core/peripheral regions II. A first gate structure 116, a bit line structure 140, a spacer structure 152, an insulation pattern 154, a lower contact plug 158, and an upper contact plug 162, a landing pad pattern 198a and a capacitor 200 may be formed in the cell region I of the first substrate 100. A second gate structure 142, a lower insulating interlayer 132, a contact plug 198b, and a wiring 198c may be formed in the core/peripheral regions II of the substrate 100. The contact plug 198b may be a peripheral contact plug 198b.

The substrate 100 may include silicon, germanium, silicon-germanium, or a III-V group compound such as GaP, GaAs, or GaSb. In some example embodiments, the substrate 100 may be a silicon-on-insulator (SOI) substrate or a germanium-on-insulator (GOI) substrate.

The substrate 100 may include an isolation trench, and a device isolation pattern 106 may be formed in the isolation trench. The substrate 100 between the isolation trenches may serve as an active pattern 104. The device isolation pattern 106 may include, e.g., silicon oxide and/or silicon nitride.

The first gate structure 116 may be buried in the substrate 100 of the cell region I. That is, the first gate structure 116 may extend in a first direction (see FIG. 3) through upper portions of the active pattern 104 and the device isolation pattern 106. A plurality of the first gate structures may be spaced apart from each other in the second direction. The first gate structure 116 may include a first gate insulation layer 110, a gate electrode 112, and a capping mask pattern 114.

The first gate insulation layer 110 may be formed on a surface of the active pattern 104. The gate electrode 112 may be formed on the first gate insulation layer 110 and the device isolation pattern 106. The gate electrode 112 may extend in the first direction. The capping mask pattern 114 may cover an upper surface of the gate electrode 112.

The first gate insulation layer 110 may include an oxide such as silicon oxide. The gate electrode 112 may include, e.g., a metal such as tungsten (W), titanium (Ti), tantalum (Ta), or the like, and/or a metal nitride such as tungsten nitride, titanium nitride, tantalum nitride, or the like. The capping mask pattern 114 may include a nitride such as silicon nitride.

A first insulation layer 120 and a second insulation layer 122 may be sequentially stacked on the active pattern 104, on the device isolation pattern 106, and on the capping mask pattern 114 in the cell region I. The second gate insulation layer 121 may be formed on the active pattern 104 in the core/peripheral regions II.

The bit line structure 140 in the cell region I may include a first conductive pattern 124a, a first barrier pattern (not shown), a first metal pattern 128a, a first capping layer pattern 130a, and a second capping layer pattern 134a sequentially stacked. In example embodiments, the bit line structure 140 may be formed on the active pattern 104 and the second insulation layer 122. The bit line structure 140 may extend in the second direction.

A portion of the first conductive pattern 124a included in the bit line structure 140 may be formed in a first opening 150 in upper surfaces of the active pattern 104, the device isolation pattern 106 and the capping mask pattern 114 adjacent the active pattern 104. Thus, a portion of the first conductive pattern 124a may contact the upper surface of the active pattern 104 exposed by the first opening 150. The first conductive pattern 124a may include, e.g., polysilicon doped with impurities.

The first barrier pattern may include, e.g., a metal such as titanium (Ti) tantalum (Ta), or the like, and/or a metal nitride such as titanium nitride, tantalum nitride, or the like. In some embodiments, the first barrier pattern may include multiple metals and/or multiple metal nitrides. The first metal pattern 128a may be, e.g., a metal such as tungsten (W). The first and second capping layer patterns 130a and 134a may include nitride such as silicon nitride.

The second gate structure 142 in the core/peripheral regions II may include a gate insulation layer 121, a first conductive pattern 124a, a first metal pattern 128a, and a first capping layer pattern 130a sequentially stacked.

As described above, each of the second gate structure 142 in the core/peripheral regions II and the bit line structure 140 in the cell region I may include a stacked structure including the first conductive pattern 124a, the first metal pattern 128a, and the first capping layer pattern 130a. That is, the second gate structure 142 and the bit line structure 140 may have the same stacked structure.

A spacer 136 may be formed on a sidewall of the second gate structure 142. Further, the bit line structure 140 may extend from the cell region I to a portion of the core/peripheral regions II. The spacer 136 may be formed on an edge in the second direction of the bit line structure 140.

A lower insulating interlayer 132 may be formed on the substrate between the second gate structures 142. The second capping layer pattern 134a may be formed on the second gate structure 142 and the lower insulating interlayer 132 in the core/peripheral regions II.

The spacer structure 152 may be formed on sidewalls of the bit line structure 140, and the spacer structure 152 may extend in the second direction. In some example embodiments, the spacer structure 152 may include a plurality of spacers stacked from the sidewalls of the bit line structure 140. In some example embodiments, the spacer structure 152 may include an air spacer serving as an empty space.

The insulation pattern 154 may be formed on the second insulation layer 122. The insulation pattern 154 may be formed on the first gate structure 116 between the bit line structures 140.

In some example embodiments, an upper surface of the insulation pattern 154 may be coplanar with an upper surface of the bit line structure 140. The insulation pattern 154 may include nitride such as silicon nitride.

A third opening may be formed at a portion between the bit line structures 140 and a portion between the insulation patterns 154, and the third opening may expose the active pattern 104. The lower contact plug 158 and the upper contact plug 162 may be formed in the third opening.

The lower contact plug 158 may fill a lower portion of the third opening. The lower contact plug 158 may include, e.g., polysilicon doped with impurities.

In some example embodiments, an upper surface of the lower contact plug 158 may be higher than an upper surface of the first conductive pattern 124a included in the bit line structure 140, and the upper surface of the lower contact plug 158 may be lower than an upper surface of the first capping layer pattern 130a. In other words, the upper surface of the lower contact plug 158 may be between the upper surface of the first conductive pattern 124a and the upper surface of the first capping layer pattern 130a. In some embodiments, the upper surface of the lower contact plug 158 may be arranged at a position along a sidewall of the first metal pattern 128a. However, a position of the upper surface of the lower contact plug 158 may not be limited thereto. As the lower contact plug 158 is formed, a parasitic capacitance between the lower contact plug 158 and the bit line structure 140 may be decreased.

An upper spacer 160 may be formed on an upper sidewall of the insulation pattern 154. Particularly, the upper spacer 160 may be formed on the upper sidewall of the insulation pattern 154 such that the upper spacer 160 is positioned higher than an upper surface of the lower contact plug 158. Although not shown, the upper spacer may be further formed on the spacer structure 152.

The upper contact plug 162 may contact the upper surface of the lower contact plug 158. The upper contact plug 162 may be formed in an upper portion of the third opening.

The upper contact plug 162 may include a second barrier pattern 161a and a second metal pattern 161b. The second barrier pattern 161a may be formed on the spacer structure 152, the upper spacer 160, and the upper surface of the lower contact plug 158, and the second barrier pattern 161a may conform to the surfaces of the spacer structure 152, the upper spacer 160, and the upper surface of the lower contact plug 158 on which it is formed. Thus, the second barrier pattern 161a may surround sidewalls and a bottom of the second metal pattern 161b. The second barrier pattern 161a may include, e.g., a metal such as titanium (Ti) or tantalum (Ta), or the like, and/or a metal nitride such as titanium nitride or tantalum nitride, or the like. In some embodiments, the second barrier pattern 161a may include multiple metals and/or multiple metal nitrides. The second metal pattern 161b may include a metal such as tungsten (W).

In some example embodiments, an uppermost surface of the upper contact plug 162 may be coplanar with an uppermost surface of the bit line structure 140.

A third capping insulation pattern 170a may be formed on the upper contact plug 162 and the bit line structure 140 in the cell region, and the third capping insulation pattern 170a may be formed on the second capping layer pattern 134a in the core/peripheral regions II. The third capping insulation pattern 170a may include a nitride such as silicon nitride.

The third capping insulation pattern 170a in the cell region I may include sixth openings 180. Portions of the upper contact plug 162, the spacer structure 152, and the bit line structure 140 may be exposed by the sixth opening 180. The portions of the upper contact plug 162, the spacer structure 152, and the bit line structure 140 exposed by the sixth opening 180 may have an etched shape, so that the portions exposed by the sixth opening and having the etched shape may correspond a recessed portion. In the upper contact plug 162, the spacer structure 152, and the bit line structure 140, a portion facing the recessed portion may not have an etched shape.

The landing pad pattern 198a electrically connected to the upper contact plug 162 may be formed in the sixth opening 180. A lower portion of the landing pad pattern 198a may contact a sidewall of the upper contact plug 162 and sidewalls of the first and second capping layer patterns 130a and 134a of the bit line structure 140. A bottom of the landing pad pattern 198a may be lower than the uppermost surface of the bit line structure 140 and the uppermost surface of the upper contact plug 162.

The third capping insulation pattern 170a may be on an upper sidewall of the landing pad pattern 198a. The third capping insulation pattern 170a may fill a space between the landing pad patterns 198a.

The landing pad pattern 198a may include a third barrier pattern 196a and a third metal pattern 196b. The third barrier pattern 196a may be formed on sidewalls and a bottom of layers exposed by the sixth opening 180, and the third barrier pattern 196a may conform to the surfaces on which the third barrier pattern 196a is formed. The third metal pattern 196b may be formed on the third barrier pattern 196a to fill the sixth opening 180.

The third barrier pattern 196a may include, e.g., a metal such as titanium (Ti) or tantalum (Ta), or the like, and/or a metal nitride such as titanium nitride or tantalum nitride, or the like. In some embodiments, the third barrier pattern 196a may include multiple metals and/or multiple metal nitrides. The third metal pattern 196b may include a metal such as tungsten (W).

The upper surface of the landing pad pattern 198a may be substantially coplanar with the upper surface of the third capping insulation pattern 170a.

The landing pad pattern 198a may have a dimension of about 20 nm or less. The dimension may be a critical dimension. The landing pad pattern 198a may have a pitch of 40 nm or less. The pitch may be a sum of a width of each of patterns and a space between the patterns. The landing pad patterns 198a may be densely arranged, and the landing pad patterns 198a may have a first arrangement density. In some example embodiments, the landing pad patterns 198a may be arranged in a honeycomb shape, in a plan view.

Thus, the landing pad pattern 198a may be formed on the upper contact plug 162. The third barrier pattern 196a may be arranged at a contact portion between the upper contact plug 162 and the landing pad pattern 198a.

The third capping insulation pattern 170a in the core/peripheral regions II may include a ninth opening 194. The ninth opening 194 may extend in one direction to have a trench shape. Further, a seventh opening 182a may be formed under the ninth opening 194, and may be in communication with the ninth opening 194.

The contact plug 198b may be formed in the seventh opening 182a. The wiring 198c may be formed in the ninth opening 194. An arrangement of the contact plugs 198b may not be more dense than the arrangement of the landing pad patterns 198a. An arrangement density of the contact plugs 198b may be lower than the arrangement density of the landing pad pattern 198a. In other words, contact plugs 198b may have a second arrangement density that is lower than the first arrangement density of the landing pad patterns 198a. A pitch of the contact plugs 198b may be greater than the pitch of the landing pad patterns 198a and the pitch of the wirings 198c.

The contact plug 198b may include a first contact plug and a second contact plug. The first contact plug may be formed on an end portion in the second direction of the bit line structure 140 in the core/peripheral regions II. The first contact plug may pass through an upper portion of the bit line structure 140, and the first contact plug may contact the first conductive pattern 124a in the bit line structure 140. Further, the second contact plug may pass through the lower insulating interlayer 132, and the second contact plug may contact the substrate adjacent to sides of the second gate structure 142.

The wiring 198c may extend to contact an upper portion of the contact plug 198b.

The wiring 198c may have a dimension (e. g., a line width) of about 20 nm or less. The dimension may be a critical dimension. A pitch of the wirings 198c may have about 40 nm or less. The wirings 198c may be densely arranged more than the arrangement of the contact plugs. The wirings 198c may have a third arrangement density higher than the second arrangement density of the contact plugs 198b.

The contact plug 198b and the wiring 198c may include the third barrier pattern 196a and the third metal pattern 196b. The third barrier pattern 196a may be formed on surfaces exposed by the seventh opening 182a and the ninth opening 194, and the third barrier pattern 196a may conform to the surfaces on which the third barrier pattern 196a is formed. The third metal pattern 196b may be formed on third barrier pattern 196a to fill the seventh and ninth openings 182a, and 194.

The landing pad pattern 198a, the contact plug 198b, and the wiring 198c may be formed by the same process or processes, so that the landing pad pattern 198a, the contact plug 198b, and the wiring 198c may include the same conductive material. The third barrier pattern 196a included in the landing pad pattern 198a, the contact plug 198b, and the wiring 198c may have the same material, and the third metal pattern 196b included in the landing pad pattern 198a, the contact plug 198b, and the wiring 198c may have the same material.

A capacitor 200 may be formed on the upper surface of the landing pad pattern 198a.

As described above, the semiconductor device may include the lower contact plug 158 and the upper contact plug 162 between the bit line structures 140. A lower portion of the landing pad pattern 198a may be positioned between an upper portion of the upper contact plug 162 and an upper portion of the bit line structure 140. A lower portion of the landing pad pattern 198a may contact an upper sidewall of the upper contact plug 162 and an upper sidewall of the bit line structure 140, respectively.

The landing pad pattern 198a may include the third metal pattern 196b, and the third barrier pattern 196a formed on sidewalls and bottom surfaces of the third metal pattern 196b.

The contact plug 198b and the wiring 198c in the core/peripheral regions II may have a conductive material substantially the same as a conductive material of the landing pad pattern 198a.

In some embodiments, components of the semiconductor device, such as the landing pad pattern 198a, the contact plug 198b, and the wiring 198c, may be manufactured by a process having a reduced number of operations.

FIGS. 6 to 31 are cross-sectional views illustrating aspects of a method of manufacturing a semiconductor device in accordance with some example embodiments.

Particularly, FIGS. 6, 8, 10, 12, 14, 15, 16, 18, 20, 22, 24, 26, 28, and 30 are cross-sections taken along lines A-A' and B-B' of FIG. 3. FIGS. 7, 9, 11, 13, 17, 19, 21, 23, 25, 27, 29, and 31 are cross-sections taken along lines C-C' and D-D' of FIG. 3. In FIGS. 6 to 31, cross sections taken along lines A-A' and B-B' of FIG. 3 are cross sections of a cell region I. In FIGS. 6 to 31, the cross sections taken along line C-C' of FIG. 3 are cross sections of the cell region I and core/peripheral regions II, and the cross sections taken along line D-D' of FIG. 3 are cross sections of core/peripheral regions II.

Figure 6:
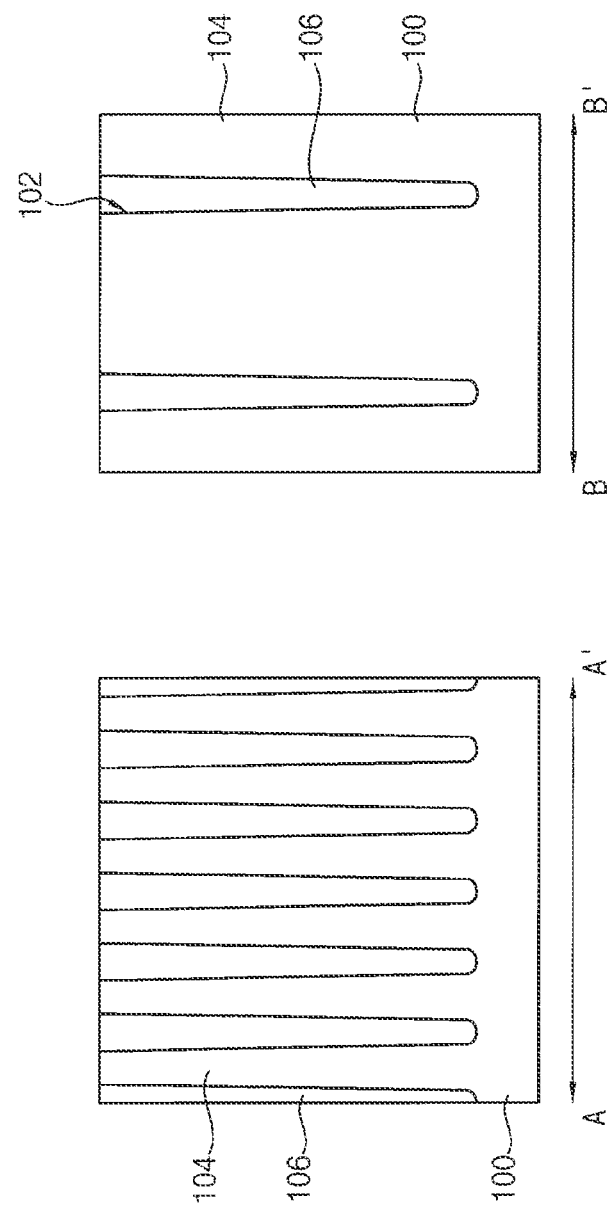
Figure 7:
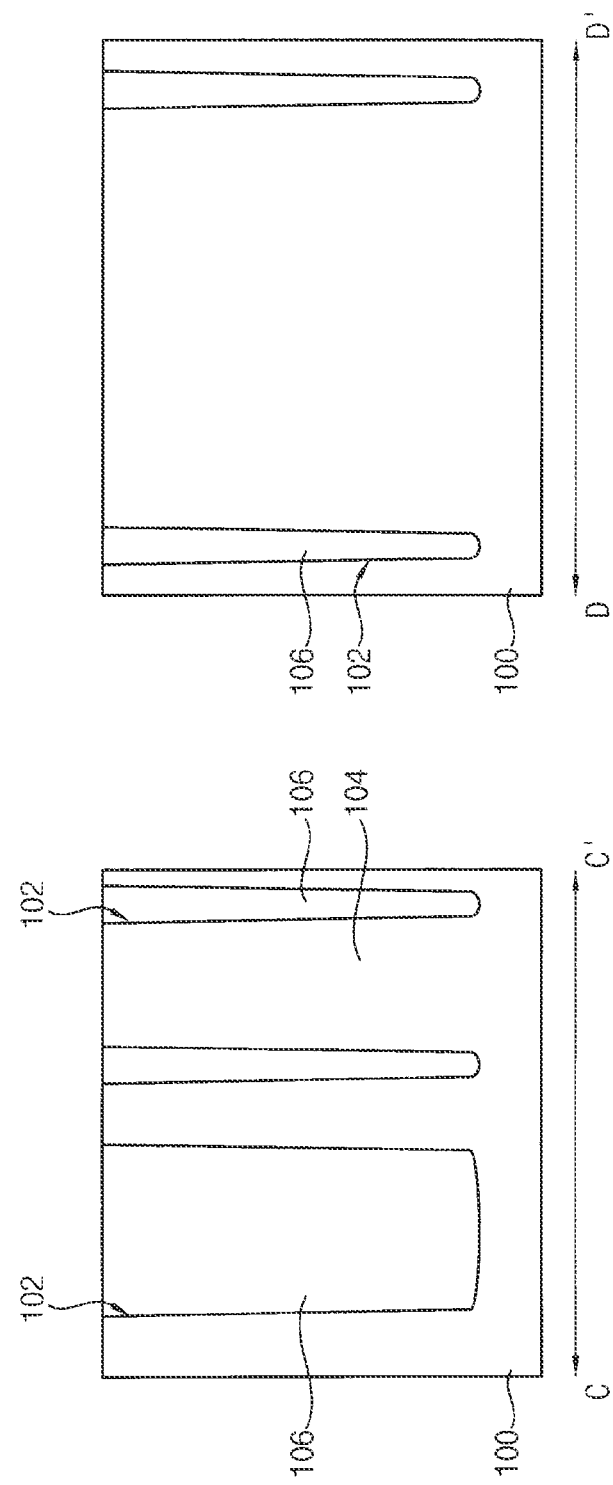

Referring to FIGS. 6 and 7, a substrate 100 may include a cell region I and core/peripheral regions II. The cell region I may be a region in which memory cells are formed, and the core/peripheral regions II may be a region in which peripheral circuits or core circuits are formed.

An upper portion of the substrate 100 may be etched to form an isolation trench 102, and a device isolation pattern 106 may be formed to fill the isolation trench 102. The portion of the substrate 100 between the device isolation patterns 106 may be an active pattern 104. The device isolation pattern 106 may serve as a field region, and the active pattern 104 may serve as an active region.

Figure 8:
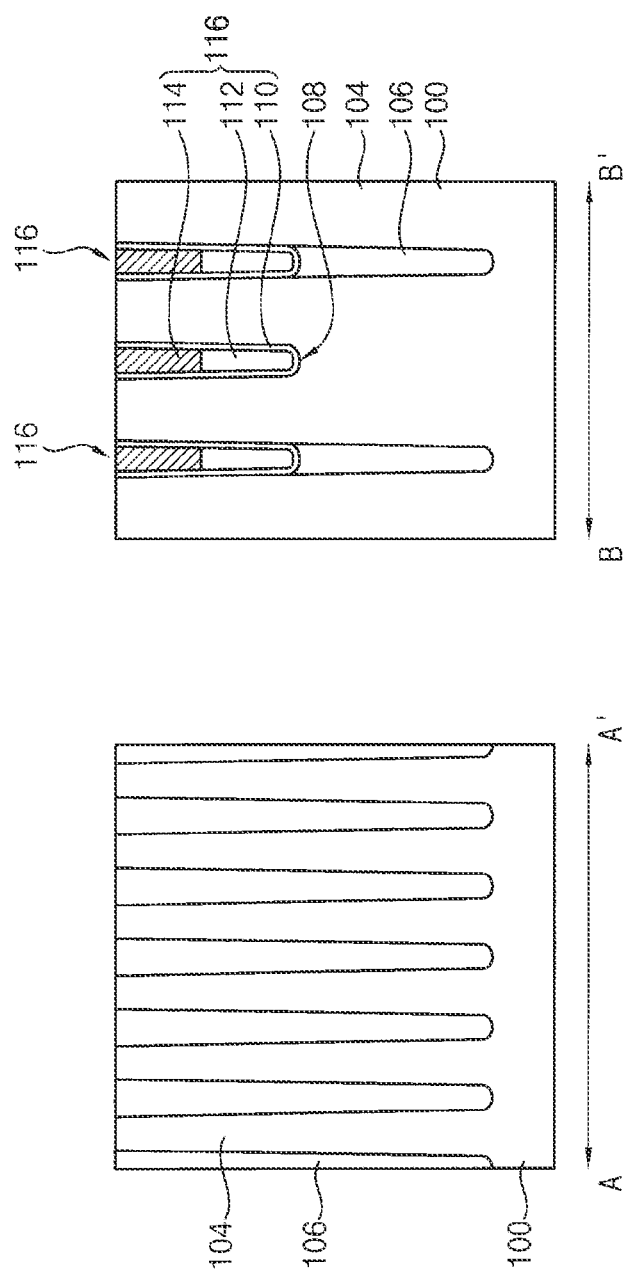
Figure 9:
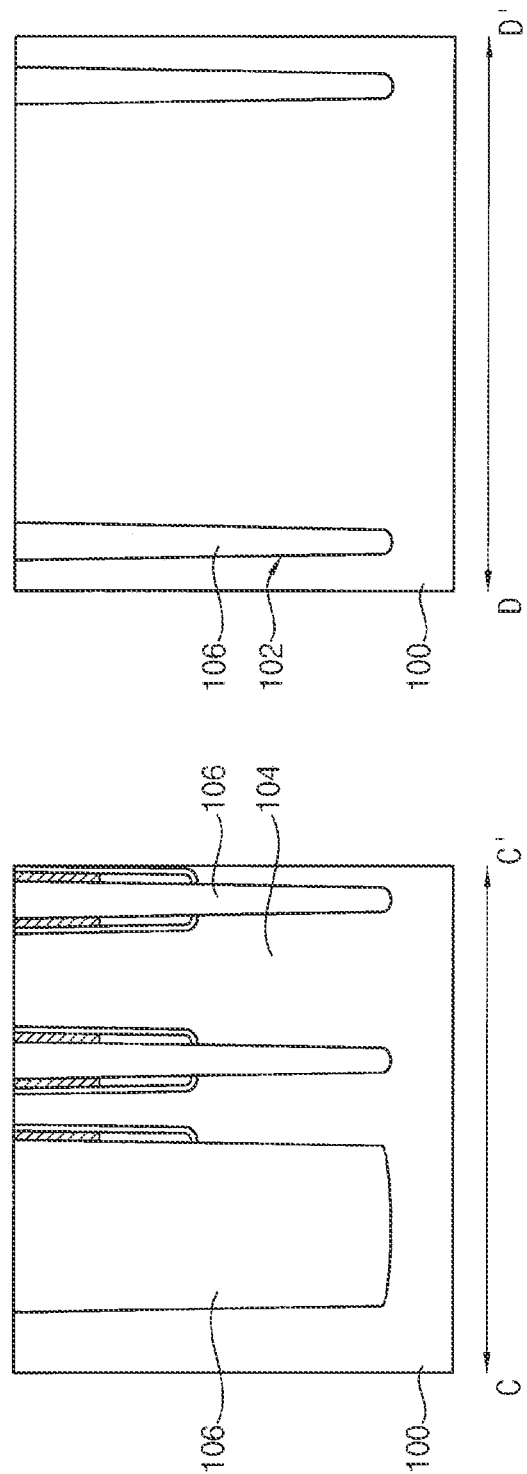

Referring to FIGS. 8 and 9, impurity regions (not shown) may be formed in the substrate 100 of the cell region I by performing an ion implantation process. Portions of the active pattern 104 and the device isolation pattern in the cell region I may be etched to form a first recess 108 extending in a first direction.

Thereafter, a first gate structure 116 may be formed in the first recess 108. The first gate structure 116 may include a first gate insulation layer 110, a gate electrode 112, and a capping mask pattern 114.

Figure 10:
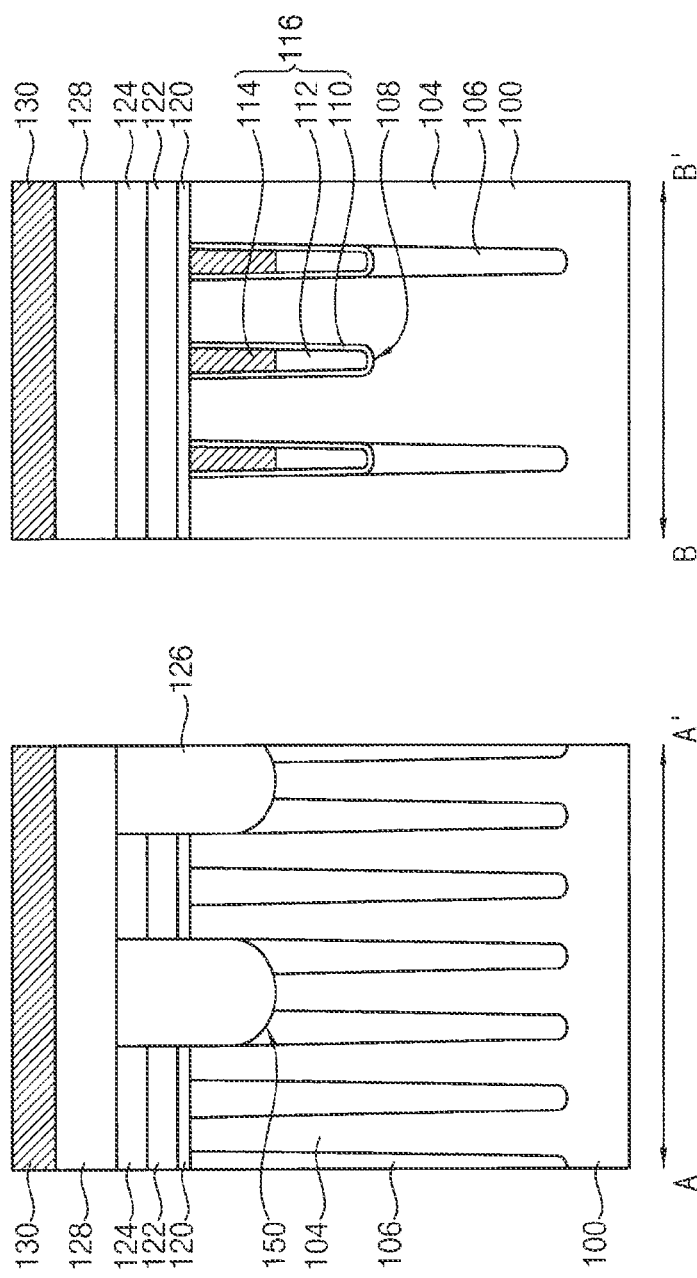
Figure 11:
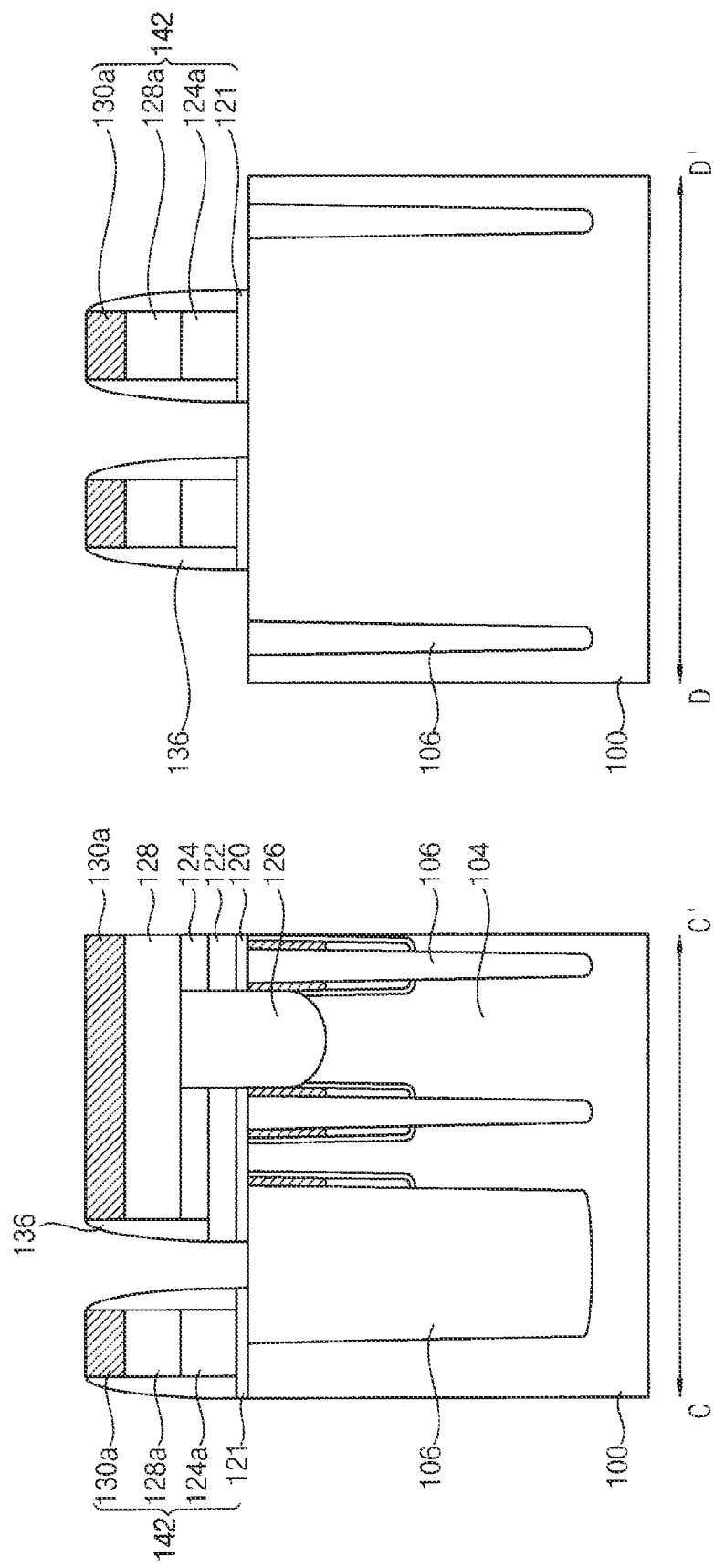

Referring to FIGS. 10 and 11, a first insulation layer 120 and a second insulation layer 122 may be sequentially formed on each of the active pattern 104, the device isolation pattern 106, and the capping mask pattern 114 in the cell region I. A second gate insulation layer 121 may be formed on the active pattern 104 in the core/peripheral regions II.

A first conductive layer 124 may be formed on the second insulation layer 122 and the second gate insulation layer 121.

Portions of the first conductive layer 124, the second insulation layer 122, and the first insulation layer 120 in the cell region I may be etched to form a first opening 150 that exposes a portion of the active pattern 104 in the cell region I. In some example embodiments, the first opening 150 may expose a center portion of an upper surface of each of active patterns 104 in the cell region I.

A second conductive layer 126 may be formed to fill the first opening 150. Upper surfaces of the first and second conductive layers 124 and 126 may be coplanar with each other. The first and second conductive layers 124 and 126 may include polysilicon doped with impurities. The first and second conductive layers 124 and 126 may include the same material, so that the first and second conductive layers 124 and 126 may merge or may be merged into one layer.

A first barrier layer (not shown), a first metal layer 128, and a first capping layer 130 may be sequentially formed on the upper surfaces of the first and second conductive layers 124 and 126.

A first etching mask pattern (not shown) may be formed on the first capping layer 130 to cover the cell region I and expose a portion of the core/peripheral regions II. The first capping layer 130, the first metal layer 128, the first barrier layer, and the first conductive layer 124 in the core/peripheral regions II may be sequentially etched using the first etching mask pattern. Thus, a preliminary bit line structure may be formed on the cell region I. Further, a second gate structure 142 may be formed on the core/peripheral regions II. The second gate structure 142 may include a second gate insulation layer 121, a first conductive pattern 124a, a first metal pattern 128a, and a first capping layer pattern 130a, which may be sequentially stacked.

Spacers 136 may be formed on a sidewall of the preliminary bit line structure and a sidewall of the second gate structure 142. In an etching process for forming the spacer 136, portions of the first insulation layer 120, the second insulation layer 122, and the second gate insulation layer 121 between the spacers 136 may be removed. In some example embodiments, these portions may be removed together, e.g., during a single process. In some example embodiments, a nitride liner (not shown) may be further formed on the upper surface of the preliminary bit line structure, the upper surface of the second gate structure 142, the spacers 136, and the substrate 100 between the spacers. The nitride liner may include silicon nitride.

Figure 12:
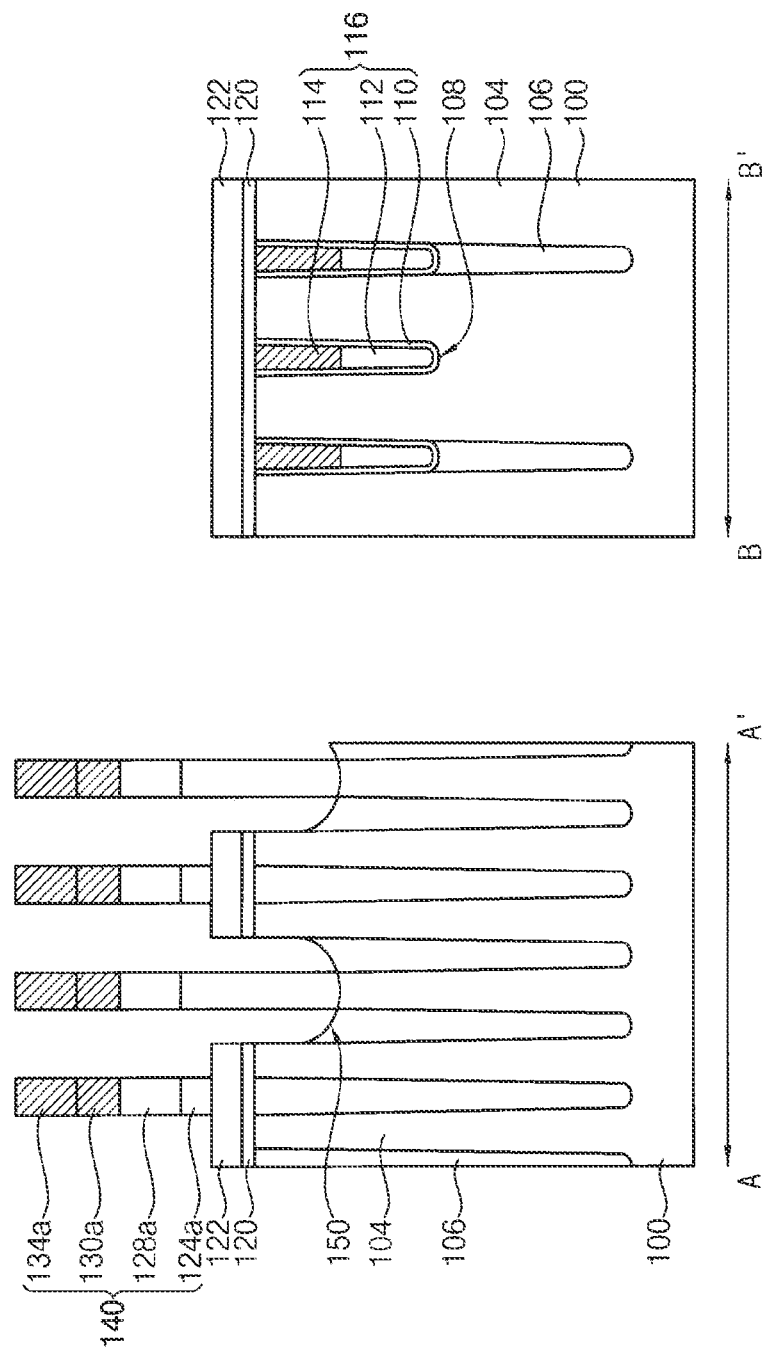
Figure 13:
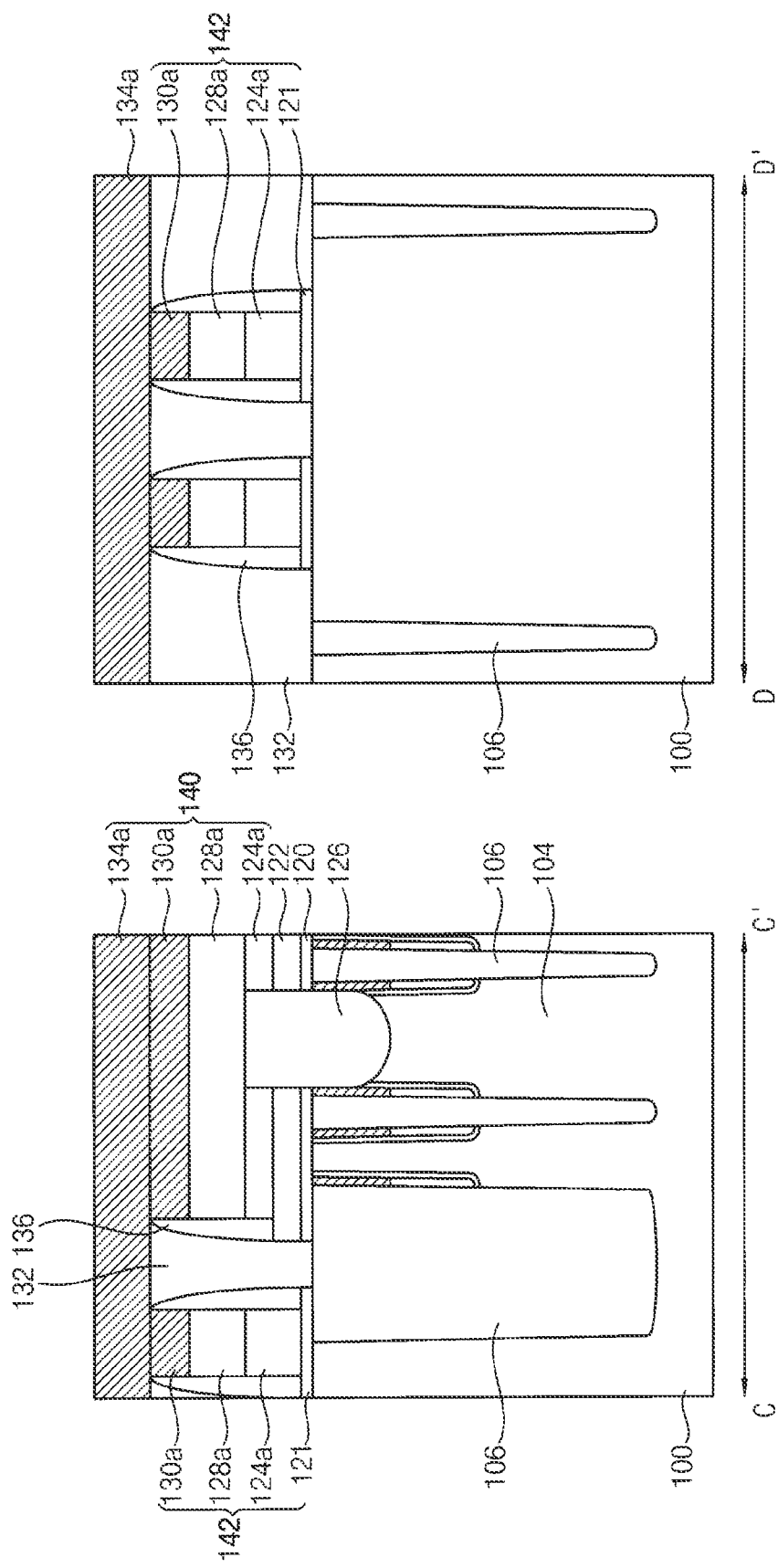

Referring to FIGS. 12 and 13, a lower insulating interlayer 132 may be formed on the substrate 100 of the core/peripheral regions II to fill areas between the second gate structures 142.

A second capping layer may be formed on the preliminary bit line structure, the second gate structure 142 and the lower insulating interlayer 132. The second capping layer may include silicon nitride. The first capping layer 130, the nitride liner, and the second capping layer include silicon nitride, and thus first capping layer 130, the nitride liner, and the second capping layer may be merged into one silicon nitride layer.

The second capping layer and the first capping layer 130 in the cell region I may be patterned to form a second capping layer pattern 134a and a first capping layer pattern 130a in the cell region and the core/peripheral regions II. A stack of the first and second capping layer patterns 130a and 134a in the cell region may have a line shape extending in the second direction. The second capping layer pattern 134a may be formed over an entire of the core/peripheral regions II.

The first metal layer 128, the first barrier layer, the second conductive layer 126, and the first conductive layer 124 in the cell region I may be etched using the first and second capping layer patterns 130a and 134a as an etching mask. Thus, a first conductive pattern 124a, a first barrier pattern (not shown), a first metal pattern 128a, and first and second capping layer patterns 130a and 134a may be sequentially stacked on the active pattern 104 in the first opening 150. Also, the first conductive pattern 124a, the first barrier pattern, the first metal pattern 128a, the first and second capping layer patterns 130a and 134a may be sequentially stacked on the second insulation layer 122 adjacent to the first opening 150. The first and second conductive layers may have the same material, so that a conductive pattern formed by patterning the first and second conductive layers may be referred to as the first conductive pattern 124a.

A stacked structure including the first conductive pattern 124a, the first barrier pattern, the first metal pattern 128a, the first capping layer pattern 130a, and the second capping layer pattern 134a may be referred to as the bit line structure 140.

The bit line structure 140 may extend in the second direction, and a plurality of the bit line structures 140 arranged in the first direction. The bit line structure 140 may extend in the second direction so as to contact a surface of the active pattern 104 exposed by the first opening 150.

Figure 14:
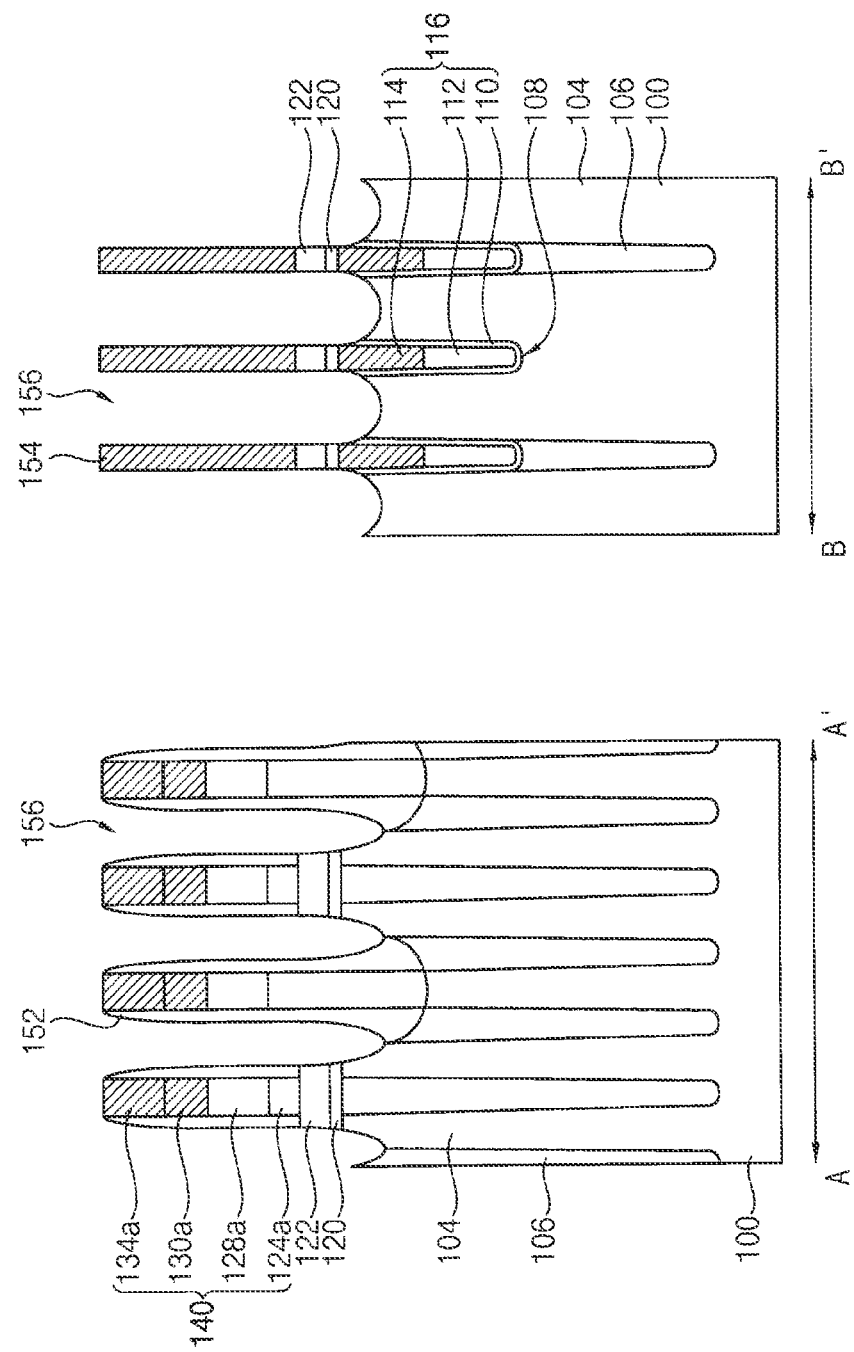

Referring to FIG. 14, a spacer structure 152 may be formed to cover sidewalls of the bit line structure 140. In FIG. 14, the spacer structure 152 may be simply shown as one spacer, but in some example embodiments the spacer structure 152 may include a plurality of spacers that are laterally stacked.

In some example embodiments, the spacer structure 152 may include a first spacer and a second spacer. The first spacer may cover a lower sidewall of the bit line structure 140 positioned in the first opening 150, and the second spacer may be formed on an uppermost surface of the first spacer to cover an upper sidewall of the bit line structure 140. Further, a third spacer and a fourth spacer may be sequentially stacked on a surface of the second spacer.

A first insulating interlayer (not shown) may be formed to fill a space between the spacer structures 152. After a second etching mask pattern (not shown) is formed on the first insulating interlayer and the spacer structure 152, the first insulating interlayer may be etched using the etching mask pattern to form a second opening (not shown).

In some example embodiments, the second etching mask pattern may extend in the first direction. A plurality of second etching mask patterns may be spaced apart from each other in the second direction. In some example embodiments, the second opening may be formed to overlap the first gate structure 116 thereunder. After that, an insulation pattern 154 may be formed to fill the second opening. The insulation pattern 154 may be formed to include a nitride such as silicon nitride.

The first insulating interlayer may be etched, and then the second insulation layer 122, the first insulation layer 120, and the surface portions of the substrate 100 thereunder may be etched to form a third opening 156 exposing the surface of the substrate 100.

Figure 15:
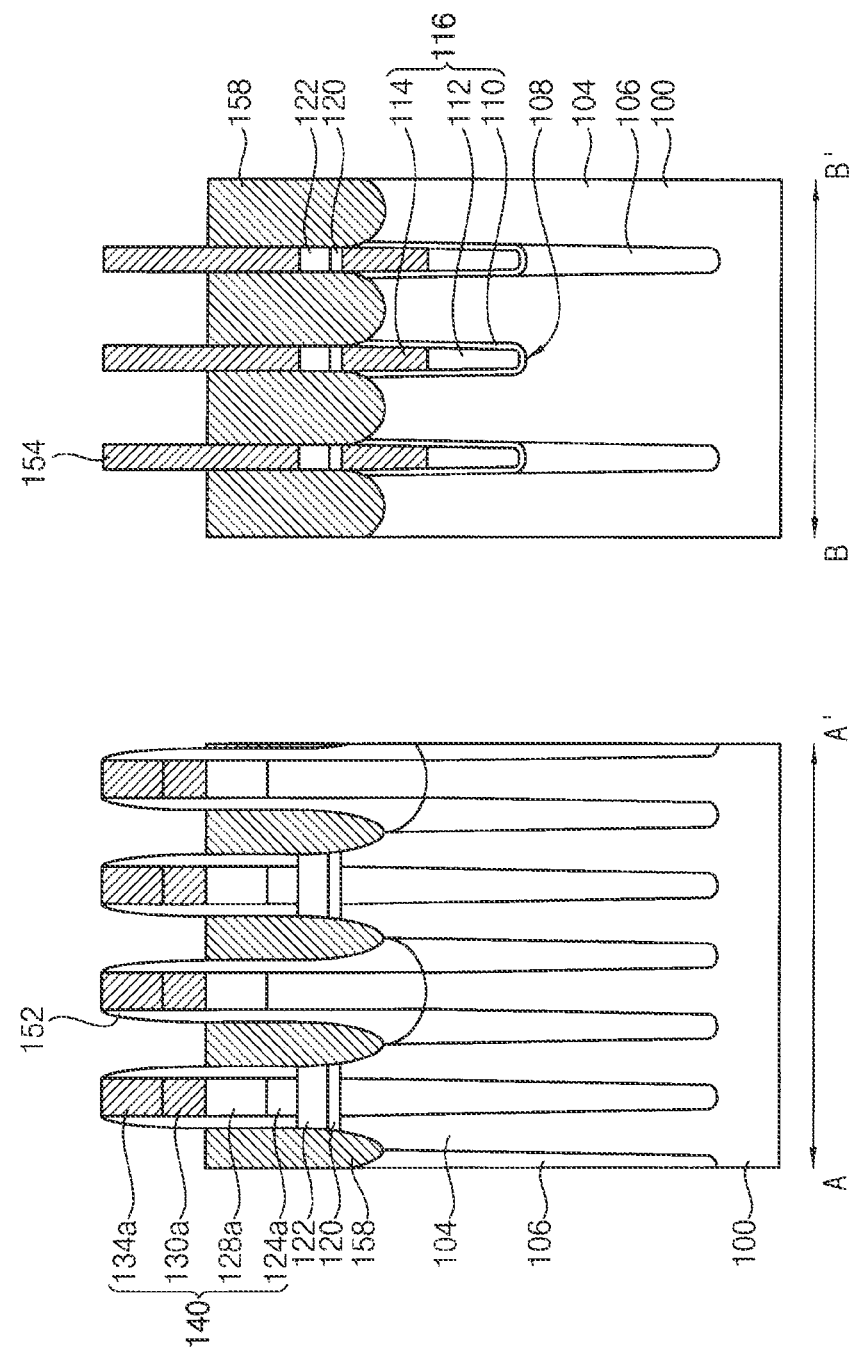

Referring to FIG. 15, a lower contact plug 158 may be formed to fill the lower portion of the third opening 156.

In some example embodiments, a conductive layer may be formed to fill the third opening 156, and then an upper portion of the conductive layer may be removed to form the lower contact plug 158. The conductive layer may include polysilicon doped with impurities. When the conductive layer is formed of a polysilicon layer, the conductive layer may fill the third opening 156 having a high aspect ratio.

When the processes illustrated with reference to FIGS. 14 and 15 are performed, a structure formed in the core/peripheral regions II may be maintained. In other words, when the processes illustrated with reference to FIGS. 14 and 15 are performed, the core/peripheral regions II may not be substantially modified.

Figure 16:
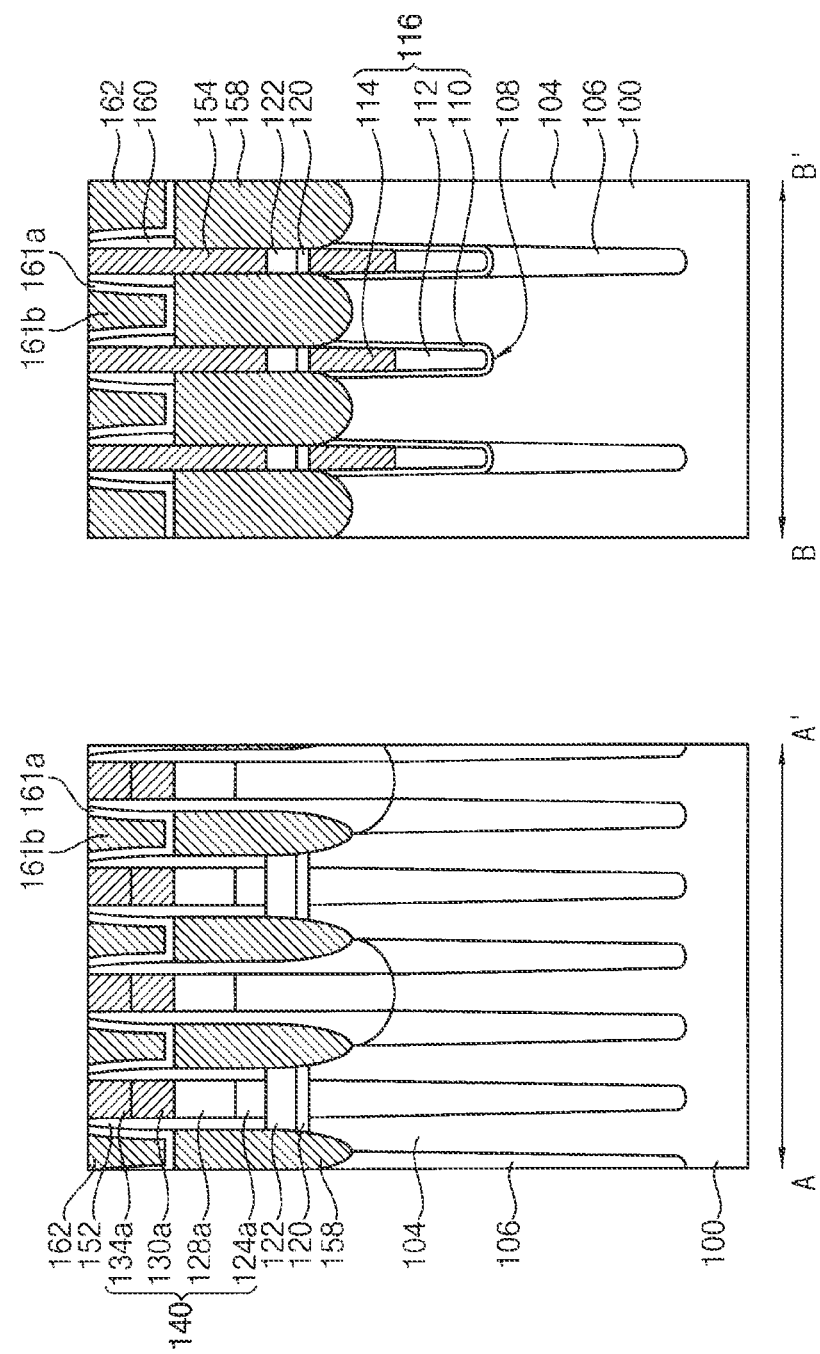
Figure 17:
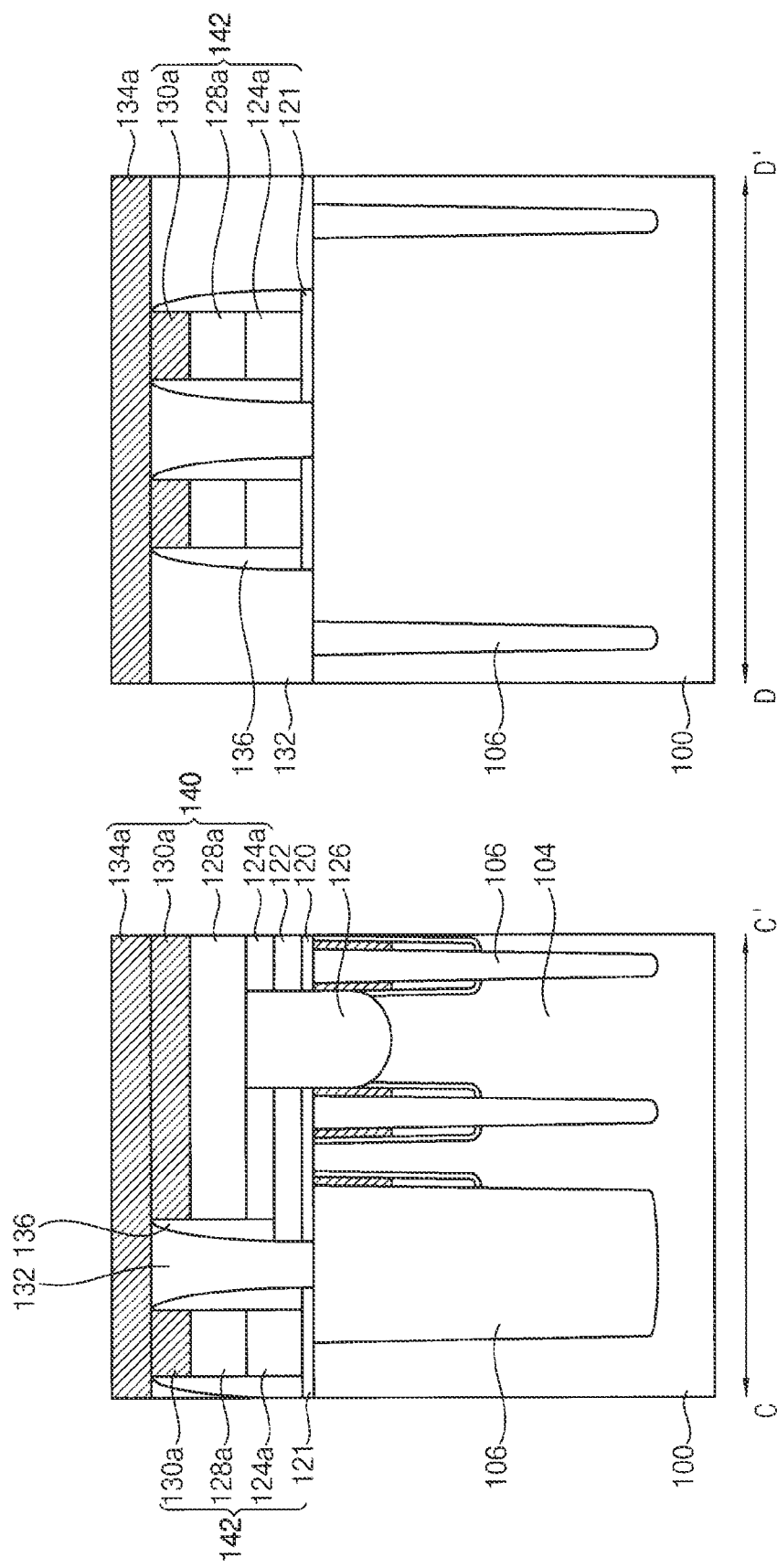

Referring to FIGS. 16 and 17, an upper spacer 160 may be formed on the upper sidewall of the insulation pattern 154. In the process for forming the upper spacer 160, the upper spacer (not shown) may also be formed on the spacer structure 152.

A second barrier layer may be formed on surfaces of the lower contact plug 158, the bit line structure 140, and the upper spacer in the cell region I, and the second capping layer pattern 134a in the core/peripheral regions II. The second barrier layer may conform to the surfaces on which it is formed. A second metal layer may be formed on the second barrier layer to fill a space between the bit line structures 140 and a space between the insulation patterns 154.

The second barrier layer may include, e.g., a metal such as titanium (Ti) or tantalum (Ta), or the like, and/or a metal nitride such as titanium nitride or tantalum nitride, or the like. The second metal layer may include, e.g., a metal such as tungsten (W).

Thereafter, the second metal layer and the second barrier layer may be planarized until the upper surface of the bit line structure 140 and the upper surface of the insulation pattern 154 may be exposed. In the planarization process, the second metal layer and the second barrier layer formed in the core/peripheral regions II may be completely removed, and an upper portion of the second capping layer pattern 134a may be partially removed. In the cell region I, an upper contact plug 162 may be formed on an upper surface of the lower contact plug 158 to fill the third opening.

The upper contact plug 162 may include a second barrier pattern 161a and a second metal pattern 161b. The second barrier pattern 161a may be formed on surfaces of the spacer structure 152, the upper spacer 160, and the lower contact plug 158, and the second barrier pattern 161a may conform to the surfaces on which it is formed. Thus, the second barrier pattern 161a may surround sidewalls and bottom of the second metal pattern 161b.

In some example embodiments, an uppermost surface of the upper contact plug 162 may be coplanar with an uppermost surface of the bit line structure 140.

In some example embodiments, after forming the upper contact plug 162, some of the spacers included in the spacer structure 152 may be removed to form an air spacer.

Figure 18:
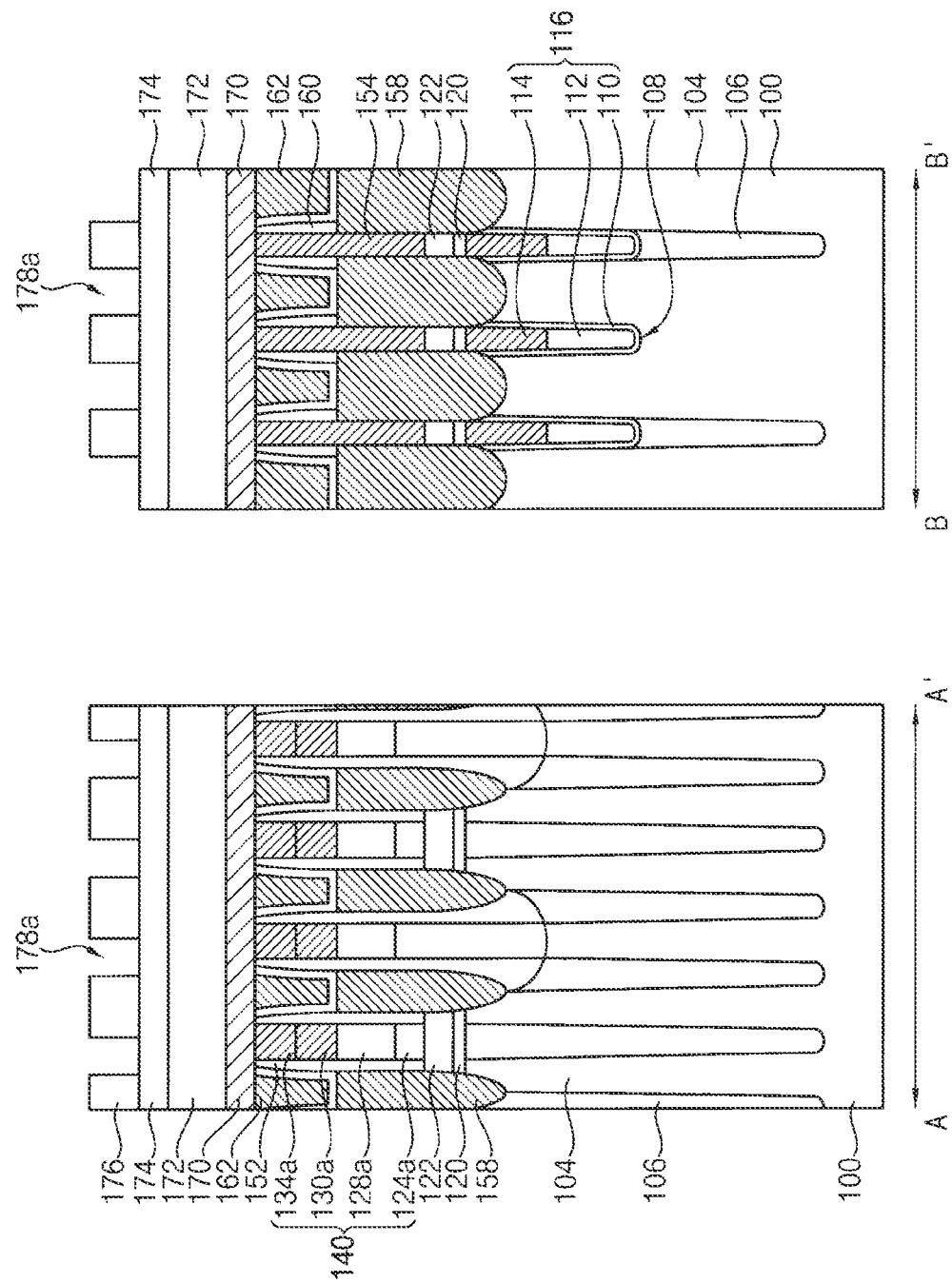
Figure 19:
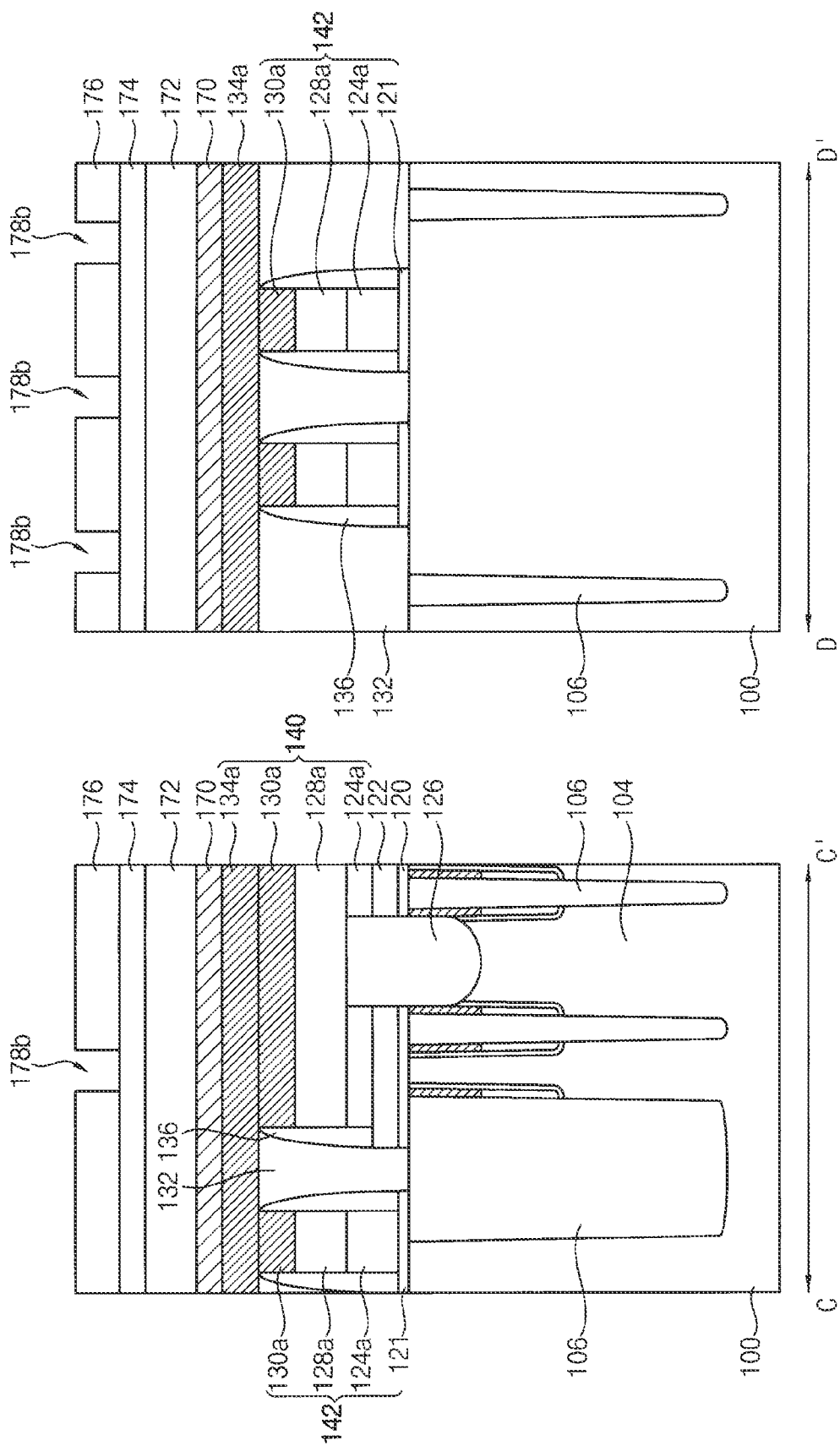

Referring to FIGS. 18 and 19, a third capping insulation layer 170 may be formed on the upper contact plug 162, the bit line structure 140, and the second capping layer pattern 134a. A first layer 172 and a second layer 174 are sequentially formed on the third capping insulation layer 170.

The third capping insulation layer 170 may include silicon nitride. The first layer 172 may include, e.g., a spin-on-hardmask (SOH). The second layer 174 may include silicon oxynitride.

A first photoresist layer may be coated on the second layer 174. First photoresist patterns 176 may be formed by performing a photo process on the first photoresist layer. The first photoresist patterns 176 may serve as etching masks for forming a landing pad pattern in the cell region I and contact plugs in the core/peripheral regions II.

The landing pad pattern may be formed between the upper contact plug 162 and a capacitor, and the landing pad pattern may be electrically connected with the upper contact plug 162 and the capacitor. The contact plugs in the core/peripheral regions II may be electrically connected to the surface of the substrate 100, or may be electrically connected to the bit line structure 140.

In DRAM devices, the landing pad pattern may have a dimension of 20 nm or less and a pitch of 40 nm or less. Thus, the photo process for forming the landing pad pattern may be performed by an EUV exposure process using light having a short wavelength of about 13.5 nm. On the other hand, an arrangement density of the contact plugs may be lower than an arrangement density of the landing pad patterns. Thus, the contact plugs may be patterned by an exposure process having a lower resolution than the EUV exposure process. For example, the contact plugs may be patterned by an argon fluoride (ArF) immersion exposure process using light having a wavelength of about 193 nm.

The photo process for forming the first photoresist patterns 176 may include the EUV exposure process. A first exposure mask (i.e., reticle) used in the EUV exposure process may include a pattern portion for forming the landing pad pattern in the cell region I and a pattern portion for forming the contact plugs in the core/peripheral regions II, respectively. Thus, in some example embodiments the photoresist layer for forming the landing pad pattern in the cell region I and the photoresist layer for forming the contact plugs in the core/peripheral regions II may be simultaneously exposed by a single EUV exposure process using the first exposure mask.

On the other hand, when patterns having a dimension of about 20 nm or less and a pitch of about 40 nm or less are formed in the cell region I and the core/peripheral regions II, respectively, it may be difficult to form photoresist patterns in the cell region I and the core/peripheral regions II by a single EUV process. Therefore, a first EUV photo process may be performed on the photoresist layer in the cell region I to form the photoresist patterns in the cell region I, and a second EUV photo process may be separately performed on the photoresist layer in the core/peripheral regions II to form the photoresist patterns in the core/peripheral regions II.

However, the contact plugs in the core/peripheral regions II may have a low arrangement density and the pitch of 40 nm or more, so that the first photoresist patterns 176 for forming the landing pad patterns in the cell region I and the contact plugs in the core/peripheral regions II may be formed by the single EUV photo process. That is, a separate ArF immersion exposure process may not be performed for forming the contact plugs. Thus, the number of exposure processes for forming the landing pad pattern in the cell region I and the contact plugs in the core/peripheral regions II may be decreased, and the exposure processes may be simplified.

A level in a vertical direction of a bottom of the landing pad pattern in the cell region I may be different from a level in a vertical direction of a bottom of the contact plug in the core/peripheral regions II. As described above, photoresist patterns for forming the landing pad patterns and the contact plugs in different regions and having different shapes and arrangement densities may be formed by the single EUV process.

The first photoresist pattern 176 may include a fourth opening 178a exposing a portion of the landing pad pattern in the cell region. In addition, the first photoresist pattern 176 may include a fifth opening 178b exposing a portion of the contact plug in the core/peripheral regions.

Figure 20:
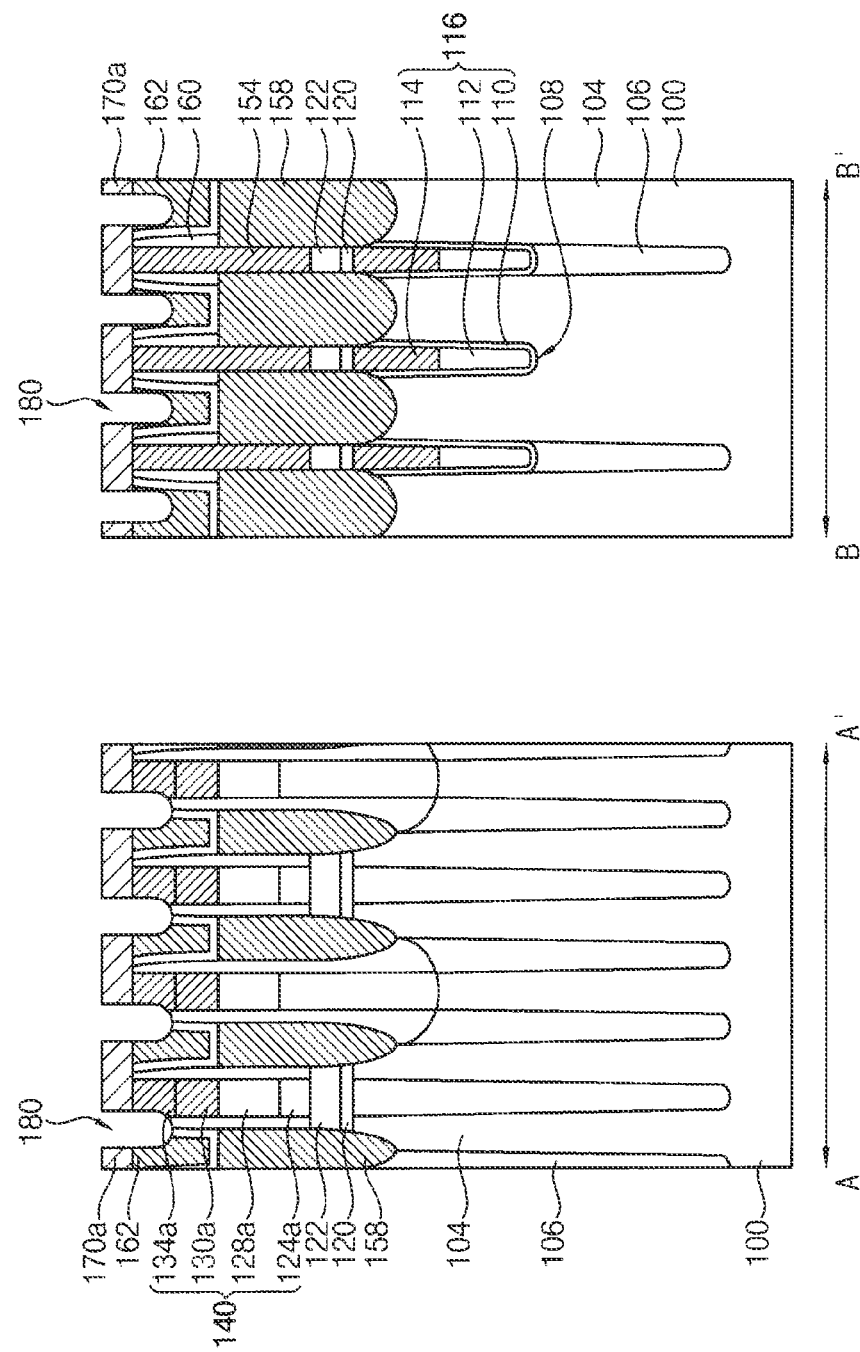
Figure 21:
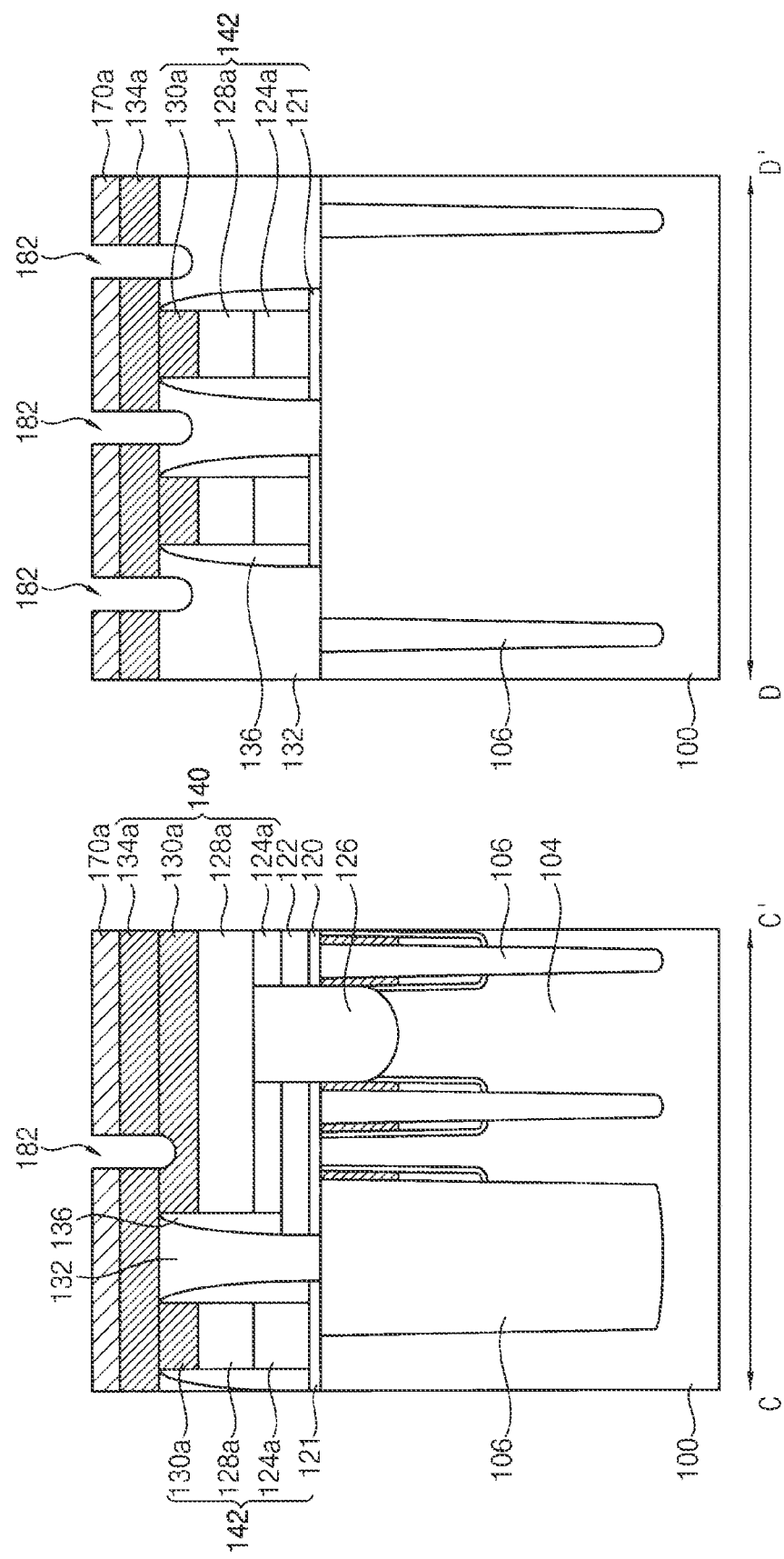

Referring to FIGS. 20 and 21, the second layer 174 and the first layer 172 may be sequentially etched using the first photoresist patterns 176 as an etching mask to form a second pattern and a first pattern.

Thereafter, the third capping insulation layer 170 may be etched using the first and second patterns as an etching mask to form a third capping insulation pattern 170a. In the etching process, the second pattern may be removed.

In the cell region I and the core/peripheral regions II, layers between the third capping insulation patterns 170a may be etched.

That is, in the cell region I, portions of the upper contact plug 162, the spacer structure 152, and the bit line structure 140 between the third capping insulation patterns 170a may be partially etched to form a sixth opening 180. An upper sidewall of the upper contact plug 162 may be exposed by the sixth opening 180. The sixth opening 180 may serve as a portion for forming the landing pad pattern.

In the core/peripheral regions II, portions of the second capping layer pattern 134a and the upper portion of the bit line structure 140 between the third capping insulation patterns 170a may be etched to form a preliminary seventh opening 182. In addition, in the core/peripheral regions II, an upper portion of the lower insulating interlayer 132 between the third capping insulation patterns 170a may be etched to form the preliminary seventh opening 182.

The first pattern may be removed by an ashing and/or strip process.

Figure 22:
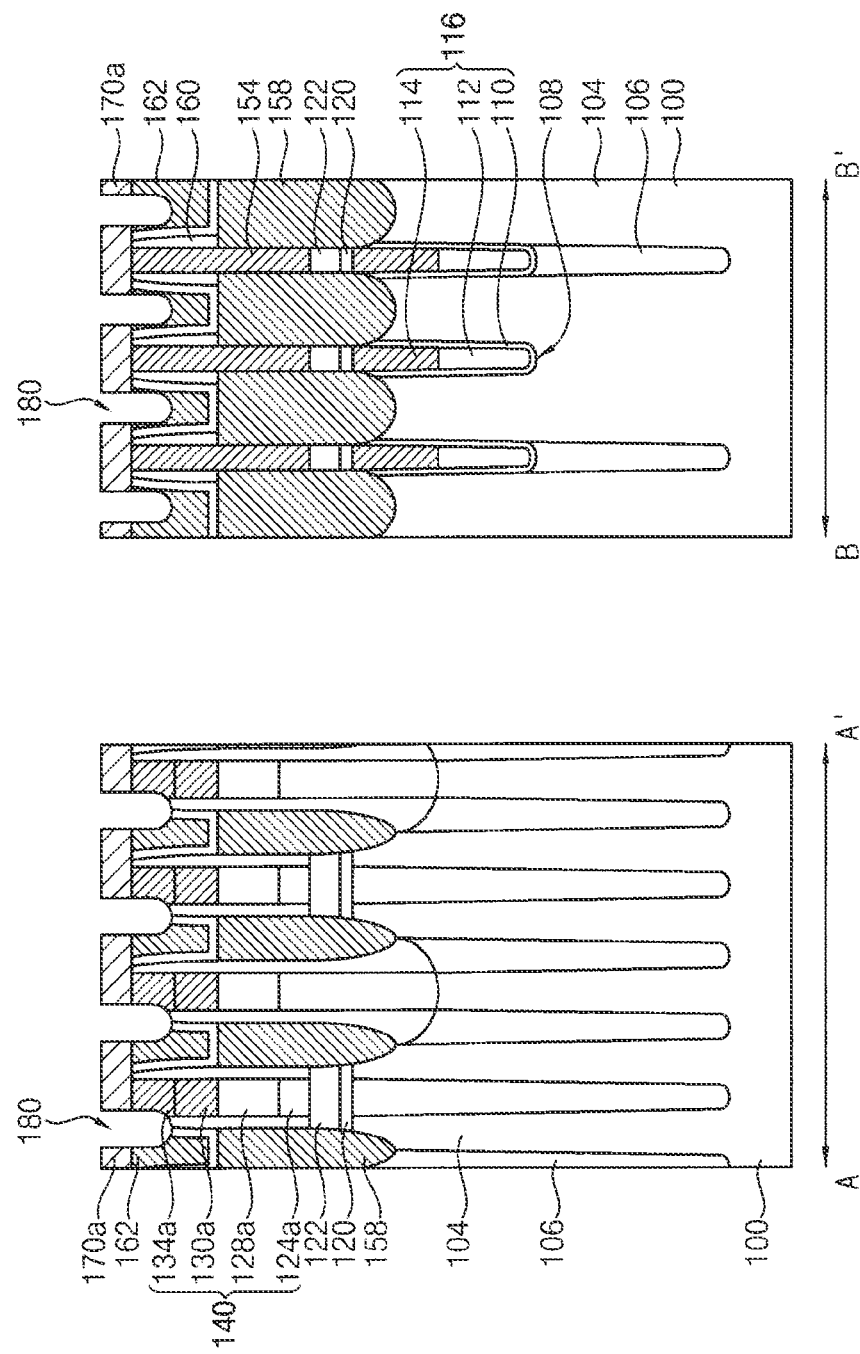
Figure 23:
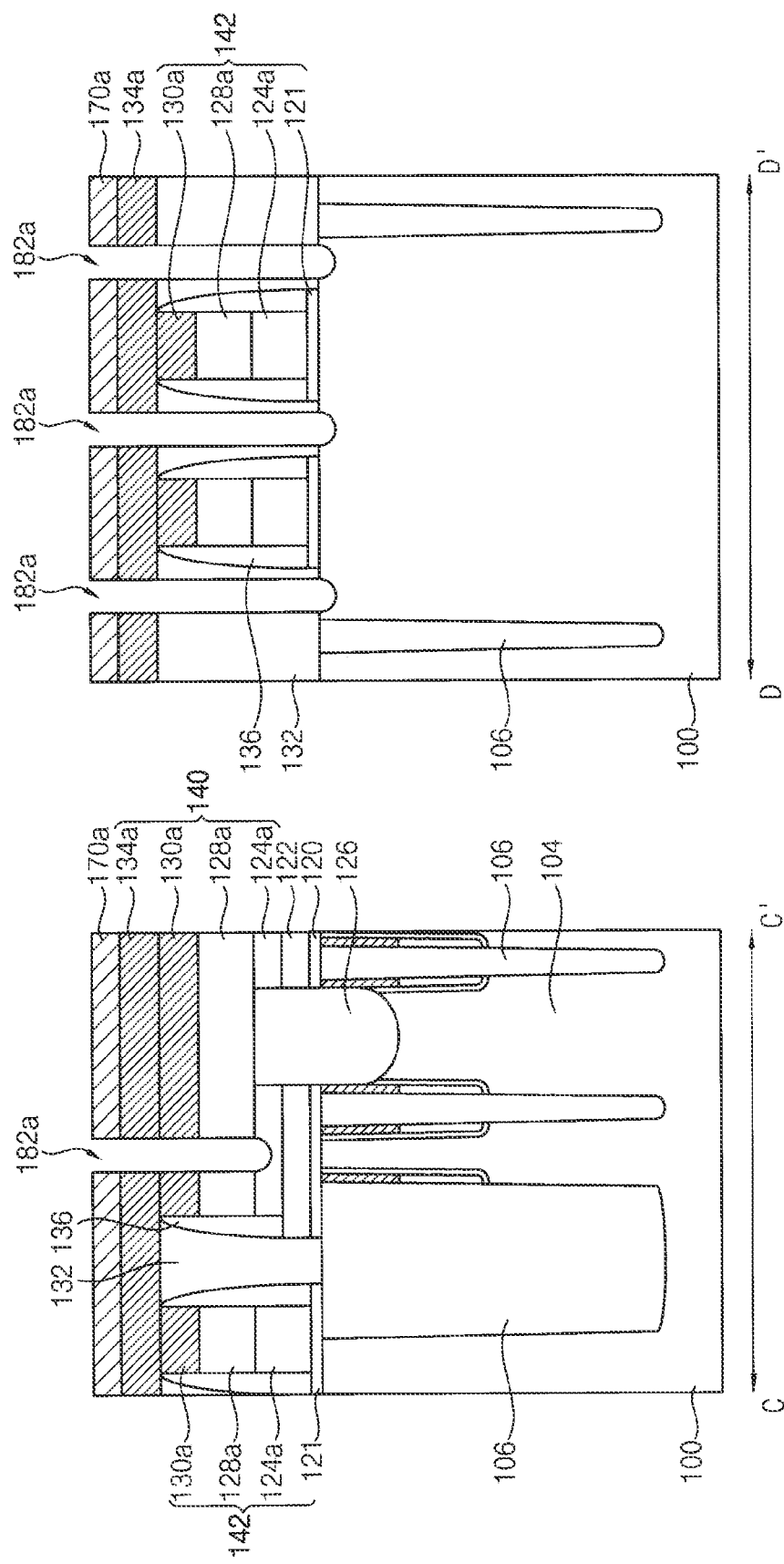

Referring to FIGS. 22 and 23, a photoresist layer may be coated to cover the third capping insulation pattern 170a, the sixth opening 180 and the seventh preliminary opening 182. Thereafter, a photo process may be performed on the photoresist layer to form a photoresist pattern (not shown). The photo process may include an exposure process having a low resolution and using a long wavelength. For example, the photo process may be performed by a krypton fluoride (KrF) photo process using about 248 nm.

The photoresist pattern may cover the entire third capping insulation pattern 170a and the sixth opening 180 in the cell region I. Further, the photoresist pattern may expose only a portion of the seventh preliminary opening 182 in the core/peripheral regions II, and the photoresist pattern may cover the core/peripheral regions II beside of the portion of the seventh preliminary opening 182.

Thereafter, layers under the preliminary seventh opening 182 may be further etched using the photoresist pattern as an etching mask. Thus, a seventh opening 182a exposing the first conductive pattern 124a of the bit line structure 140 may be formed in the core/peripheral regions II. In addition, the seventh opening 182a exposing the substrate 100 adjacent to sides of the second gate structure 142 may be formed in the core/peripheral regions II.

The photoresist pattern may be removed by an ashing and/or stripping process.

Figure 24:
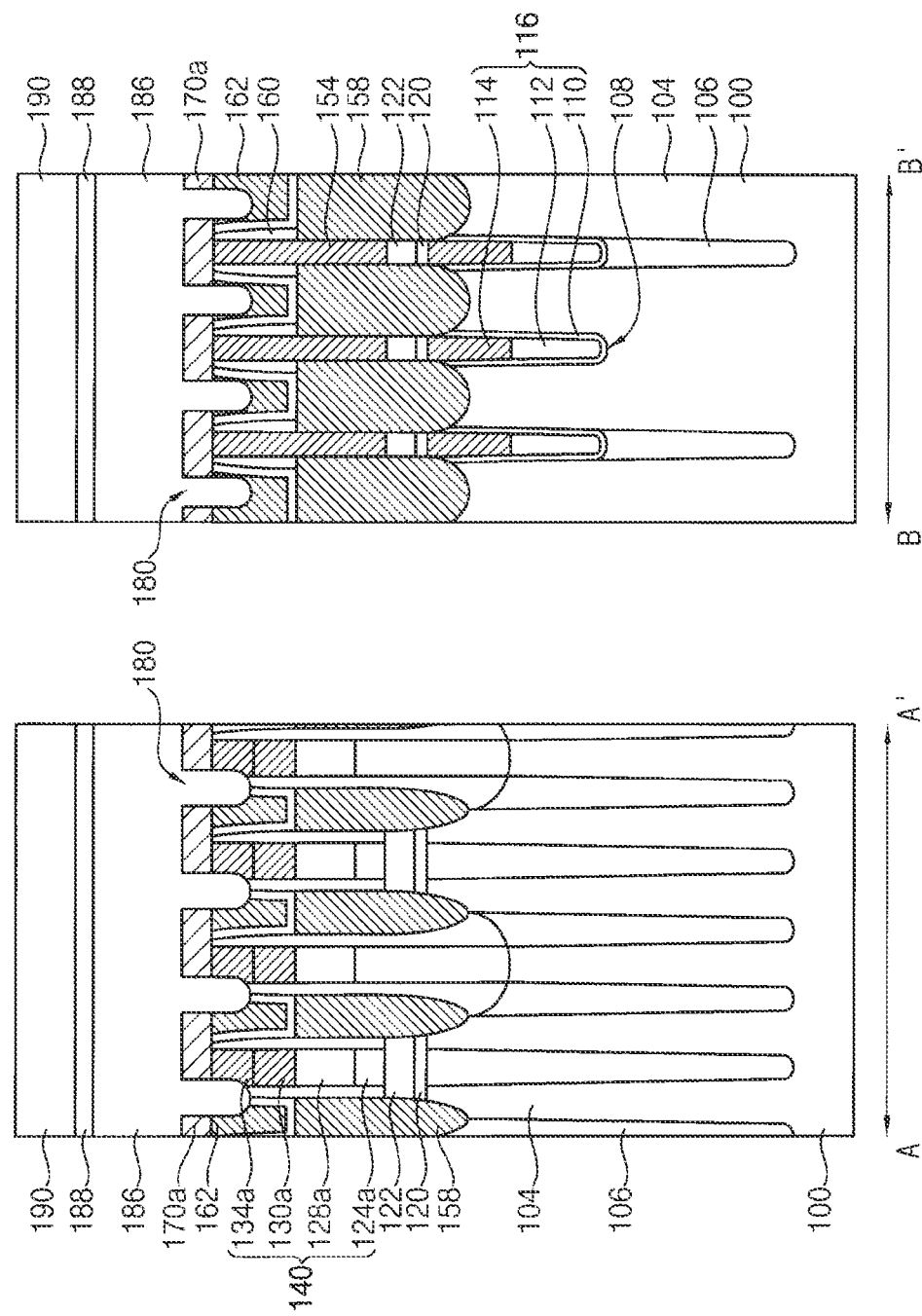
Figure 25:
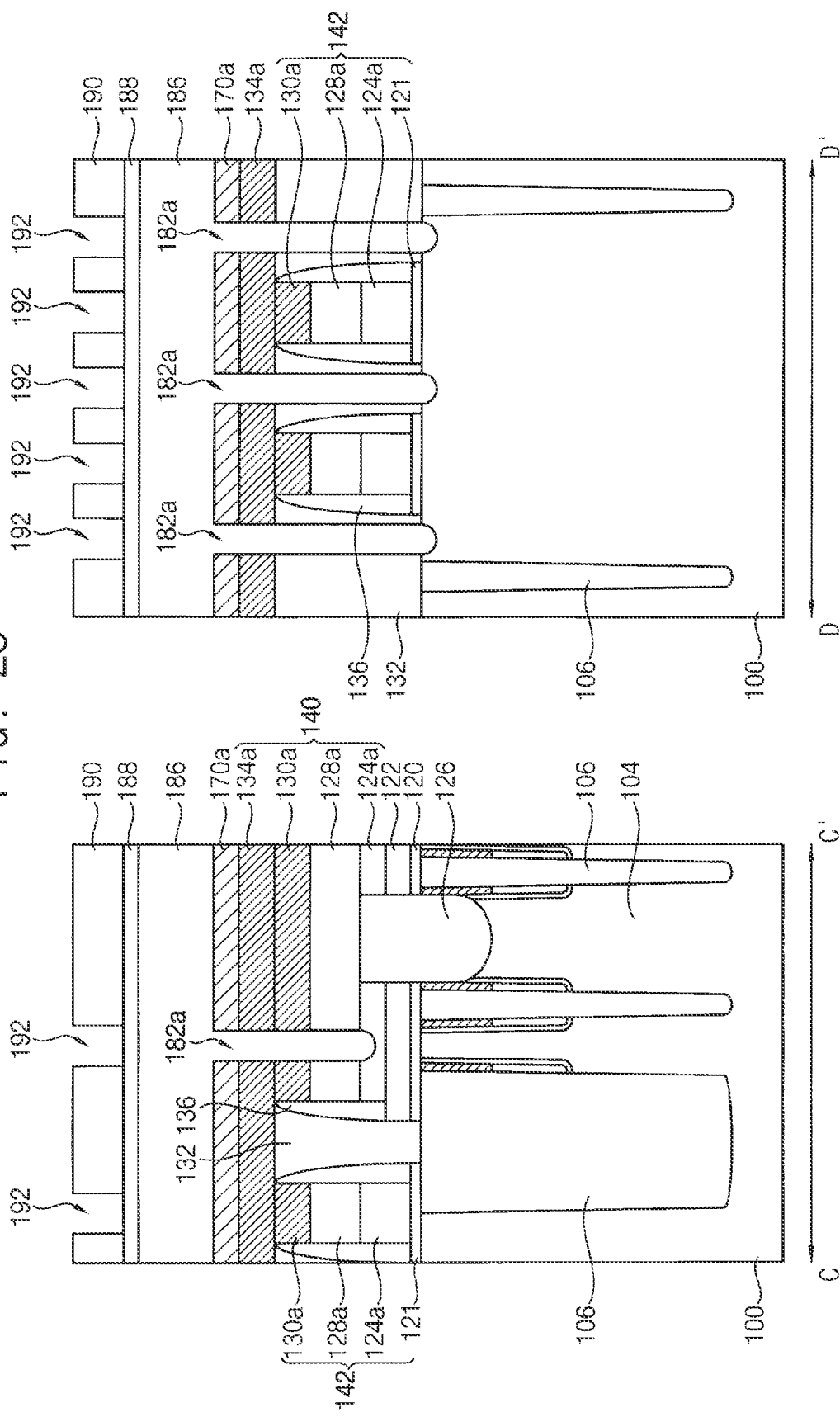

Referring to FIGS. 24 and 25, a third layer 186 may be formed on the third capping insulation pattern 170a to fill the sixth opening 180 and the seventh opening 182a. A fourth layer 188 may be sequentially formed on the third layer 186. The third layer 186 may include, e.g., a spin-on-hard mask. The fourth layer 188 may include silicon oxynitride.

A second photoresist layer may be coated on the fourth layer 188. A photo process may be performed on the second photoresist layer to form a second photoresist pattern 190. The second photoresist pattern 190 may serve as an etching mask for forming wirings in the core/peripheral regions.

The wiring in the core/peripheral regions may have a dimension (e.g., a line width) of about 20 nm or less and a pitch of about 40 nm or less. Thus, the photo process for forming the wiring may be an EUV exposure process using light of a short wavelength, such as about 13.5 nm.

The photo process for forming the second photoresist pattern 190 may include the EUV exposure process. A second exposure mask used in the EUV exposure process may include a portion of patterns for forming wiring in the core/peripheral regions II.

The second photoresist pattern 190 may include an eighth opening 192 exposing a portion of the wiring in the core/peripheral regions II. The eighth opening 192 may extend in a direction to have a trench shape. The eighth opening 192 may be overlapped with a portion of the seventh opening 182a. The second photoresist pattern 190 may cover entire of the fourth layer 188 in the cell region.

Figure 26:
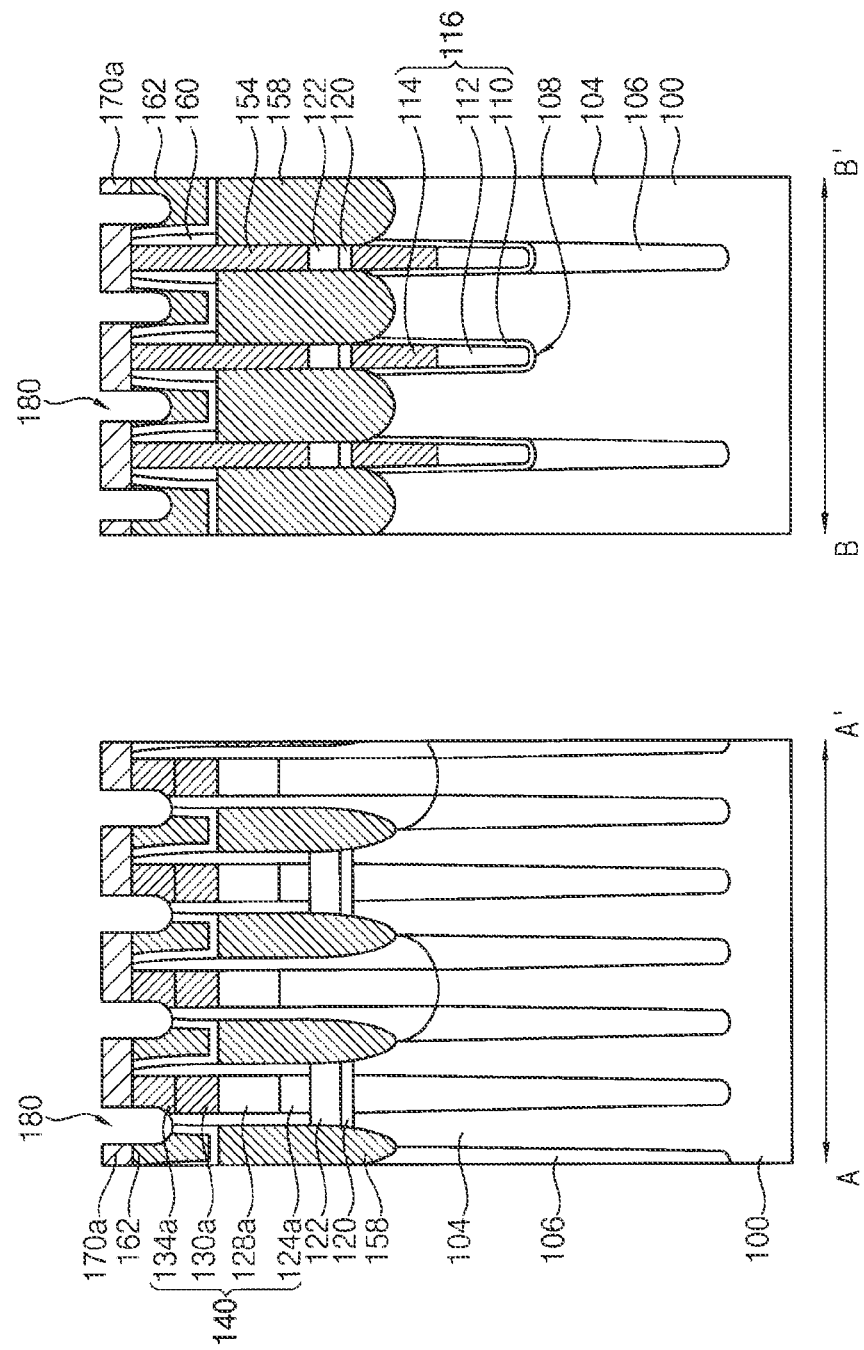
Figure 27:
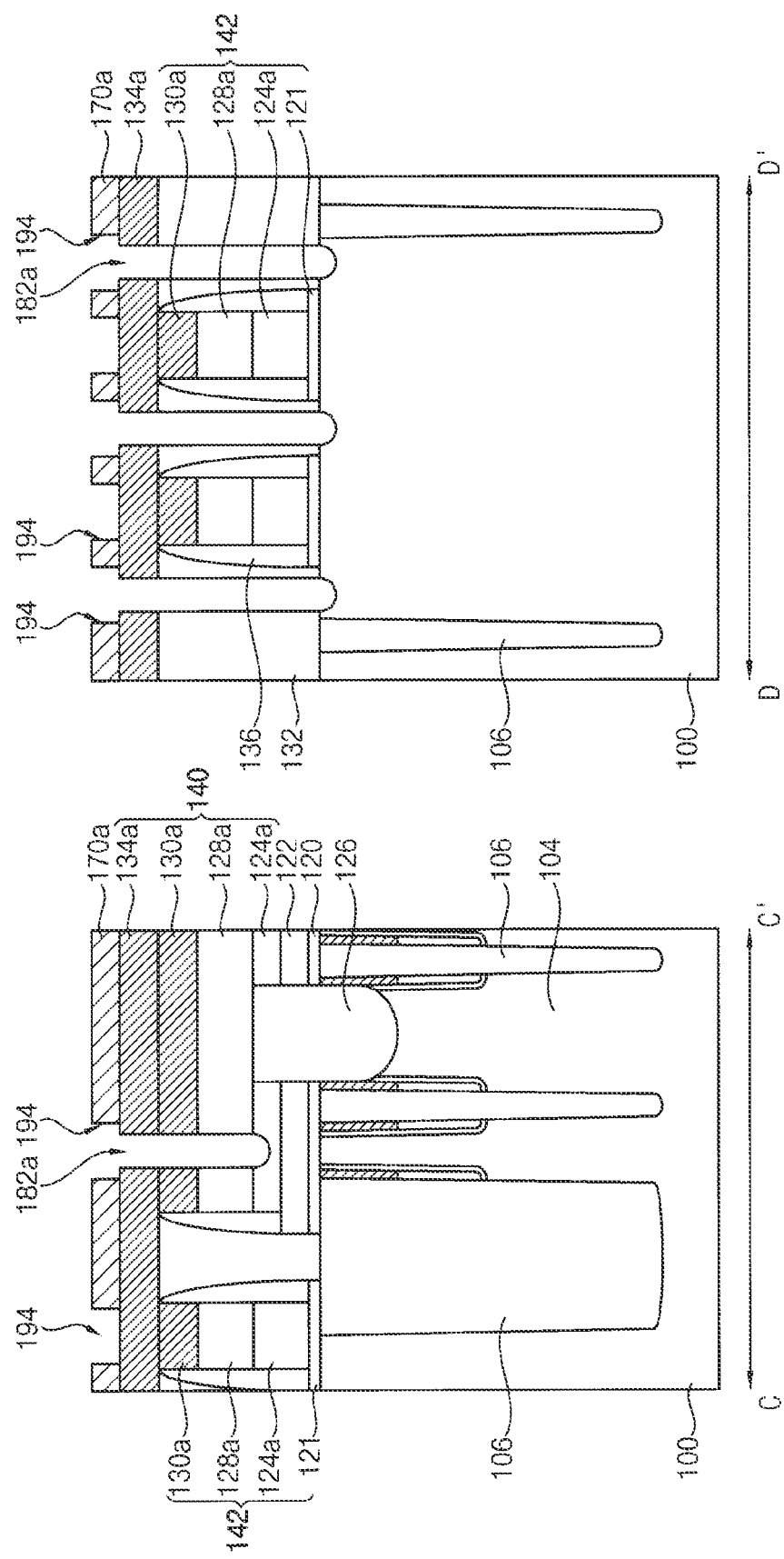

Referring to FIGS. 26 and 27, a fourth layer 188 and a third layer 186 may be sequentially etched using the second photoresist pattern 190 as an etching mask to form a fourth pattern and a third pattern.

Thereafter, the third capping insulation pattern 170a in the core/peripheral regions II may be etched using the third and fourth patterns as an etching mask to form a ninth opening 194. Thus, the ninth opening 194 may extend in a direction to have a trench shape, and the ninth opening 194 may be communicated with the seventh opening 182a.

The third pattern may be removed by an ashing and/or strip process.

Thus, seventh and ninth openings 182a and 194 for forming the contact plugs and the wiring may be formed in the core/peripheral regions II. In addition, a sixth opening 180 for forming the landing pad patterns may be formed in the cell region I.

As described above, the sixth and seventh openings 180 and 182a may be formed using the first photoresist pattern 176 formed by the EUV exposure process. In addition, the ninth opening 194 may be formed using the second photoresist pattern 190 formed by the EUV exposure process. That is, the sixth, seventh and ninth openings 180, 182a, and 194 may be formed using two EUV masks.

Figure 28:
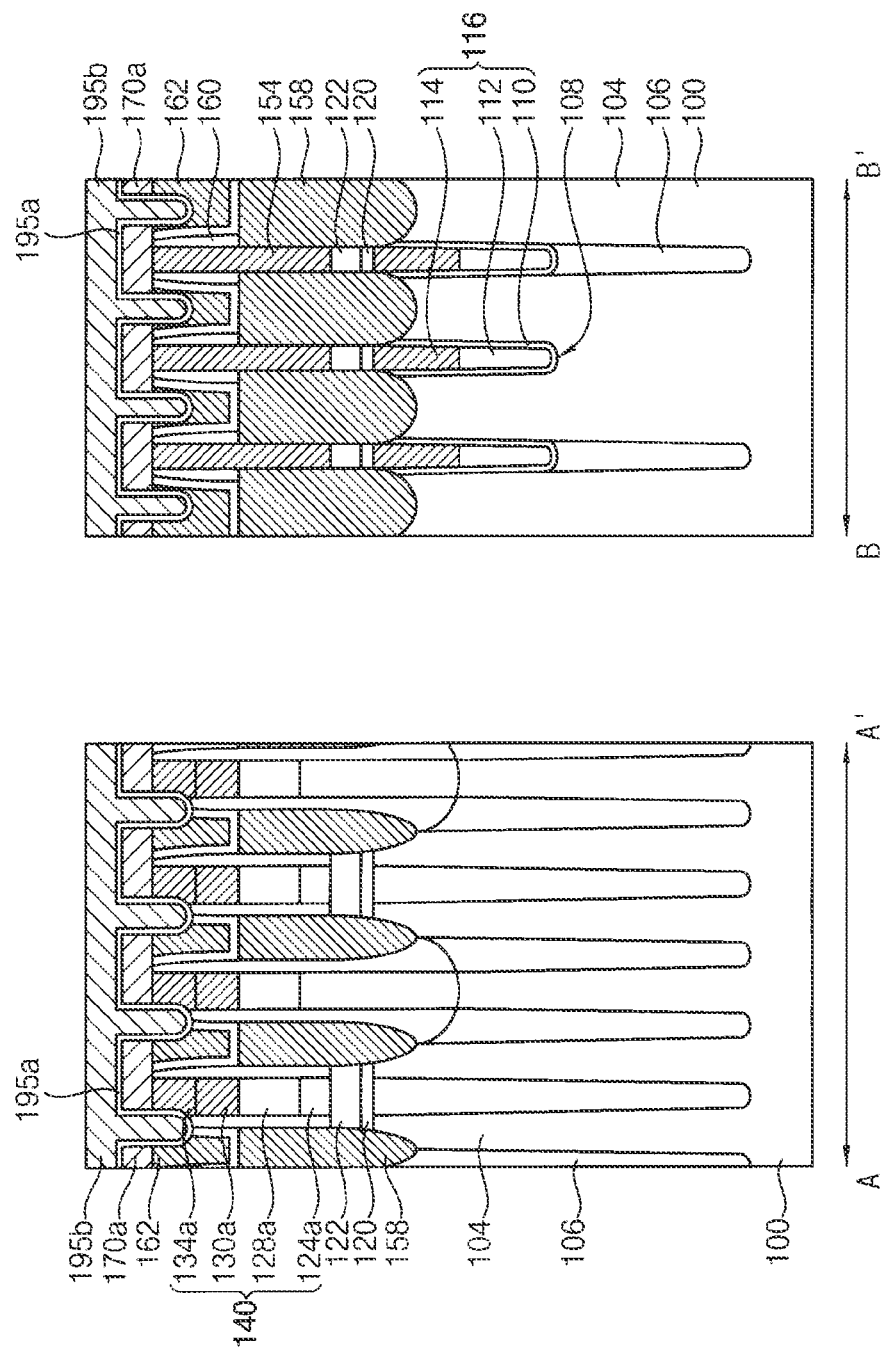
Figure 29:
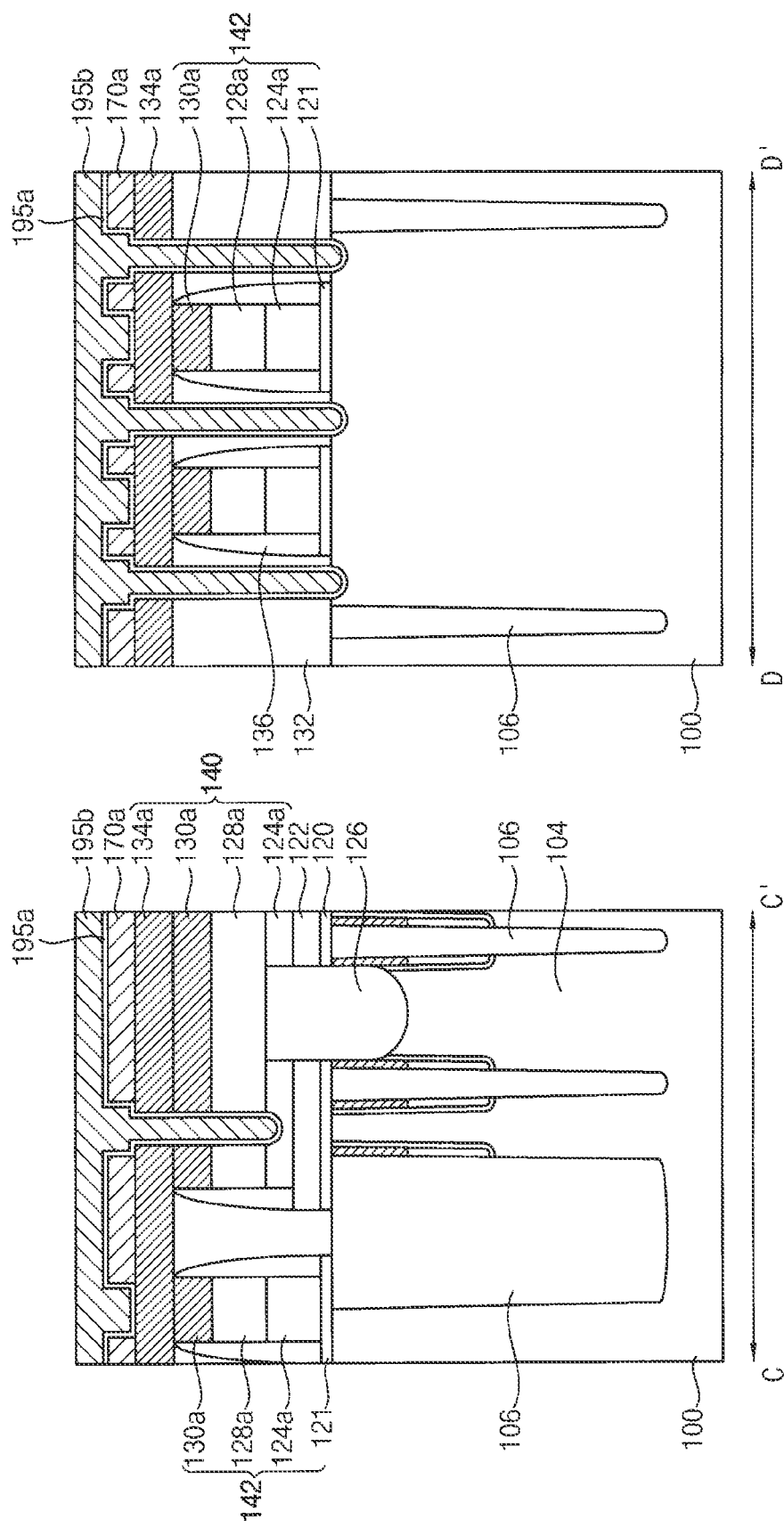

Referring to FIGS. 28 and 29, a third barrier layer 195a may be formed on surfaces of the third capping insulation pattern 170a, the sixth opening 180, the seventh opening 182a, and the ninth opening 194, and the third barrier layer 195a may conform to the surfaces on which it is formed. A third metal layer 195b may be formed on the third barrier layer 195a to completely fill the sixth opening 180, the seventh opening 182a, and the ninth opening 194.

The third barrier layer 195a may be formed to include, e.g., a metal such as titanium (Ti), tantalum (Ta) or the like, and/or a metal nitride such as titanium nitride, tantalum nitride or the like. The third metal layer 195b may be formed to include a metal such as tungsten (W).

Figure 30:
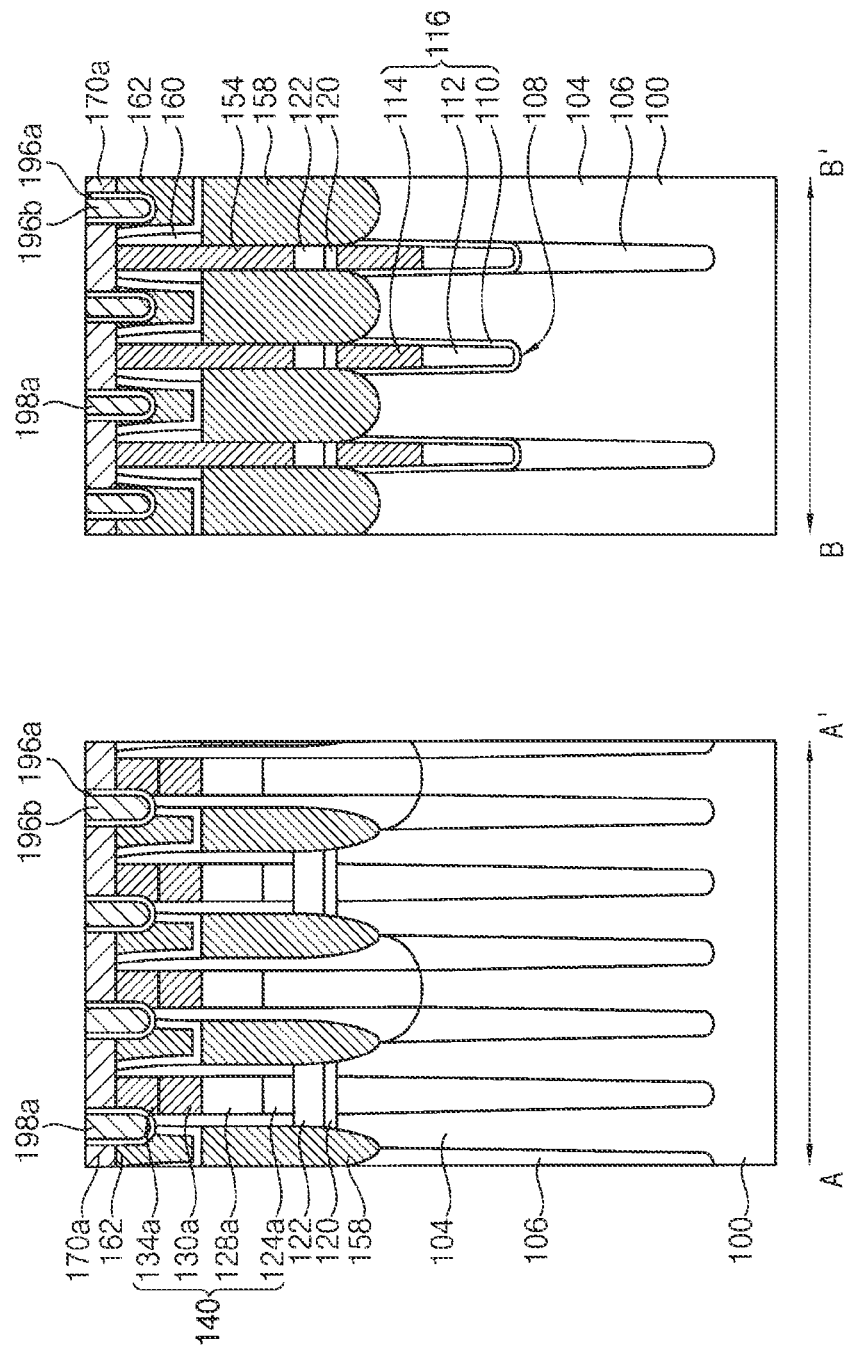
Figure 31:
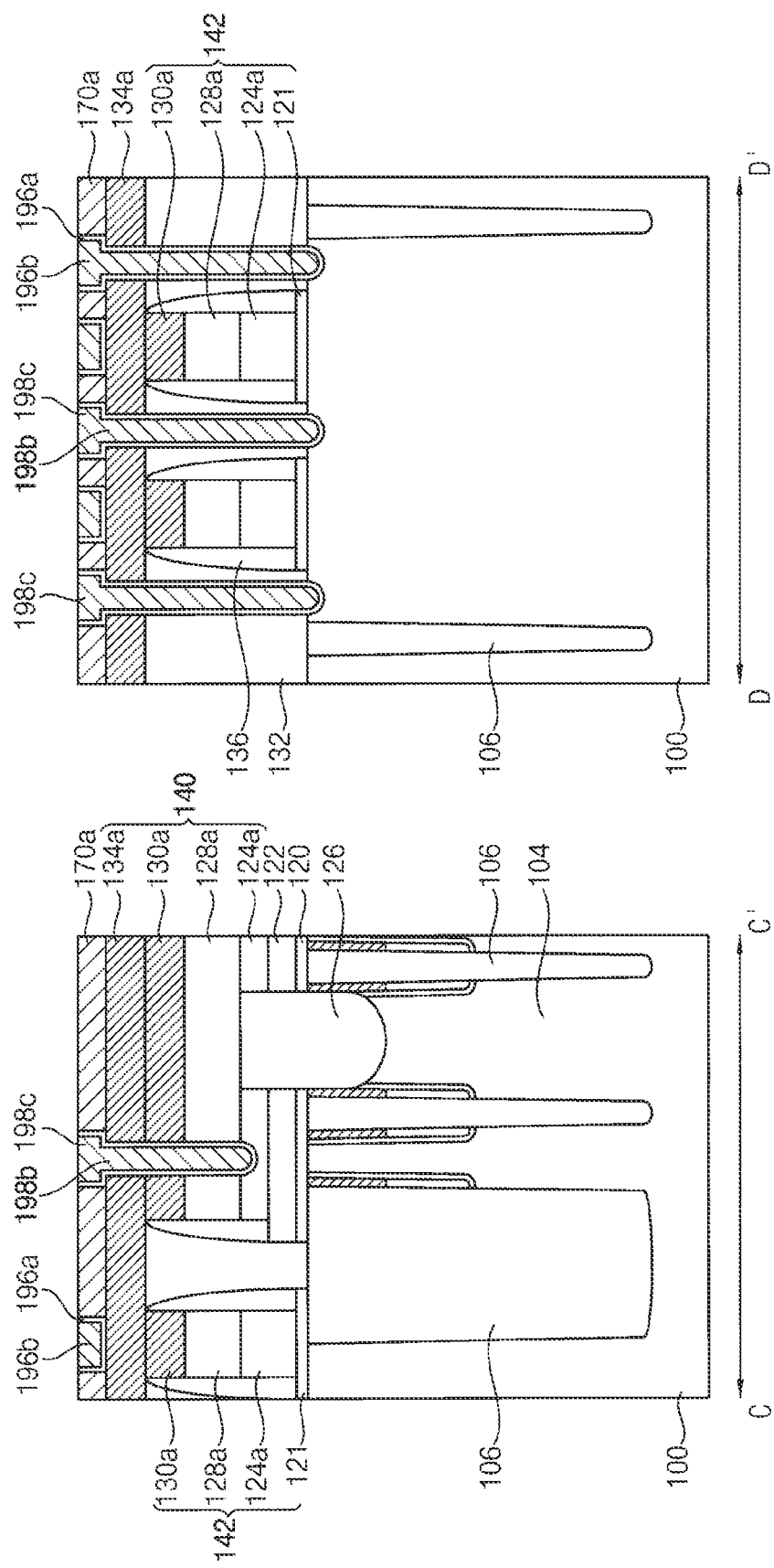

Referring to FIGS. 30 and 31, the third metal layer 195b and the third barrier layer 195a may be planarized until the upper surface of the third capping insulation pattern 170*a* may be exposed to form the landing pad patterns 198*a*, the contact plugs 198*b* and the wiring 198*c*. The planarization process may include a chemical mechanical polishing process.

The landing pad pattern 198*a* may be formed in the sixth opening 180 in the cell region I. The contact plug 198*b* may be formed in the seventh opening 182*a* in the core/peripheral regions II, and the wiring 198*c* may be formed in the ninth opening 194 in the core/peripheral regions II.

The landing pad pattern 198*a* may include a third barrier pattern 196*a* and a third metal pattern 196*b*. The third barrier pattern 196*a* may be formed on sidewalls and bottom of the sixth opening 180 and may conform to the surfaces on which it is formed. The third metal pattern 196*b* may be formed on the third barrier pattern 196*a* to fill the sixth opening. A lower portion of the landing pad pattern 198*a* may contact an upper sidewall of the upper contact plug 162 and sidewalls of the first and second capping layer patterns 130*a* and 134*a* of the bit line structure 140. In addition, the upper sidewall of the upper contact plug 162 and sidewalls of the first and second capping layer patterns 130*a* and 134*a* of the bit line structure 140 contacting a lower portion of the landing pad pattern 198*a* may be partially etched so as to include an etched portion. The third capping insulation pattern 170*a* may be disposed on the upper sidewall of the landing pad pattern 198*a*.

As described above, the contact plug 198*b* and the wiring 198*c* in the core/peripheral regions II may be formed by a dual damascene process.

A contacting portion between the contact plug 198*b* and the wiring 198*c* may include the third barrier pattern 196*a* and the third metal pattern 196*b*. The third barrier pattern 196*a* may be formed on surfaces of the seventh opening 182*a* and the ninth opening 194 and the third barrier pattern 196*a* may conform to the surfaces on which it is formed. The third metal pattern 196*b* may be formed on the third barrier pattern 196*a* to fill the seventh and ninth openings 182*a* and 194.

In the contact plug 198*b*, a first contact plug may contact the first conductive pattern 124*a* of the bit line structure 140, and a second contact plug may contact the substrate adjacent to sides of the second gate structure 142.

Referring to FIGS. FIGS. 1 and 2 again, a capacitor 200 may be formed on an upper surface of the landing pad pattern.

As described above, a DRAM device may be manufactured.

Figure 32:
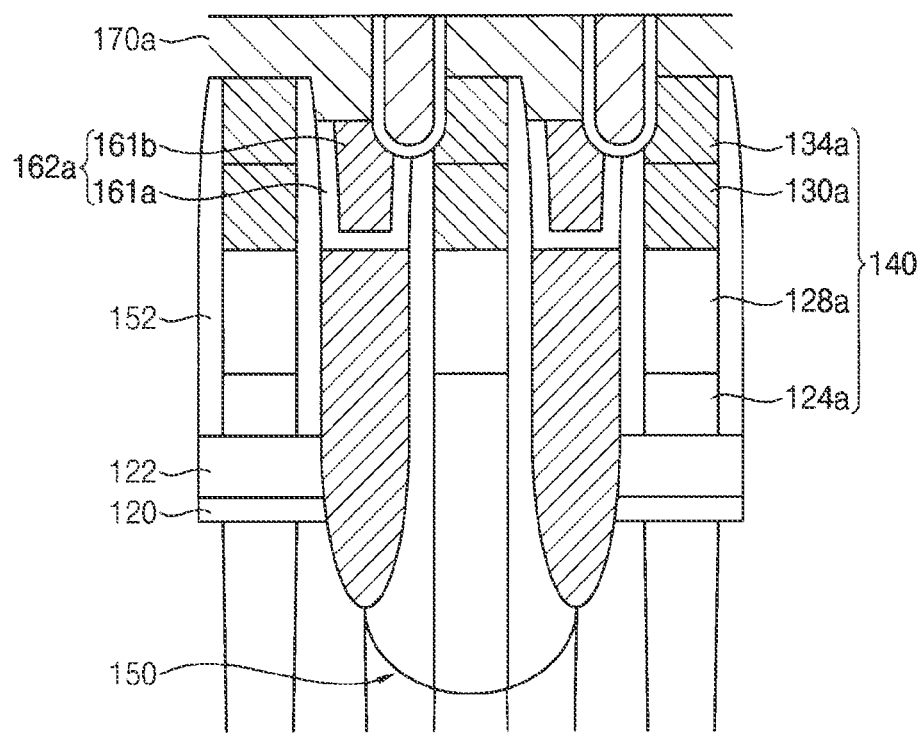

FIG. 32 is a cross-sectional view illustrating aspects of a semiconductor device in accordance with some example embodiments.

FIG. 32 is an enlarged cross-sectional view of a portion of a landing pad pattern.

The semiconductor device of FIG. 32 may be substantially the same as or similar to the semiconductor device illustrated with reference to FIGS. 1 to 5, except for a shape of the upper contact plug.

For example, structures in the core/peripheral regions II may be substantially the same as or similar to the structures in the core/peripheral regions II in the semiconductor device illustrated with reference to FIGS. 1 to 5. Thus, the same elements are given the same reference numerals, and repetitive descriptions thereof are omitted.

Referring to FIG. 32, an uppermost surface of the upper contact plug 162*a* may be lower than an uppermost surface of the bit line structure 140. Thus, the third capping insulation pattern 170*a* may be formed at an upper portion of the third opening between the bit line structures 140.

As the uppermost surface of the upper contact plug 162*a* is lower than the uppermost surface of the bit line structure 140, electrical short defects between the upper contact plug 162*a* and other conductive patterns (e.g., neighboring landing pad patterns) may be decreased.

Figure 33:
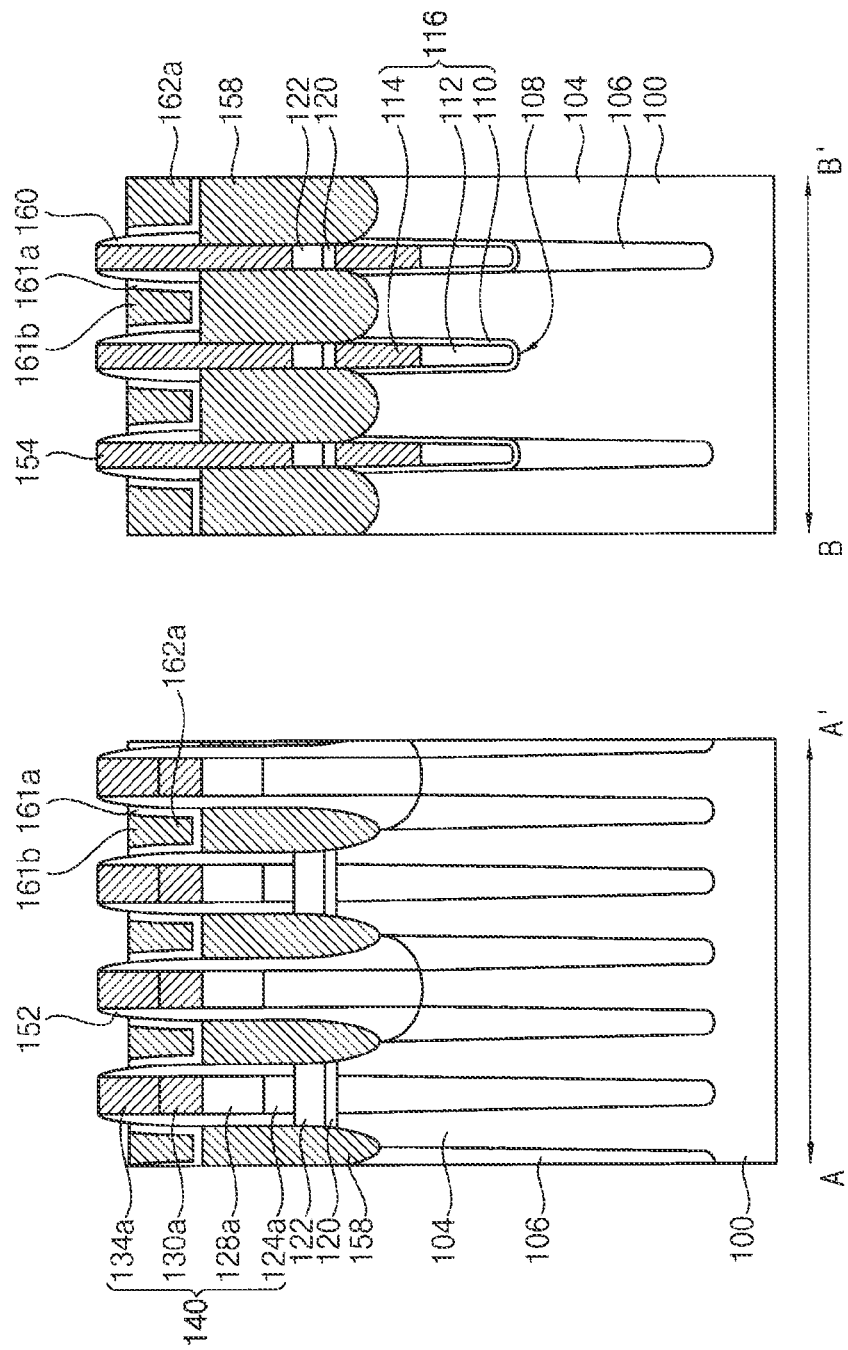

FIG. 33 is a cross-sectional view illustrating aspects of a method of manufacturing a semiconductor device in accordance with some example embodiments.

FIG. 33 is a cross-sectional view taken along lines A-A' and B-B' of FIG. 3.

Referring to FIG. 33, first, processes that are substantially the same or similar to the processes illustrated with reference to FIGS. 6 to 15 may be performed.

Thereafter, an upper spacer 160 may be formed on a sidewall of the insulation pattern 154. In the process of forming the upper spacer 160, the upper spacer may be further formed on the spacer structure 152.

A second barrier layer may be formed on surfaces of the lower contact plug 158, the bit line structure 140 and the upper spacer 160 in the cell region I, and surfaces of the second capping layer pattern 134*a* in the core/peripheral regions II. The second barrier layer may conform to the surfaces on which it is formed. A second metal layer may be formed on the second barrier layer to fill a space between the bit line structures 140 and a space between the insulation patterns 154.

The second metal layer and the second barrier layer may be planarized until upper surfaces of the bit line structure 140 and the insulation pattern 154 may be exposed. In the planarization process, an upper portion of the second capping layer pattern 134*a* in the core/peripheral regions II may be partially removed.

Thereafter, the second barrier layer and the second metal layer in the third opening may be additionally and partially etched to form an upper contact plug 162*a*. The upper contact plug 162*a* may be formed on an upper surface of the lower contact plug 158 in the third opening.

An upper surface of the upper contact plug 162*a* may be lower than an upper entrance portion of the third opening. The upper surface of the upper contact plug 162*a* may be lower than the upper surface of the bit line structure 140. In addition, an upper space of the third opening may remain above the upper contact plug 162*a*.

Subsequently, similar or the same processes as illustrated with reference to FIGS. 18 to 31 may be performed to form the semiconductor device.

However, when the processes illustrated with reference to FIGS. 18 and 19 are performed, the third capping insulation layer may be formed on the upper contact plug 162*a*, the bit line structure 140, and the second capping layer pattern to fill the upper space of the third opening. Thus, the third capping insulation pattern (FIG. 32, 170*a*) included in the semiconductor device may fill the third opening above the upper contact plug 162*a*.

Figure 34:
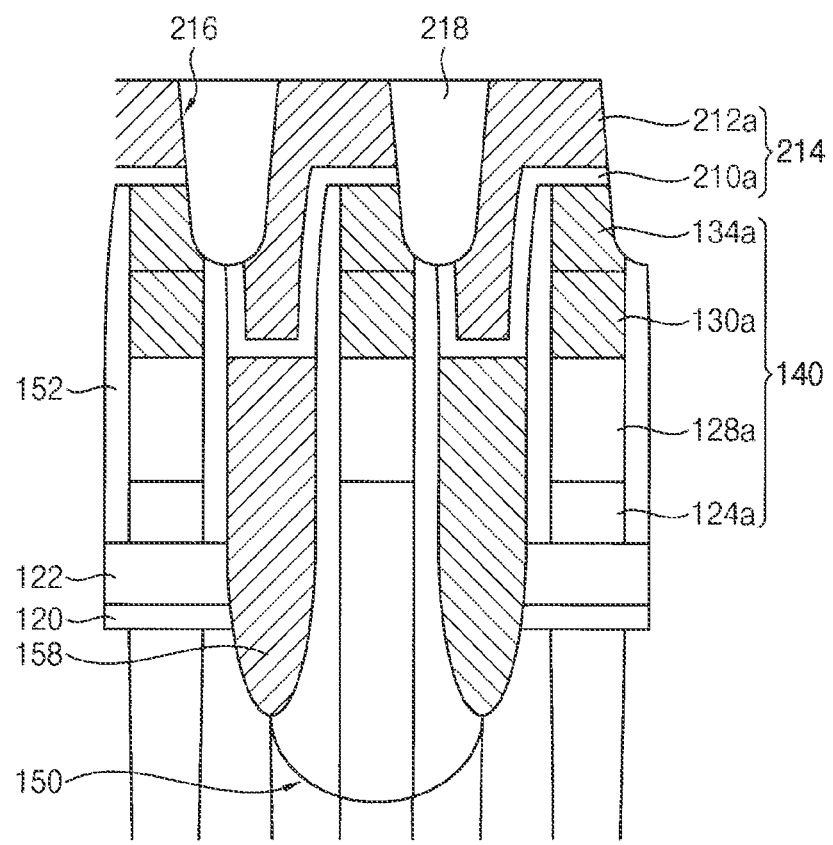

FIG. 34 is a cross-sectional view illustrating aspects of a semiconductor device in accordance with some example embodiments.

FIG. 34 is an enlarged cross-sectional view of a portion of landing pad patterns.

The semiconductor device of FIG. 34 may be substantially the same as or similar to the semiconductor device illustrated with reference to FIGS. 1 to 5, except for a shape of the upper contact plug. For example, structures in the core/peripheral regions II may be substantially the same as or similar to the structures in the core/peripheral regions II in the semiconductor device illustrated with reference to FIGS. 1 to 5. Thus, the same elements are given the same reference numerals, and repetitive descriptions thereof are omitted.

Referring to FIG. 34, a landing pad pattern 214 may be formed on the lower contact plug 158. An upper portion of the bit line structure 140 may include an etched portion.

In some example embodiments, a metal silicide pattern (not shown) may be further formed between the lower contact plug 158 and the landing pad pattern 214.

The landing pad pattern 214 may be stacked on the lower contact plug 158. The landing pad pattern 214 may be formed on an uppermost surface of an unetched portion of the bit line structure 140.

A sidewall of the landing pad pattern 214 may have an etched shape. An etched portion of the landing pad pattern 214 and an etched portion of the bit line structure 140 may serve as a recessed portion 216.

The landing pad pattern 214 may include a second barrier pattern 210a and a second metal pattern 212a. The second barrier pattern 210a may be formed on surfaces of the spacer structure 152 and the lower contact plug 158 and the upper surface of the bit line structure 140. The second barrier pattern 210a may conform to the surfaces on which the second barrier pattern 210a is formed. The second metal pattern 212a may be formed on an upper surface of the second barrier pattern 210a. That is, the second barrier pattern 210a may be formed on the lower surface of the second metal pattern 212a between the recessed portions 216.

An upper insulation pattern 218 may be formed in the recessed portion 216.

The landing pad pattern 214 may directly contact an upper surface of the lower contact plug 158.

FIGS. 35 to 41 are cross-sectional views illustrating aspects of a method of manufacturing a semiconductor device in accordance with some example embodiments.

FIGS. 35, 37, 39, and 41 include cross-sectional views taken along lines A-A' and B-B' of FIG. 3, and FIGS. 36, 38, and 40 include cross-sectional views taken along lines C-C' and D-D' of FIG. 3.

Figure 35:
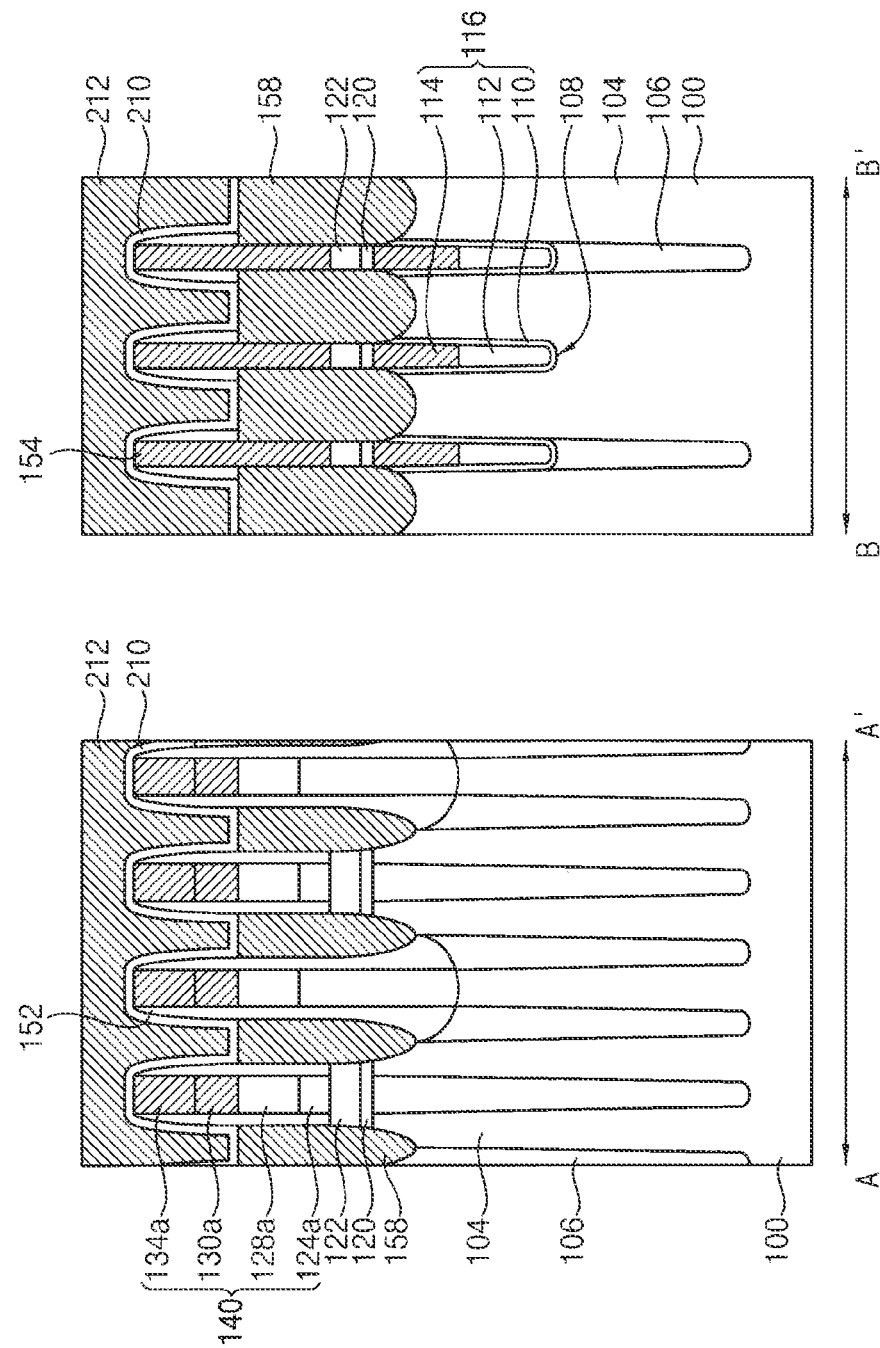
Figure 36:
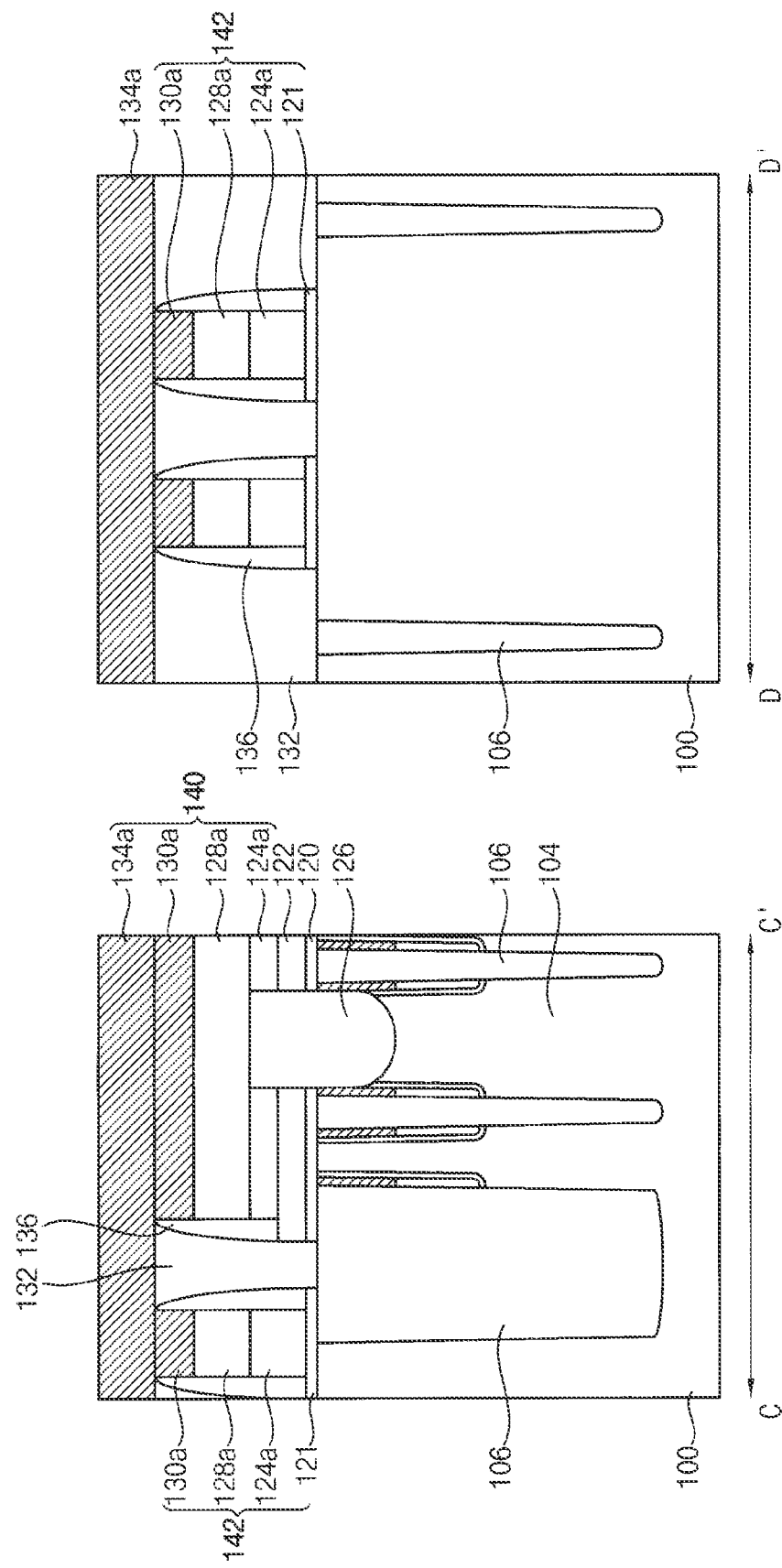

Referring to FIGS. 35 and 36, first, processes substantially the same or similar to the processes illustrated with reference to FIGS. 6 to 15 may be performed.

Thereafter, an upper spacer 160 may be formed on a sidewall of the insulation pattern 154. In the process of forming the upper spacer, the upper spacer may be further formed on the spacer structure 152.

A second barrier layer may be formed on surfaces of the lower contact plug 158, the bit line structure 140 and the upper spacer 160 in the cell region I, and surfaces of the second capping layer pattern 134a in the core/peripheral regions II. A second metal layer may be formed on the second barrier layer to fill a space between the bit line structures 140 and a space between the insulation patterns 154. In some example embodiments, an upper surface of the second metal layer 212 may be higher than an upper surface of the bit line structure 140.

Thereafter, the second barrier layer 210 and the second metal layer 212 in the core/peripheral regions II may be removed. Thus, the second capping layer pattern 134a may be exposed in the core/peripheral regions II.

Figure 37:
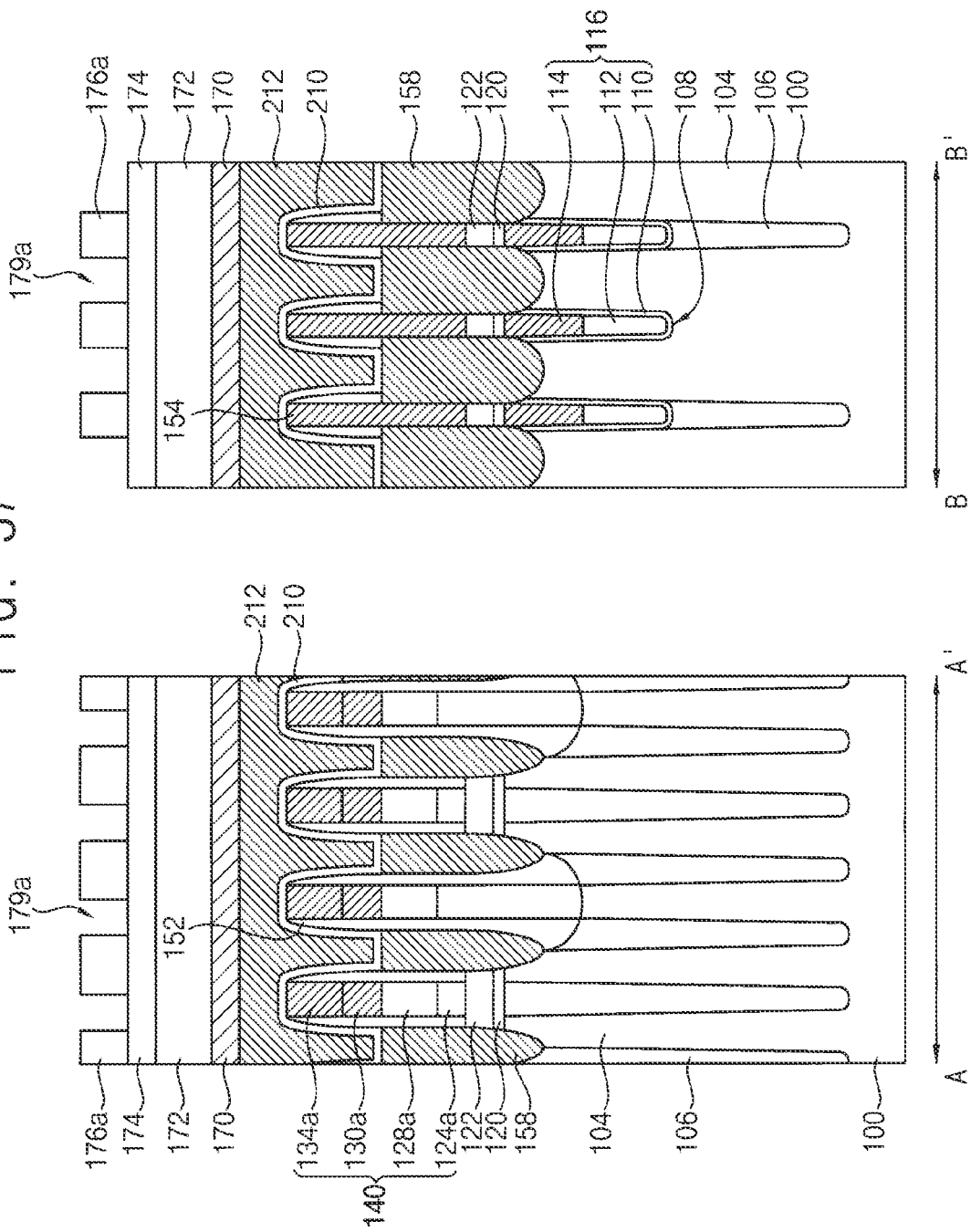
Figure 38:
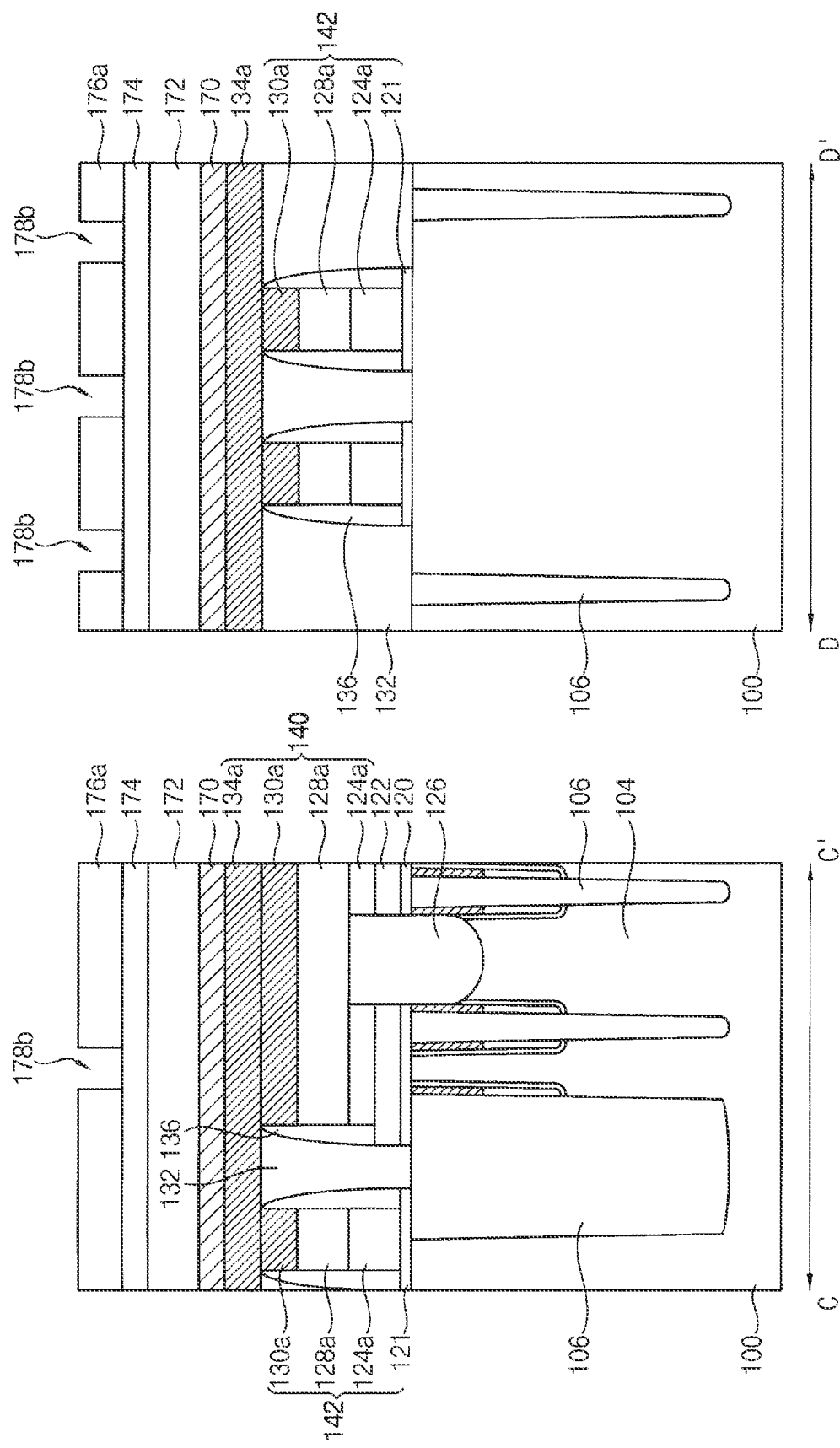

Referring to FIGS. 37 and 38, a third capping insulation layer 170 may be formed on the second metal layer in the cell region I and the second capping layer pattern in the core/peripheral region II. A first layer 172 and a second layer 174 may be sequentially formed on the third capping insulation layer 170.

The third capping insulation layer 170 may include silicon nitride. The first layer 172 may include, e.g., a spin-on-hardmask (SOH). The second layer 174 may include silicon oxynitride.

A first photoresist layer may be coated on the second layer 174. A photo process may be performed on the first photoresist layer to form a first photoresist pattern 176a.

The first photoresist pattern 176a may serve as an etching mask for forming the landing pad patterns in the cell region and the contact plugs in the core/peripheral regions.

The process for forming the first photoresist pattern 176a may be the same as illustrated with reference to FIGS. 18 and 19. That is, the process for forming the first photoresist pattern 176a may include an EUV photo process.

In some example embodiments, the landing pad patterns may be formed by an embossed process, a position of the fourth opening 179a of the first photoresist pattern 176a in the cell region I may be different from that of FIGS. 18 and 19. The first photoresist pattern 176a may cover a portion of the landing pad pattern in the cell region I. Thus, the fourth opening 179a of the first photoresist pattern 176a may expose a portion where the landing pad pattern is not formed. The first photoresist pattern 176a may include a fifth opening 178b exposing a portion of the contact plugs in the core/peripheral regions II.

Figure 39:
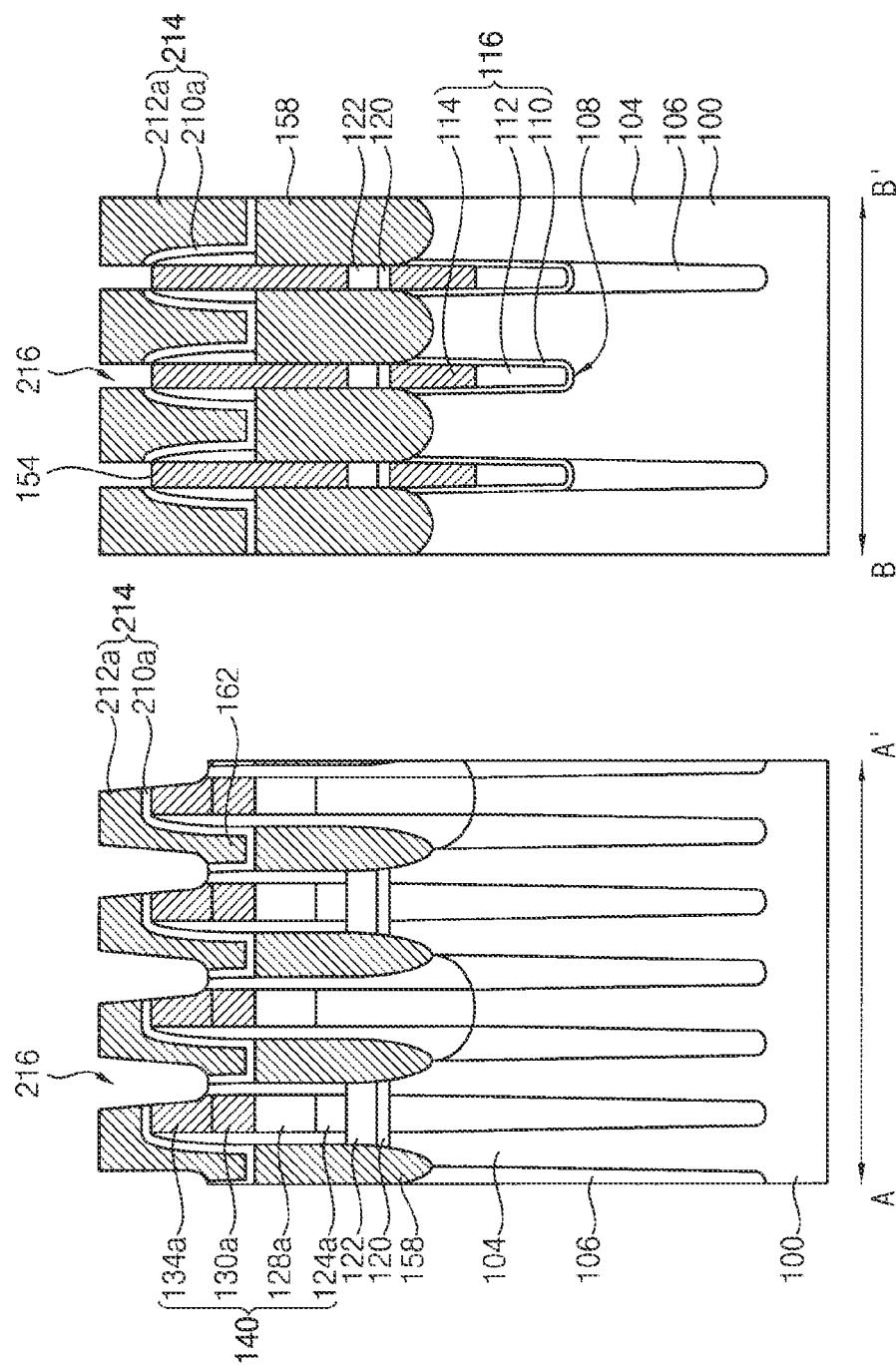
Figure 40:
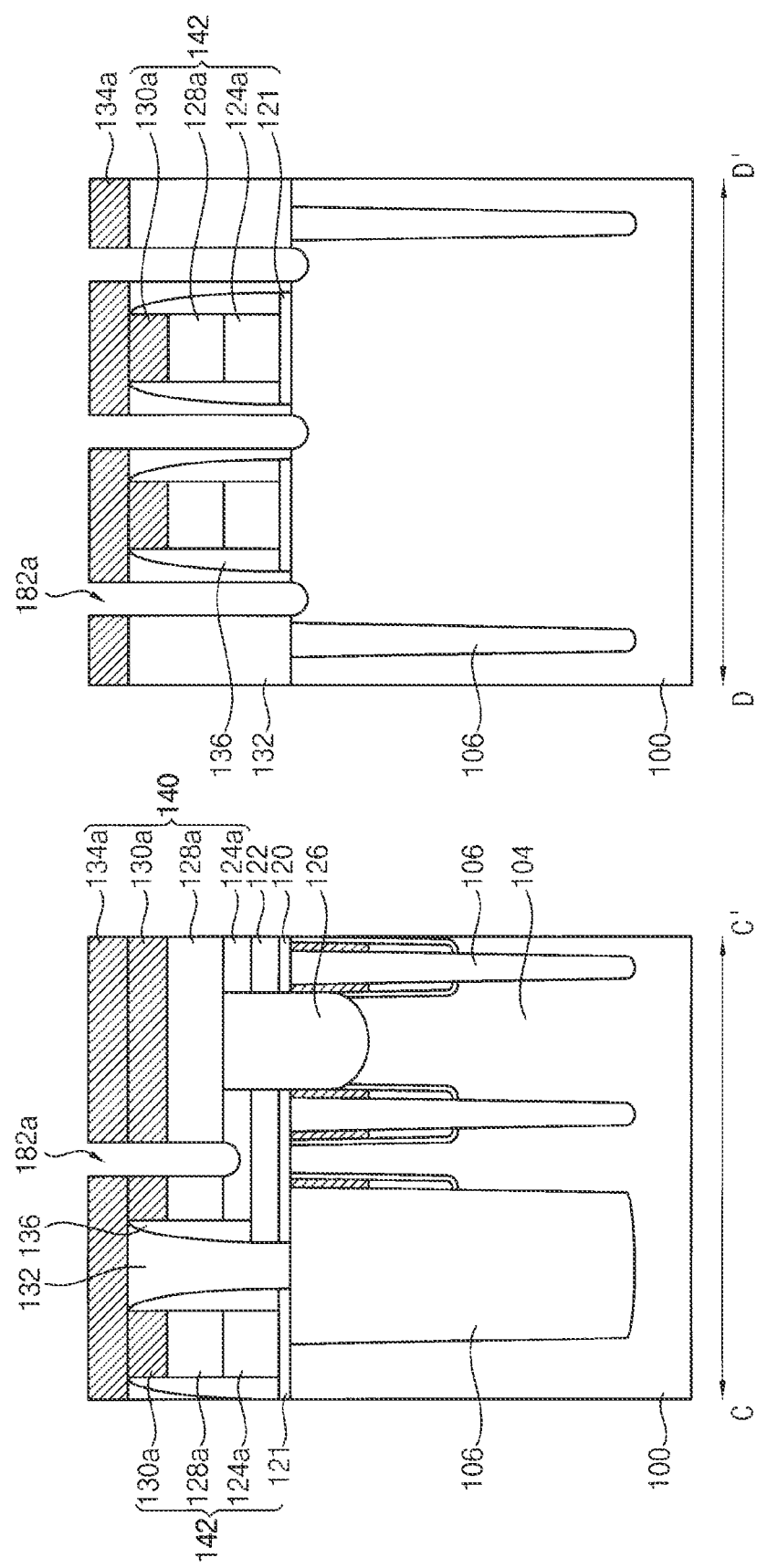

Referring to FIGS. 39 and 40, the second layer 174 and the first layer 172 may be sequentially etched using the first photoresist pattern 176a as an etching mask to form a second pattern and a first pattern.

Thereafter, the second metal layer, the bit line structure, and the insulation pattern in the cell region I may be etched using the first and second patterns as an etching mask to form the landing pad pattern 214. The landing pad pattern 214 may be formed on the lower contact plug. Further, a recessed portion 216 may be formed between the landing pad patterns 214. The landing pad pattern 214 may have a structure including the second barrier pattern 210a and the second metal pattern 212a stacked. The second barrier pattern 210a may be formed on a lower surface of the second metal pattern 212a between the recessed portions.

In addition, the second capping layer pattern and an upper portion of the bit line structure in the core/peripheral regions II may be etched using the first and second patterns as an etching mask to form a seventh preliminary opening. An upper portion of the second capping layer pattern and the lower insulating interlayer 132 in the core/peripheral regions II may be etched to form the seventh preliminary opening.

Thereafter, processes substantially the same or similar to the processes illustrated with reference to FIGS. 22 and 23 may be performed, so that layers under the seventh preliminary opening may be further etched to form a seventh opening 182a. The seventh opening 182a exposing the first conductive pattern 124a of the bit line structure 140 may be formed in the core/peripheral regions II. In addition, the seventh openings 182a exposing the substrate 100 adjacent to sides of the second gate structure 142 may be formed in the core/peripheral regions II.

Figure 41:
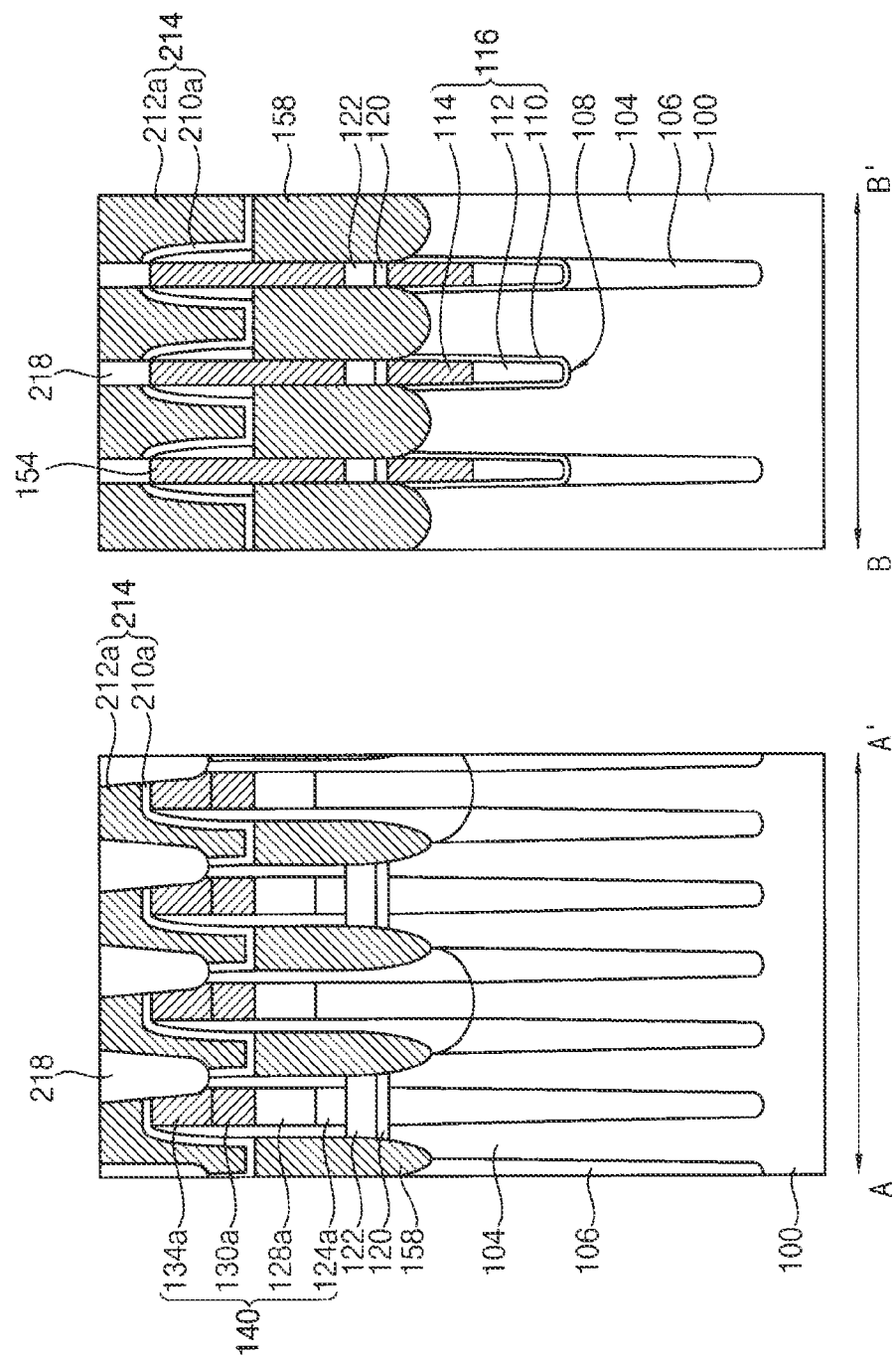

Referring to FIG. 41, an upper insulation pattern 218 may be formed to fill the recessed portion 216 in the cell region.

Thereafter, processes substantially the same or similar to the processes illustrated with reference to FIGS. 24 to 31 and FIGS. 1 and 2 may be performed.

In some example embodiments, the landing pad patterns 214 in the cell region I may be formed by an embossed process, and then the contact plugs and the wiring in the core/peripheral regions II may be formed by a dual damascene process.

Therefore, a third barrier layer and a third metal layer may be formed on the landing pad pattern 214 and the upper insulation pattern 218 in the cell region I by performing the processes illustrated with reference to FIGS. 28 and 29. In the planarization process illustrated with reference to FIGS. 30 and 31, the third barrier layer and the third metal layer in the cell region I may be completely removed. In some example embodiments, the third barrier layer and the third metal layer in the cell region may be further removed.

As described above, the semiconductor device including the landing pad patterns 216 as shown in FIG. 34 may be manufactured.

Figure 42:
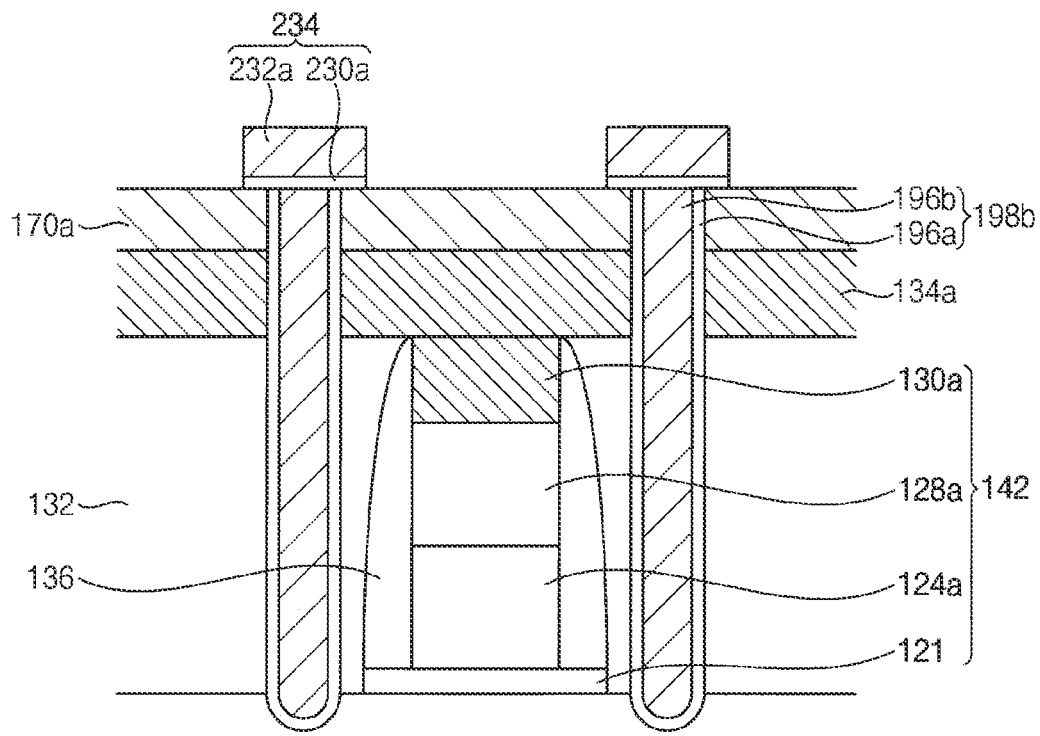
Figure 43:
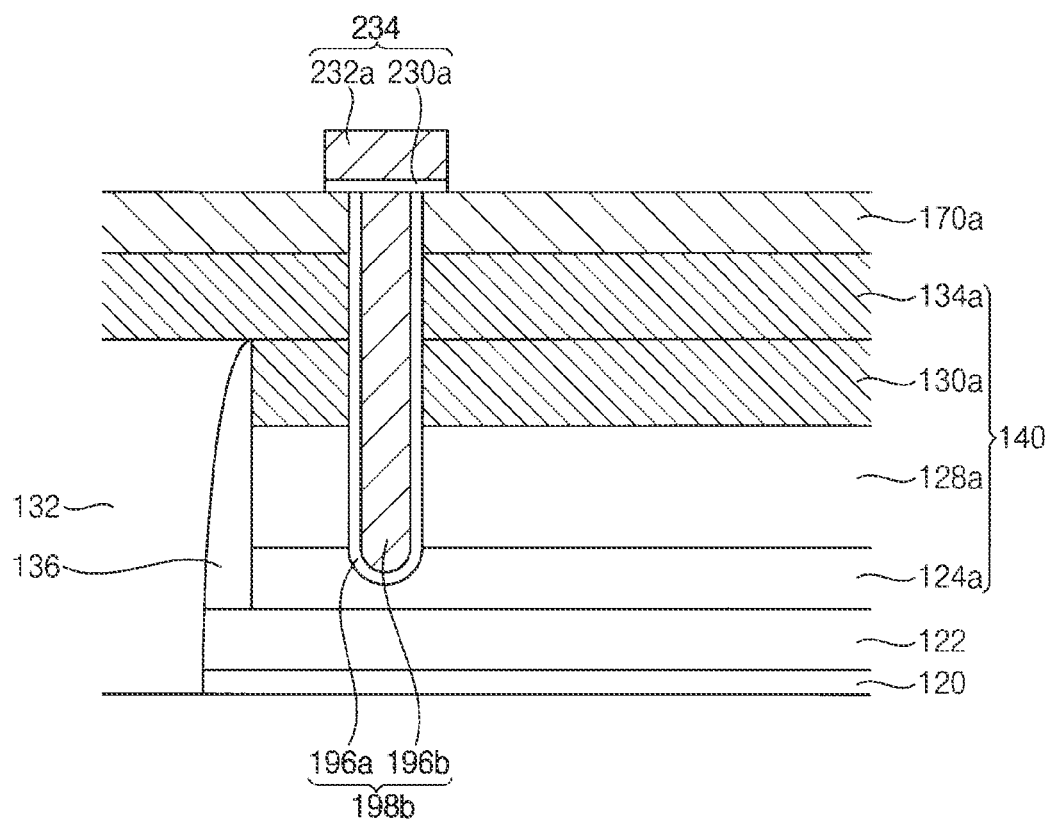

FIGS. 42 and 43 are cross-sectional views illustrating aspects of a semiconductor device in accordance with some example embodiments.

FIG. 42 is an enlarged cross-sectional view of a portion of a transistor in the core/peripheral regions II. FIG. 43 is an enlarged cross-sectional view of a portion of a bit line structure in a cell region I and core/peripheral regions II.

The semiconductor device may be substantially the same as or similar to the semiconductor device illustrated with reference to FIGS. 1 to 5, except for the contact plugs and wiring in the core/peripheral regions II. For example, structures in the cell region I may be substantially the same as or similar to the structures in the cell region I in the semiconductor device illustrated with reference to FIGS. 1 to 5. Thus, the same elements are given the same reference numerals, and repetitive descriptions thereof are omitted.

Referring to FIGS. 42 and 43, the contact plug 198b in the core/peripheral regions II may include a first contact plug (refer to FIG. 42) and a second contact plug (refer to FIG. 43).

The first contact plug may pass through the third capping insulation pattern 170a, the second capping pattern 134a, and the lower insulating interlayer, and the first contact plug may contact a surface of the substrate 100. The second contact plug may contact the first conductive pattern 124a of the bit line structure 140 through the third capping insulation pattern 170a and the upper portion of the bit line structure 140.

An upper surface of the contact plug 198b may be coplanar with an upper surface of the third capping insulation pattern 170a.

The wiring 234 may be formed on the contact plug 198b. An upper surface of the wiring 234 may be higher than the upper surface of the third capping insulation pattern 170a. The wiring 234 may have a structure including a fourth barrier pattern 230a and a fourth metal pattern 232a stacked in a vertical direction.

FIGS. 44 to 47 are cross-sectional views illustrating aspects of a method of manufacturing a semiconductor device in accordance with some example embodiments.

Figure 44:
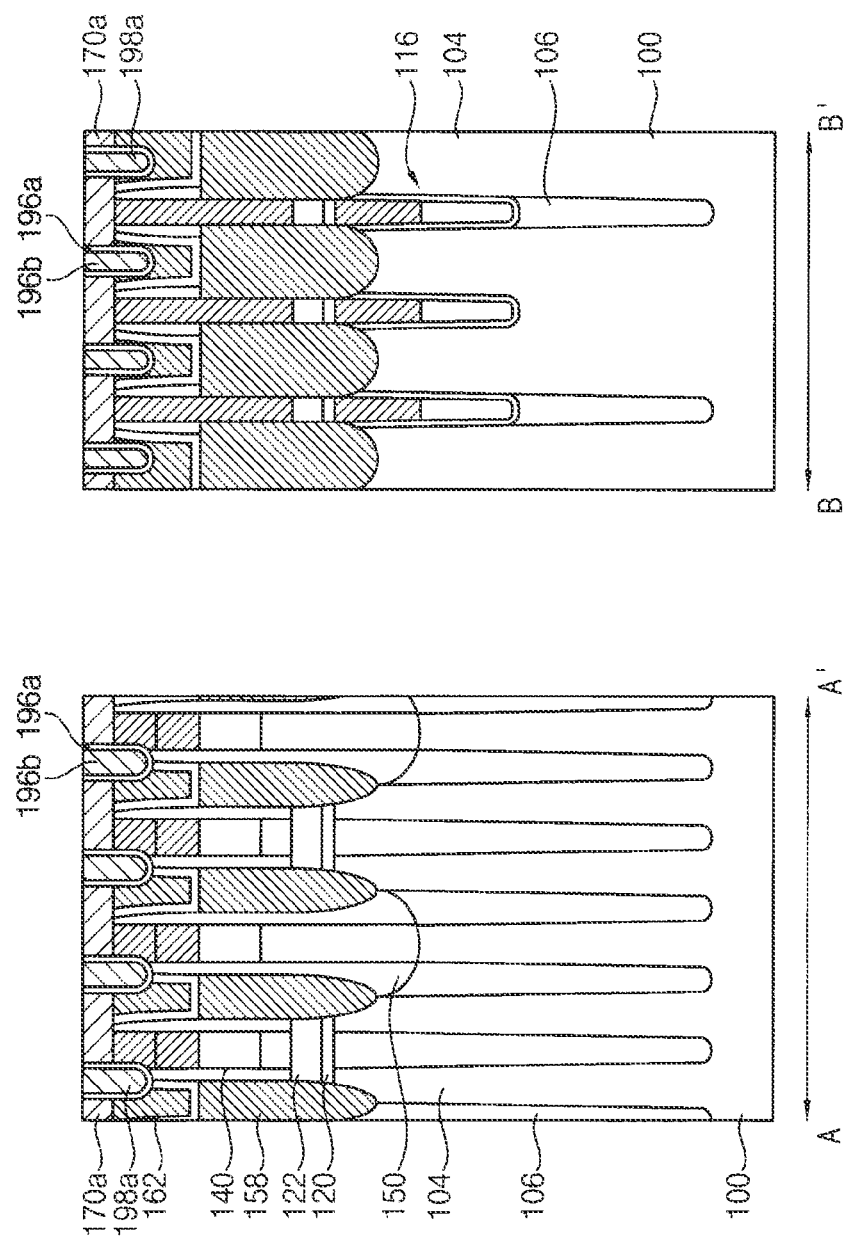
Figure 45:
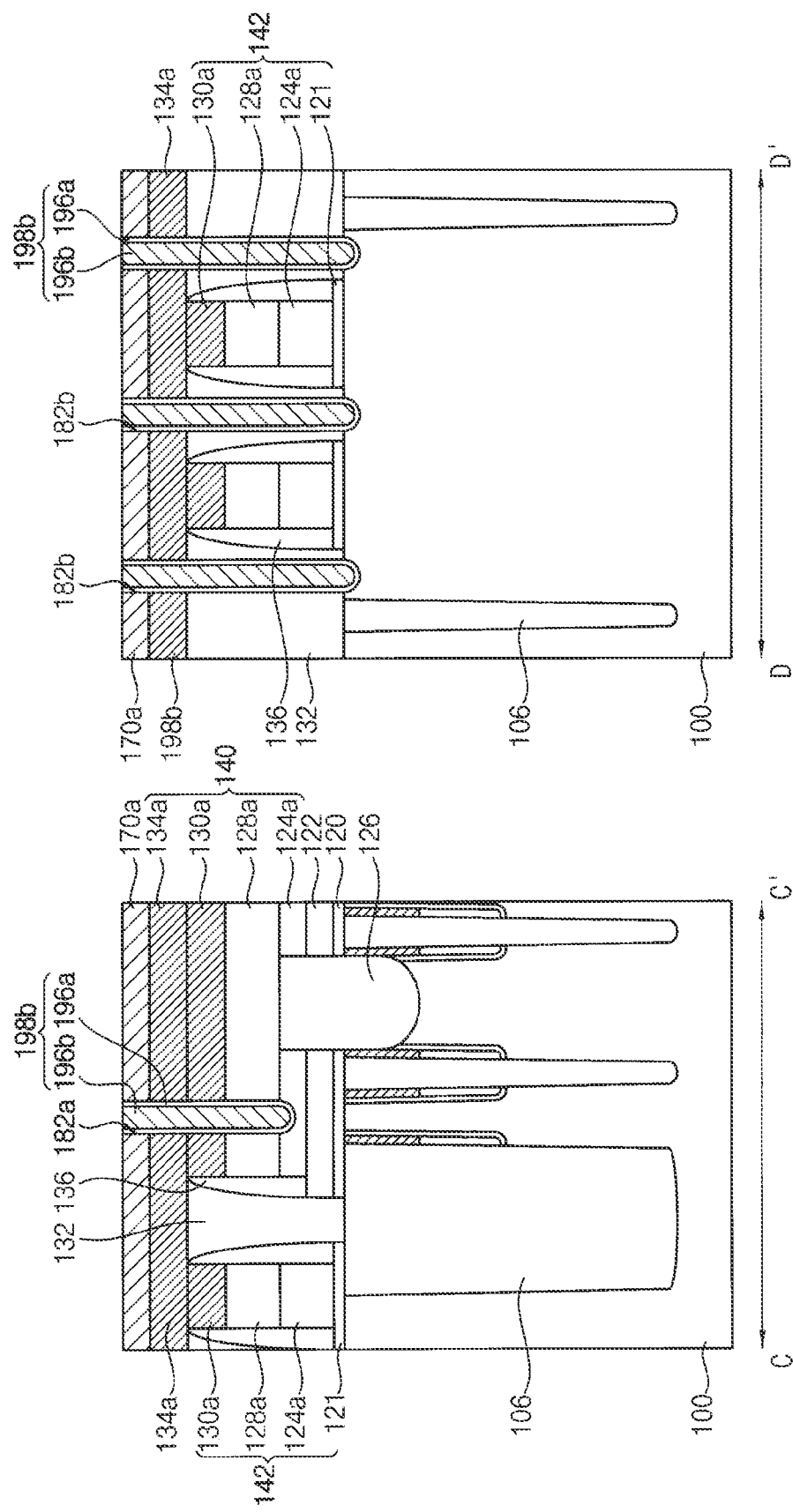
Figure 46:
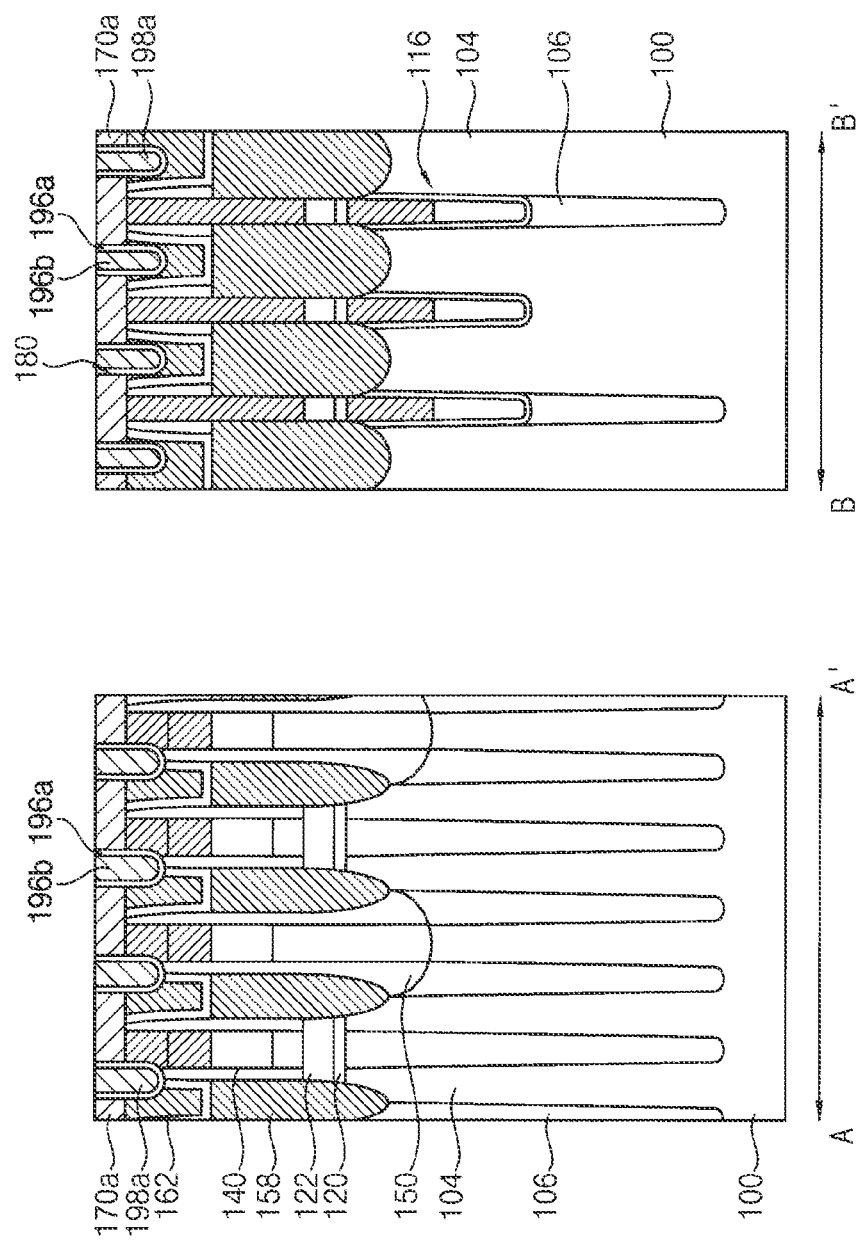
Figure 47:
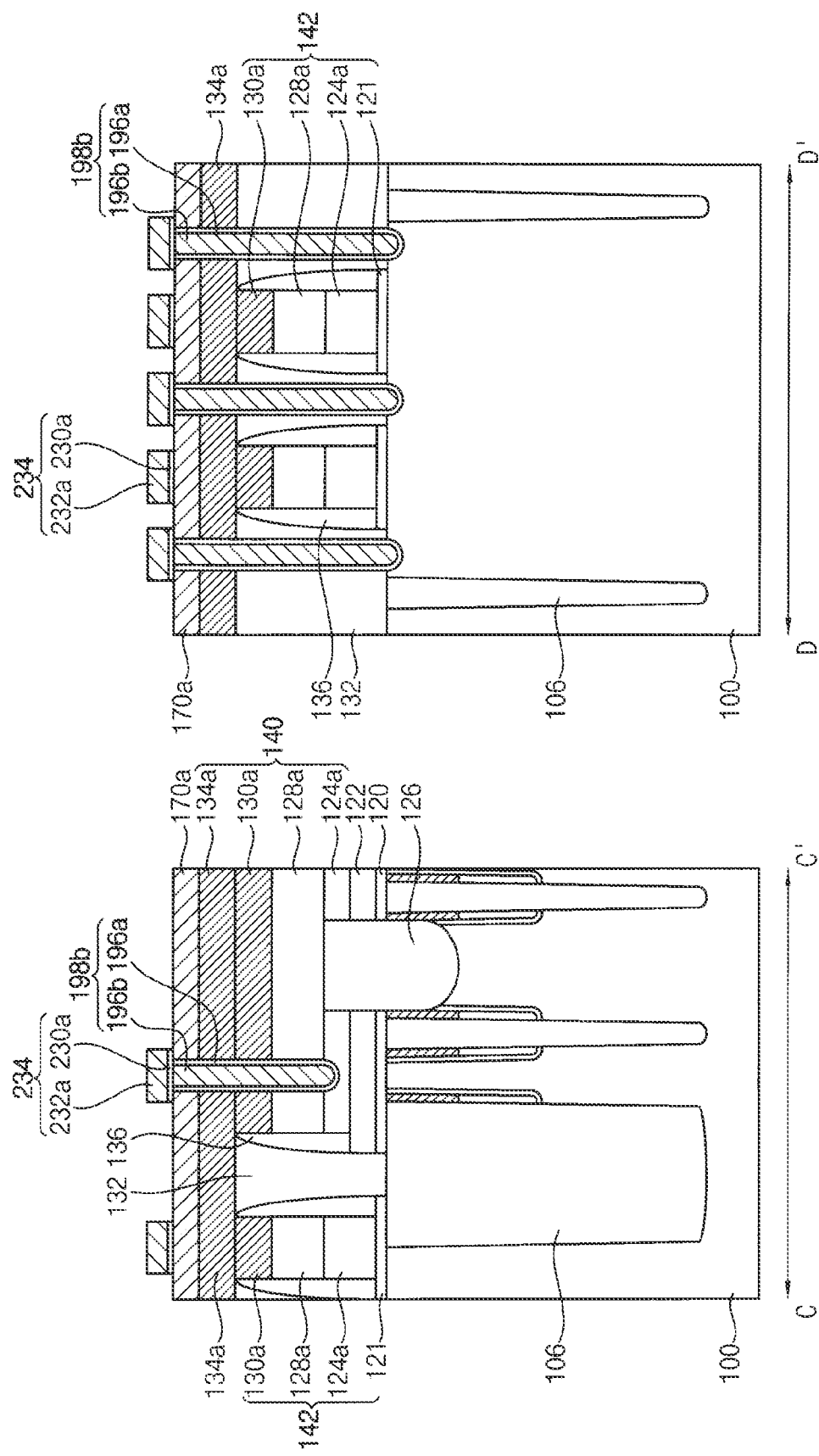

FIGS. 44 and 46 are cross-sectional views taken along lines A-A' and B-B' of FIG. 3, and FIGS. 45 and 47 are cross-sectional views taken along lines C-C' and D-D' of FIG. 3.

Referring to FIGS. 44 and 45, first, processes substantially the same or similar to the processes illustrated with reference to FIGS. 6 to 23 may be performed.

Thereafter, a third barrier layer may be formed on surfaces of the third capping insulation pattern 170a, the sixth opening 180, and the seventh opening 182a, and the third barrier layer may conform to the surfaces on which the third barrier layer is formed. A third metal layer may be formed on the third barrier layer to completely fill the sixth opening 180 and the seventh opening 182a.

The third metal layer and the third barrier layer may be planarized until an upper surface of the third capping insulation pattern 170a may be exposed to form the landing pad patterns and the contact plugs. The planarization process may include a chemical mechanical polishing process.

The landing pad pattern 198a may be formed in the sixth opening 180 in the cell region. The contact plug 198b may be formed in the seventh opening 182a in the core/peripheral regions. Each of the landing pad pattern 198a and the contact plug 198b may include the third barrier pattern 196a and the third metal pattern 196b.

Referring to FIGS. 46 and 47, a fourth barrier layer and a fourth metal layer may be sequentially formed on the third capping insulation pattern 170a, the landing pad pattern, and the contact plug.

A third layer and a fourth layer may be sequentially formed on the fourth metal layer. The third layer may include, e.g., a spin-on-hardmask. The fourth layer may include silicon oxynitride.

A second photoresist layer may be coated on the fourth layer. A photo process may be performed on the second photoresist layer to form a second photoresist pattern. The second photoresist pattern may serve as an etching mask for forming wiring in the core/peripheral regions by an embossed process. Thus, the second photoresist pattern may selectively cover a portion of the wiring. The photo process for forming the second photoresist pattern may include an EUV exposure process.

Thereafter, the fourth metal layer and the fourth barrier layer may be etched using the second photoresist pattern as an etching mask to form the wiring. The wiring 234 may be formed on the third capping insulation pattern 1870a and the contact plug 198b in the core/peripheral regions II. The wiring 234 may include a fourth barrier pattern 230a and a fourth metal pattern 232a. The fourth barrier pattern 230a may be formed on a bottom of the fourth metal pattern 232a.

As described above, in manufacturing the semiconductor device, the landing pad patterns in the cell region I and the contact plugs in the core/peripheral regions II may be formed by a single EUV exposure process. Therefore, the semiconductor device can be manufactured by a process having a reduced number of operations.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims.

What is claimed is:
1. A method of manufacturing a semiconductor device, comprising:
   forming a plurality of bit line structures in a cell region of a substrate;
   forming a gate structure in core/peripheral regions of the substrate;
   forming a lower contact plug and an upper contact plug between the bit line structures, wherein the lower contact plug and the upper contact plug are vertically stacked;
   forming a capping insulation layer on a first bit line structure of the plurality of bit line structures, on the upper contact plug in the cell region, and on the gate structure in the core/peripheral regions;

forming a first photoresist pattern for forming landing pad patterns in the cell region and contact plugs in the core/peripheral regions on the capping insulation layer, wherein the first photoresist pattern is formed by performing a first exposure process;

etching layers using the first photoresist pattern as an etch mask to form first openings in the cell region and second openings in the core/peripheral regions;

forming a second photoresist pattern for forming wirings in the core/peripheral regions on the capping insulation layer, wherein the second photoresist pattern is formed by performing a second exposure process;

etching layers using the second photoresist pattern as an etch mask to form third openings in communication with the second openings in the core/peripheral regions; and filling the first openings, the second openings, and the third openings with a first metal material to form the landing pad patterns in the first openings, the contact plugs in the second openings, and the wirings in the third openings.

2. The method of claim 1, wherein the first exposure process is performed by an EUV exposure process using light having a wavelength of about 13.5 nm.

3. The method of claim 1, wherein the second exposure process is performed by an EUV exposure process using light having a wavelength of about 13.5 nm.

4. The method of claim 1, wherein the etching of the layers using the first photoresist pattern as an etch mask to form the first openings in the cell region and the second openings in the core/peripheral regions comprises:

etching layers in the cell region and the core/peripheral regions exposed by the first photoresist pattern to form the first openings in the cell region and preliminary second openings in the core/peripheral regions; and additionally etching layers under the preliminary second openings in the core/peripheral regions to form the second openings in the core/peripheral regions, wherein a lower surface of each of the second openings is lower than a lower surface of each of the first openings.

5. The method of claim 4, wherein the additionally etching layers under the preliminary second openings in the core/peripheral regions comprises:

forming an additional photoresist pattern exposing only the preliminary second openings in the core/peripheral regions, and etching the layers using the additional photoresist pattern as an etching mask.

6. The method of claim 5, wherein the additional photoresist pattern is formed by performing an exposure process having a lower resolution than an EUV exposure process.

7. The method of claim 1, wherein each of the landing pad pattern and the wirings has a dimension less than 20 nanometers (nm) and a pitch less than 40 nm, and wherein an arrangement density of the contact plugs is lower than an arrangement density of the landing pad patterns and an arrangement density of the wirings.

8. The method of claim 1, wherein one of the first openings is formed by etching portions of the capping insulation layer, the upper contact plug, and one of the bit line structures, and wherein an upper sidewall of the upper contact plug is exposed by the one of the first openings.

9. The method of claim 1, wherein one of the bit line structures includes a conductive pattern, a metal pattern, and a capping pattern that are sequentially stacked, and wherein an upper portion of the capping pattern is exposed by one of the first openings.

10. The method of claim 1, wherein filling the first openings, the second openings, and the third openings with the first metal material to form the landing pad patterns in the first openings, the contact plugs in the second openings, and the wirings in the third openings comprises:

forming a barrier layer and a metal layer on the capping insulation layer to fill the first openings, the second openings, and the third openings; and planarizing the metal layer and the barrier layer until the capping insulation layer is exposed.

11. The method of claim 10, wherein a planarization process for planarizing the metal layer includes a chemical mechanical polishing process.

12. The method of claim 1, wherein the lower contact plug includes polysilicon doped with impurities, and wherein the upper contact plug includes a second metal material.

13. The method of claim 1, wherein an uppermost surface of the upper contact plug is coplanar with an uppermost surface of one of the bit line structures.

14. The method of claim 1, wherein the contact plugs include a first contact plug and a second contact plug, and wherein the first contact plug contacts the substrate, and wherein the second contact plug is electrically connected to an end portion of one of the bit line structures.

15. A method of manufacturing a semiconductor device, comprising:

forming a first gate structure in a first recess in a cell region of a substrate;

forming a plurality of bit line structures in the cell region of the substrate;

forming a second gate structure in core/peripheral regions of the substrate;

forming a contact plug structure between two of the plurality of bit line structures;

forming a capping insulation layer on a first bit line structure of the plurality of bit line structures, on the contact plug structure in the cell region, and on the second gate structure in the core/peripheral regions;

forming a first photoresist pattern including first openings in the cell region and second openings in the core/peripheral regions on the capping insulation layer, wherein the first photoresist pattern is formed by performing an EUV exposure process using light having a wavelength of about 13.5 nanometers (nm);

etching layers using the first photoresist pattern as an etch mask to form third openings exposing at least a portion of the contact plug structure in the cell region and fourth openings in the core/peripheral regions; and forming a second photoresist pattern including fifth openings extending in a direction in the core/peripheral regions on the capping insulation layer, wherein the second photoresist pattern is formed by performing an EUV exposure process using light having a wavelength of about 13.5 nm;

etching layers using the second photoresist pattern as an etch mask to form sixth openings in communication with the fourth openings in the core/peripheral regions; and filling the third openings, the fourth openings, and the sixth openings with a metal material to form landing pad patterns in the third openings, contact plugs in the fourth openings, and wirings in the sixth openings.

16. The method of claim 15, wherein etching the layers using the first photoresist pattern as an etch mask to form the third openings in the cell region and the fourth openings in the core/peripheral regions comprises:
  etching layers in the cell region and the core/peripheral regions exposed by the first photoresist pattern to form the third openings in the cell region and preliminary fourth openings in the core/peripheral regions; and
  additionally etching layers under the preliminary fourth openings in the core/peripheral regions to form the fourth openings in the core/peripheral regions,
  wherein a lower surface of each of the fourth openings is lower than a lower surface of each of the third openings.

17. The method of claim 15, wherein filling the third openings, the fourth openings, and the sixth openings with the metal material to form the landing pad patterns in the third openings, the contact plugs in the fourth openings, and the wirings in the sixth openings comprises:
  forming a barrier layer and a metal layer on the capping insulation layer to fill the third openings, the fourth openings, and the sixth openings; and
  planarizing the metal layer and the barrier layer until the capping insulation layer is exposed.

18. The method of claim 17, further comprising:
  after planarizing the metal layer and the barrier layer, partially etching the metal layer and the barrier layer in one of the third openings such that an upper surface of each of the contact plugs is lower than an upper entrance portion of the one of the third openings.

19. A method of manufacturing a semiconductor device, comprising:
  forming a first gate structure in a first recess in a cell region of a substrate;
  forming a plurality of bit line structures in the cell region of the substrate;
  forming a second gate structure in core/peripheral regions of the substrate;
  forming a contact plug structure between the bit line structures;
  forming a capping insulation layer on a first bit line structure of the plurality of bit line structures, on the contact plug structure in the cell region, and on the second gate structure in the core/peripheral regions;
  forming a first photoresist pattern including first openings in the cell region and second openings in the core/peripheral regions on the capping insulation layer, wherein the first photoresist pattern is formed by performing an EUV exposure process using light having a wavelength of about 13.5 nm;
  etching layers using the first photoresist pattern as an etch mask to form third openings exposing at least a portion of the contact plug structure in the cell region and fourth openings in the core/peripheral regions; and
  filling the third openings and the fourth openings with a metal material to form landing pad patterns in the third openings and contact plugs in the fourth openings.

20. The method of claim 19, further comprising:
  forming a wiring on the contact plugs in the core/peripheral regions of the substrate, wherein the wiring is electrically connected to the contact plugs.

* * * * *